United States Patent
Kang et al.

(10) Patent No.: US 11,869,974 B2
(45) Date of Patent: Jan. 9, 2024

(54) ELECTRONIC DEVICE INCLUDING LIGHT DETECTION DEVICE AND OPERATION METHOD THEREOF

(71) Applicant: Samsung Electronics Co., Ltd., Gyeonggi-do (KR)

(72) Inventors: Seunggoo Kang, Gyeonggi-do (KR); Jung-Hoon Park, Incheon (KR); Bokyung Sim, Gyeonggi-do (KR); Jeong Gyu Jo, Gyeonggi-do (KR); Dong-Il Son, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/859,190

(22) Filed: Jul. 7, 2022

(65) Prior Publication Data

US 2022/0344515 A1    Oct. 27, 2022

Related U.S. Application Data

(63) Continuation of application No. 16/876,486, filed on May 18, 2020, now Pat. No. 11,411,115, which is a
(Continued)

(30) Foreign Application Priority Data

Jan. 26, 2017    (KR) .................. 10-2017-0012739

(51) Int. Cl.
*H01L 29/786* (2006.01)
*H01L 27/12* (2006.01)
(Continued)

(52) U.S. Cl.
CPC ...... *H01L 29/78603* (2013.01); *G01J 1/4204* (2013.01); *G02F 1/13318* (2013.01);
(Continued)

(58) Field of Classification Search
CPC ........... H01L 29/78603; H01L 27/1248; H01L 27/3227; H01L 31/02164; H01L 31/101;
(Continued)

(56) References Cited

U.S. PATENT DOCUMENTS 8,026,520 B2    9/2011    Lee et al.
8,179,483 B2    5/2012    Katoh
(Continued)

FOREIGN PATENT DOCUMENTS

CN    105224138    1/2016
EP    2 369 404    9/2011
(Continued)

OTHER PUBLICATIONS

European Search Report dated May 25, 2018 issued in counterpart application No. 18151935.6-1210, 16 pages.
(Continued)

*Primary Examiner* — Karen Kusumakar
*Assistant Examiner* — Adam S Bowen
(74) *Attorney, Agent, or Firm* — The Farrell Law Firm, P.C.

(57) ABSTRACT

An operation method and an electronic device are provided. A phone call is established while a display of the electronic device is activated. A proximity sensor of the electronic device is turned on. A supply of power to the proximity sensor is controlled to emit light through a plurality of pixels in a portion of the display corresponding to a position of the proximity sensor and the light emitted by the proximity sensor and reflected by an object is received to identify a distance between the electronic device and the object, if the plurality of the pixels in the position corresponding to the proximity sensor are deactivated during the phone call. The supply of power to the proximity sensor is blocked if the
(Continued)

plurality of pixels in the portion of the display corresponding to the proximity sensor are activated during the phone call.

19 Claims, 40 Drawing Sheets

Related U.S. Application Data continuation of application No. 16/456,758, filed on Jun. 28, 2019, now Pat. No. 10,707,351, which is a continuation of application No. 15/870,423, filed on Jan. 12, 2018, now Pat. No. 10,381,485.

(51) Int. Cl.
| | | |
|---|---|---|
| *G02F 1/133* | (2006.01) | |
| *H01L 31/0216* | (2014.01) | |
| *G02F 1/1335* | (2006.01) | |
| *G01J 1/42* | (2006.01) | |
| *H01L 31/101* | (2006.01) | |
| *G09G 3/3208* | (2016.01) | |
| *H10K 50/828* | (2023.01) | |
| *H10K 50/844* | (2023.01) | |
| *H10K 59/60* | (2023.01) | |
| *H10K 59/12* | (2023.01) | |
| *H10K 59/40* | (2023.01) | |
| *H10K 59/126* | (2023.01) | |

(52) U.S. Cl.
CPC ..... *G02F 1/133555* (2013.01); *G09G 3/3208* (2013.01); *H01L 27/1248* (2013.01); *H01L 31/02164* (2013.01); *H01L 31/101* (2013.01); *H10K 50/828* (2023.02); *H10K 50/844* (2023.02); *H10K 59/60* (2023.02); *G09G 2360/145* (2013.01); *H10K 59/12* (2023.02); *H10K 59/126* (2023.02); *H10K 59/40* (2023.02)

(58) Field of Classification Search
CPC ............. H01L 51/5234; H01L 51/5253; H01L 27/323; H01L 27/3244; H01L 27/3272; G01J 1/4204; G01J 1/18; G01J 1/1626; G02F 1/13318; G02F 1/133555; G09G 3/3208; G09G 2360/145; G09G 2354/00; G06F 3/0421; G06F 3/042
See application file for complete search history.

(56) References Cited

U.S. PATENT DOCUMENTS

| | | | |
|---|---|---|---|
| 8,324,578 B2 | 12/2012 | Dinh et al. | |
| 9,141,233 B2 | 9/2015 | Chung et al. | |
| 9,310,843 B2 | 4/2016 | Shedletsky et al. | |
| 2008/0006762 A1* | 1/2008 | Fadell | G06F 3/0383 250/201.1 |
| 2011/0180686 A1* | 7/2011 | Iwai | G01S 17/04 250/205 |
| 2011/0227873 A1* | 9/2011 | Chung | G06F 3/0425 345/175 |
| 2012/0069042 A1* | 3/2012 | Ogita | H04M 1/0266 345/589 |
| 2012/0120007 A1 | 5/2012 | Choi | |
| 2012/0313912 A1 | 12/2012 | Kanbayashi et al. | |
| 2014/0077094 A1 | 3/2014 | Dinh | |
| 2014/0232540 A1* | 8/2014 | S | H04W 52/0251 340/539.11 |
| 2014/0252209 A1* | 9/2014 | Land | G01V 8/20 250/208.2 |
| 2014/0267202 A1* | 9/2014 | Zheng | G09G 5/10 345/207 |
| 2016/0054175 A1* | 2/2016 | Jia | G01J 1/0233 250/216 |
| 2016/0061588 A1* | 3/2016 | Cho | G06F 3/00 356/614 |
| 2017/0094048 A1* | 3/2017 | Kim | H04M 1/22 |
| 2017/0115823 A1 | 4/2017 | Huang et al. | |

FOREIGN PATENT DOCUMENTS

| | | |
|---|---|---|
| JP | 2011179997 | 9/2011 |
| KR | 1020050052098 | 6/2005 |
| KR | 1020060010551 | 2/2006 |

OTHER PUBLICATIONS

European Search Report dated Sep. 6, 2018 issued In counterpart application No. 18151935.6-1210, 18 pages.
European Search Report dated Jun. 21, 2019 issued in counterpart application No. 18151935.6-1210, 14 pages.
European Search Report dated Apr. 22, 2020 issued in counterpart application No. 19220177.0-1210, 14 pages.
European Search Report dated Sep. 7, 2021 issued in counterpart application No. 19220177.0-1210, 15 pages.
Chinese Office Action dated Mar. 24, 2023 issued in counterpart application No. 201810074416.6, 32 pages.
EP Summons to Attend Oral Proceedings dated Jan. 13, 2023 issued in counterpart application No. 19220177.0-1210, 21 pages.
Chinese Office Action dated Oct. 12, 2023 issued in counterpart application No. 201810074416.6, 25 pages.
EP Minutes dated Nov. 6, 2023 issued in counterpart application No. 19220177.0-1210, 7 pages.
EP Decision to Refuse dated Nov. 7, 2023 issued in counterpart application No. 1920177.0-1210, 27 pages.

\* cited by examiner

| Proximity recognition distance [mm] \ Light output power value [mA] | 200 | 100 | 50 |
|---|---|---|---|
| 80 | 2364 | 1694 | 1237 |
| 70 | 3176 | 2317 | 1691 |
| 60 | 4304 | 3200 | 2336 |
| 50 | 6174 | 4723 | 3448 |
| 40 | 9530 | 6900 | 5037 |
| 30 | 16368 | 11724 | 8559 |
| ... | ... | ... | ... |

FIG.22

ELECTRONIC DEVICE INCLUDING LIGHT DETECTION DEVICE AND OPERATION METHOD THEREOF

PRIORITY

This application is a Continuation Application of U.S. patent application Ser. No. 16/876,486, filed in the U.S. Patent and Trademark Office (USPTO) on May 18, 2020, which is a Continuation Application of U.S. patent application Ser. No. 16/456,758, filed in the USPTO on Jun. 28, 2019, now U.S. Pat. No. 10,707,351, issued on Jul. 7, 2020, which is a Continuation Application of U.S. application Ser. No. 15/870,423, filed in the USPTO on Jan. 12, 2018, now U.S. Pat. No. 10,381,485, issued on Aug. 13, 2019, which claims priority under 35 U.S.C. § 119(a) to a Korean Patent Application filed in the Korean Intellectual Property Office on Jan. 26, 2017, and assigned Serial No. 10-2017-0012739, the entire content of each of which is incorporated herein by reference.

BACKGROUND

1. Field of the Disclosure

The present disclosure relates generally to an electronic device and an operation method thereof.

2. Description of Related Art

Electronic devices, such as a smartphone, a tablet personal computer (PC), a personal digital assistant (PDA), along with the development of digital technologies, have also been developed in a form that can be worn by a user to improve portability and user accessibility.

An electronic device may include a display to display an image. The display may be a touch-sensitive display, and the electronic device may sense a user input through the display. The electronic device may include sensors for detecting physical quantities and environmental changes. For example, the sensor may be a light sensor, such as a proximity sensor. The electronic device may perform functions on the basis of a signal output from a sensor.

A light sensor may include a light emitting unit for outputting light, and a light receiving unit for receiving light scattered or reflected from an object. The light sensor may be installed in the periphery of the display. However, since users may prefer a large screen, a space other than the space of the display may be reduced when designing to expand the display while maintaining the size of the electronic device, and this may cause difficulty in installing the light sensor.

SUMMARY

The present disclosure has been made to address at least the above mentioned problems and/or disadvantages and to provide at least the advantages described below.

Accordingly, an aspect of the present disclosure is to provide an electronic device including a light detection device, in which a display may be expanded and a light sensor may be installed while maintaining the size of the electronic device, and an operation method thereof.

Accordingly, another aspect of the present disclosure is to provide the electronic device including a light detection device, for reducing the electrical influence of light (or light energy) output from a light emitting unit of the light sensor on the display, when the light sensor is installed below a layer of the display, and an operation method thereof.

Another aspect of the present disclosure is to provide the electronic device including a light detection device, for lowering the visibility of a spot generated on the display by the light output from the light emitting unit of the light sensor, and an operation method thereof.

In accordance with an aspect of the present disclosure, an electronic device is provided that includes a display and a proximity sensor disposed behind the display. The proximity sensor is configured to emit and receive a light of a specific wavelength band. The electronic device also includes a memory storing instructions and a processor configured to execute the instructions. A phone call is established while the display is activated. The proximity sensor is turned on. A supply of power to the proximity sensor is controlled to emit light through a plurality of pixels in a portion of the display corresponding to a position of the proximity sensor and the light emitted by the proximity sensor and reflected by an object is received to identify a distance between the electronic device and the object, if the plurality of the pixels in the position corresponding to the proximity sensor are deactivated during the phone call. The supply of power to the proximity sensor is blocked if the plurality of pixels in the portion of the display corresponding to the proximity sensor are activated during the phone call.

In accordance with another aspect of the present disclosure, an operation method of an electronic device is provided. A phone call is established while a display of the electronic device is activated. A proximity sensor of the electronic device is turned on. A supply of power to the proximity sensor is controlled to emit light through a plurality of pixels in a portion of the display corresponding to a position of the proximity sensor and the light emitted by the proximity sensor and reflected by an object is received to identify a distance between the electronic device and the object, if the plurality of the pixels in the position corresponding to the proximity sensor are deactivated during the phone call. The supply of power to the proximity sensor is blocked if the plurality of pixels in the portion of the display corresponding to the proximity sensor are activated during the phone call.

BRIEF DESCRIPTION OF THE DRAWINGS

The above and other aspects, features, and advantages of the present disclosure will be more apparent from the following description taken in conjunction with the accompanying drawings, in which:

FIG. 22 is a table including proximity recognition distance information, light output power value information, and proximity recognition threshold value information, according to an embodiment of the present disclosure.

DETAILED DESCRIPTION

Figure 1:
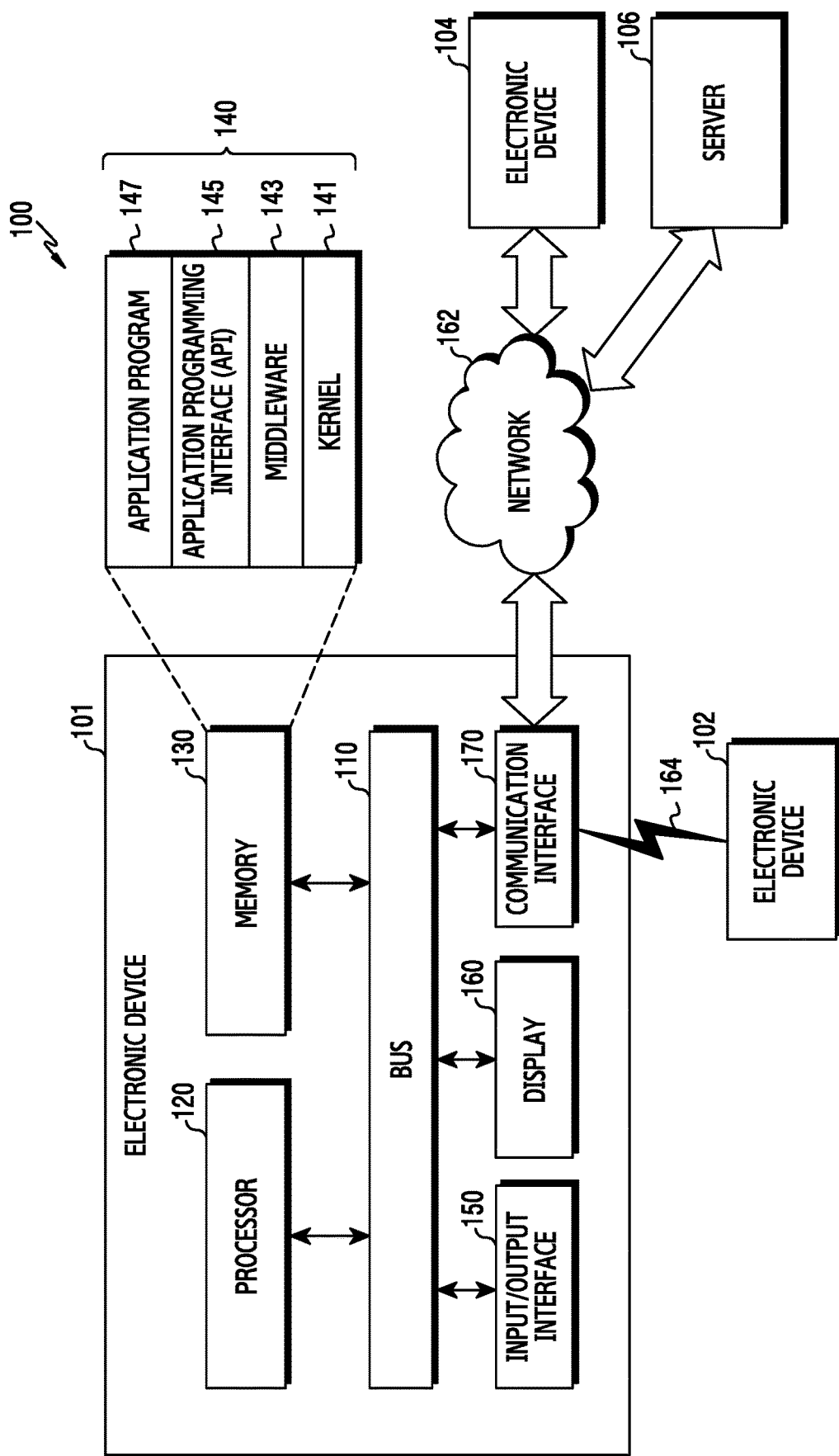
FIG. 1 is a block diagram of a network environment system, according to an embodiment of the present disclosure.

Embodiments of the present disclosure are described in detail with reference to the accompanying drawings, in which similar reference numerals may be used to refer to similar elements. It should be understood that there is no intent to limit the present disclosure to the particular forms disclosed herein; rather the present disclosure should be construed to include various modifications, equivalents, and/or alternatives to corresponding embodiments of the present disclosure. In describing the drawings, similar reference numerals may be used to designate similar constituent elements. A singular expression may include a plural expression unless they are definitely different in a context.

In the present disclosure, the expressions "A or B" and "A and/or B", may include all possible combinations of items listed together. The expressions "a first", "a second", "the first", or "the second", may modify corresponding elements regardless of order or importance, and are used only to distinguish one element from another element, but do not limit the corresponding elements. When an element (e.g., first element) is referred to as being "(functionally or communicatively) connected," or "directly coupled" to another element (e.g., second element), the element may be connected directly to the another element or connected to the another element through yet another element (e.g., third element). When an element (e.g., first element) is referred to as being "directly coupled" or "directly connected" to another element (e.g., second element), it should be understood that there is no intervening element (e.g., third element).

The expression "configured to" may be interchangeably used with, for example, the expressions "suitable for", "having the capacity to", "designed to", "adapted to", "made to", or "capable of", in terms of hardware or software, according to circumstances. Alternatively, in some situations, the expression "device configured to" may indicate that the device, together with other devices or components, "is able to" or "capable of". For example, the phrase "processor adapted (or configured) to perform A, B, and C" may refer to a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

An electronic device according to embodiments of the present disclosure, may include at least one of, for example, a smartphone, a tablet PC, a mobile phone, a video phone, an electronic book reader, a desktop PC, a laptop PC, a netbook computer, a workstation, a server, a PDA, a portable multimedia player (PMP), an MP3 player, a medical device, a camera, and a wearable device. The wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and an implantable circuit.

An electronic device may include at least one of, for example, a television, a digital video disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

An electronic device may include at least one of a medical device (e.g., a portable medical measuring device (e.g., a blood glucose monitoring device, a heart rate monitoring device, a blood pressure measuring device, or a body temperature measuring device), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic device for a ship (e.g., a navigation device for a ship and a gyro-compass), avionics, security devices, an automotive head unit, a robot for home or industry, an automatic teller machine (ATM), point of sales (POS) device, or an internet of things device (e.g., a light bulb, a sensor, a sprinkler device, a fire alarm, a thermostat, a streetlamp, a toaster, a sporting goods, a hot water tank, a heater, or a boiler).

An electronic device may include at least one of a part of furniture, a building/structure, a vehicle, an electronic board, an electronic signature receiving device, a projector, and a measuring instrument (e.g., a water meter, an electric meter, a gas meter, and a radio wave meter).

An electronic device may be flexible, or may be a combination of two or more of the aforementioned devices.

An electronic device of the present disclosure is not limited to the above described devices.

The term "user" may indicate a person using an electronic device or a device (e.g., an artificial intelligence electronic device) using an electronic device.

FIG. 1 is a block diagram of a network environment system, according to an embodiment of the present disclosure.

Referring to FIG. 1, the electronic device 101 within a network environment 100 includes a bus 110, a processor 120, a memory 130, an input/output interface 150, a display 160, and communication interface 170. The electronic device 101 may omit at least one of the above elements or additionally include other elements.

The bus 110 includes a circuit that connects elements 110 to 170 and enables communication (e.g., transferring a control message or data) between the elements.

The processor 120 includes one or more of a CPU, an AP, and a communication processor (CP). The processor 120 may perform operations or data processing relating to control of and/or communication with the other elements of the electronic device 101.

The memory 130 may include a volatile and/or non-volatile memory. The memory 130 may store instructions or data relevant to the other elements of the electronic device 101. The memory 130 may store software and/or a program 140. The program 140 includes a kernel 141, middleware 143, an application programming interface (API) 145, and/or application programs 147. At least some of the kernel 141, the middleware 143, and the API 145 may be referred to as an operating system. The kernel 141 may control or manage system resources (e.g., the bus 110, the processor 120, or the memory 130) used for executing an operation or function implemented by other programs (e.g., the middleware 143, the API 145, or the application 147). Furthermore, the kernel 141 may provide an interface allowing the middleware 143, the API 145, or the application programs 147 to access the individual elements of the electronic device 101 to control or manage system resources.

The application programs 147 may include an object analysis application for analyzing objects using a light detection device (or a light sensor). The object analysis application may acquire information relating to skin moisture, skin melanin, or skin erythema related to the user's skin by using a spectroscopic detection device.

The application programs 147 may detect a proximity distance to an object by using a color detection device (or a color sensor) and a proximity detection device (or a proximity sensor).

The middleware 143 may function as an intermediary for communicating with and exchanging data between the API 145 or the application programs 147 and the kernel 141. In addition, the middleware 143 may process one or more task requests received from the application programs 147 according to their priorities. For example, the middleware 143 may assign priorities for using the system resources (e.g., the bus 110, the processor 120, or the memory 130) of the electronic device 101 to one or more of the application program 147, and may process the one or more task requests.

The API 145 is an interface used by the application programs 147 to control a function provided from the kernel 141 or the middleware 143, and may include at least one interface or function (e.g., an instruction) for file control, window control, image processing, or character control. The input/output interface 150 may forward instructions or data, input from a user or an external device, to the other elements of the electronic device 101, or may output instructions or data, received from the other elements of the electronic device 101, to the user or the external device.

The display 160 may include a liquid crystal display (LCD), a light emitting diode (LED) display, an organic light emitting diode (OLED) display, a micro electro mechanical system (MEMS) display, or an electronic paper display. The display 160 may display various types of content (e.g., text, images, videos, icons, and/or symbols) for a user. The display 160 may include a touch screen and receive a touch, gesture, proximity, or hovering input using an electronic pen or a user's body part.

The communication interface 170 may configure communication between the electronic device 101 and an external device (e.g., a first external electronic device 102, a second external electronic device 104, or a server 106). For example, the communication interface 170 may be connected to a network 162 through wireless or wired communication to communicate with the second external electronic device 104 or the server 106.

The wireless communication may include a cellular communication that uses at least one of long term evolution (LTE), LTE-advance (LTE-A), code division multiple access (CDMA), wideband CDMA (WCDMA), universal mobile telecommunications system (UMTS), wireless broadband (WiBro), or global system for mobile communications (GSM). The wireless communication may include short-range wireless communication, such as wireless fidelity (Wi-Fi), light fidelity (Li-Fi), bluetooth, bluetooth low energy (BLE), zigbee, near field communication (NFC), magnetic secure transmission, radio frequency (RF), or a body area network (BAN). According to an embodiment, the wireless communication may include a global navigation satellite system (GNSS) (i.e., a global positioning system (GPS), a GLONASS, a Beidou navigation satellite system (Beidou), or Galileo (the European global satellite-based navigation system)). Hereinafter, the term "GPS" may be interchangeable with the term "GNSS".

The wired communication may include at least one of a universal serial bus (USB), a high definition multimedia Interface (HDMI), recommended standard 232 (RS-232), and a plain old telephone service (POTS). The network 162 may include a telecommunications network or at least one of a computer network (e.g., a local area network (LAN) or a wide area network (WAN)), the Internet, and a telephone network.

Each of the first and second external electronic devices 102 and 104 may be of the same type or a different type from that of the electronic device 101. All or some of the operations performed in the electronic device 101 may be performed in the electronic devices 102 and 104, and/or the server 106. When the electronic device 101 has to perform a function or service automatically or in response to a request, the electronic device 101 may request the electronic device 102 or 104, and/or the server 106, to perform at least some functions relating thereto, instead of autonomously or additionally performing the function or service. The electronic device 102 or 104, and/or the server 106, may execute the requested functions or the additional functions, and may deliver an execution result to the electronic device 101. The electronic device 101 may provide the received result as it is, or may additionally process the received result to provide the requested functions or services. To this end, cloud computing, distributed computing, or client-server computing technology may be used.

Figure 2:
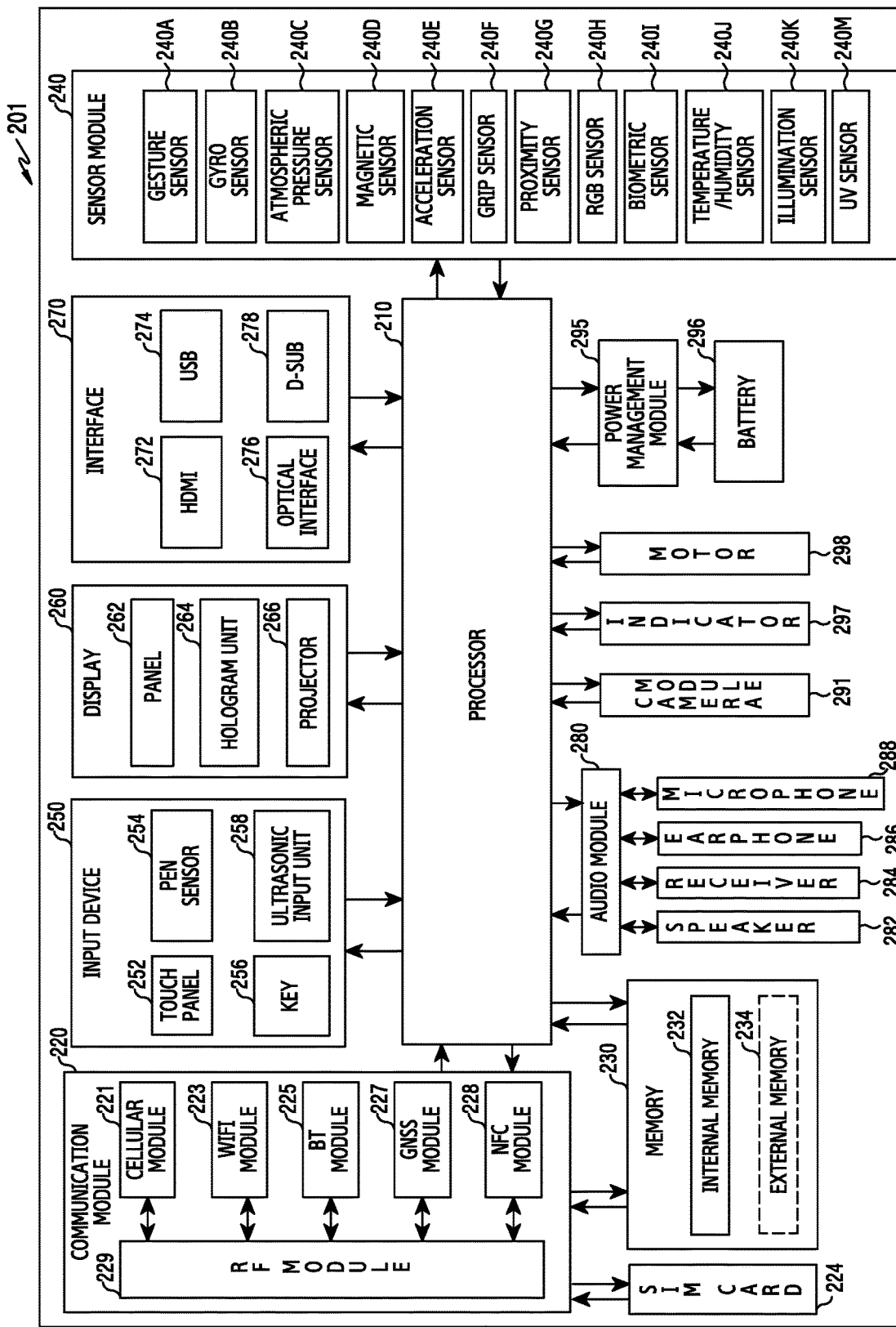
FIG. 2 is a block diagram of a configuration of an electronic device, according to various embodiments.

FIG. 2 is a block diagram of a configuration of an electronic device 201 according to an embodiment of the present disclosure.

Referring to FIG. 2, the electronic device 201 includes at least one processor 210 (e.g., an AP), a communication module 220, a subscriber identification module (SIM) card 224, a memory 230, a sensor module 240, an input device 250, a display 260, an interface 270, an audio module 280, a camera module 291, a power management module 295, a battery 296, an indicator 297, and a motor 298.

The processor 210 may control a plurality of hardware or software elements connected thereto and may perform various data processing and operations by driving an operating system or an application program. The processor 210 may be implemented by a system on chip (SoC) and may further include a graphic processing unit (GPU) and/or an image signal processor. The processor 210 may also include at least some (e.g., a cellular module 221) of the elements illustrated in FIG. 2. The processor 210 may load, in a volatile memory, instructions or data received from at least one of the other elements (e.g., a non-volatile memory), process the loaded instructions or data, and store the result in the non-volatile memory.

The communication module 220 includes, for example, a cellular module 221, a Wi-Fi module 223, a bluetooth module 225, a GNSS module 227, an NFC module 228, and an RF module 229. The cellular module 221 may provide a voice call, a video call, a text message service, an Internet service, or the like through a communication network. The cellular module 221 may identify or authenticate an electronic device 201 in the communication network using the SIM card 224. The cellular module 221 may perform at least some of the functions that the AP 210 provides. The cellular module 221 may include a CP. At least some of the cellular module 221, the Wi-Fi module 223, the bluetooth module 225, the GNSS module 227, and the NFC module 228 may be included in a single Integrated Chip (IC) or IC package. The RF module 229 may transmit or receive a communication signal (e.g., an RF signal). The RF module 229 may include a transceiver, a power amp module (PAM), a frequency filter, a low noise amplifier (LNA), or an antenna. At least one of the cellular module 221, the Wi-Fi module 223, the bluetooth module 225, the GNSS module 227, and the NFC module 228 may transmit or receive an RF signal through a separate RF module. The SIM card 224 may include an embedded SIM and may contain unique identification information (e.g., an integrated circuit card identifier (ICCID)) or subscriber information (e.g., international mobile subscriber identity (IMSI)).

The memory 230 includes at least one of an internal memory 232 or an external memory 234. The internal memory 232 may include, for example, at least one of a volatile memory (e.g., a DRAM, an SRAM, or an SDRAM) and a non-volatile memory (e.g., a one-time programmable ROM (OTPROM), a PROM, an EPROM, an EEPROM, a mask ROM, a flash ROM, a flash memory, a hard drive, or a solid-state drive (SSD)). The external memory 234 may include a flash drive, a compact flash (CF), a secure digital (SD), a micro-SD, a mini-SD, an extreme digital (xD), a multi-media card (MMC), and a memory stick. The external memory 234 may be functionally and/or physically connected to the electronic device 201 through various interfaces.

The sensor module 240 may measure a physical quantity or sense the operating state of the electronic device 201 and may convert the measured or sensed information into an electrical signal. The sensor module 240 includes at least one of a gesture sensor 240A, a gyro sensor 240B, an atmospheric pressure sensor 240C, a magnetic sensor 240D, an acceleration sensor 240E, a grip sensor 240F, a proximity sensor 240G, a red, green, blue (RGB) sensor 240H, a biometric sensor 240I, a temperature/humidity sensor 240J, an illumination sensor 240K, and a ultraviolet (UV) sensor 240M. Additionally or alternatively, the sensor module 240 may include an e-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling one or more sensors included therein. The electronic device 201 may further include, as a part of the processor 210 or separately from the processor 210, in order to control the sensor module 240 while the processor 210 is in a sleep state, a processor configured to control the sensor module 240.

At least one light sensor (e.g., the gesture sensor 240A, the proximity sensor 240G, or the biometric sensor 240I) may be disposed below or under the display 260. At least one light sensor may be disposed on at least a part of the rear surface of the display 260 designed to be transmissive to light. The at least one light sensor may include a light receiving unit and a light emitting unit, which are not shown. The light receiving unit may receive light (or a light signal) scattered or reflected from an object, and may generate an electrical signal (or a digital value) based on the received light. The light that is output from the light emitting unit may be emitted to the outside through the display 260. The external light may pass through the display 260 and enter the light receiving unit.

The electronic device 201 may include a light blocking element for reducing the electrical influence of light output from the light emitting unit of the light sensor on the display. The light blocking element may be disposed inside the display 260. The light blocking element blocks the light (or light energy) output from the light emitting unit of the light sensor from entering the display, and may prevent an erroneous operation (e.g., a spot) of the display, which is caused due to the light output from the light emitting unit of the light sensor.

The processor 210 may control the light emitting unit of the light sensor and/or the display 260 in order to lower the visibility of a spot generated on the display 260 due to the light output from the light emitting unit of the light sensor. The processor 210 may adjust the display 260 to express an area of the display 260, which corresponds to the light emitting unit of the light sensor, in a dark color (e.g., a black color). For example, when an image is displayed on the display 260, the processor 210 may adjust the light emitting unit to output light of at least one wavelength band in an interval in which a pixel is turned off for a time in a frame. The processor 210 may adjust the display 260 to deactivate an area of the display 260 at a position in alignment with at least one light source of the light emitting unit. The processor 210 may adjust the display 260 to display a black color in the area of the display 260 at a position in alignment with at least one light source of the light emitting unit.

The processor 210 may improve power consumption of the electronic device 201 by adjusting a light output power level of at least one light source of the proximity sensor 240G in a proximity detection mode using the proximity sensor 240G. The light blocking element may block the light output from the light emitting unit from entering a part (e.g., a thin film transistor (TFT)) of the display 260. When the electronic device 201 is designed to have the light blocking element, a light output power value of the light emitting unit may be set to a relatively high fixed value compared to when the electronic device 201 is designed not to have the light blocking element. An operation of setting the light output power value of the light emitting unit to the relatively high fixed value, compared to when the electronic device 201 is designed not to have the light blocking element, may be aimed at compensating for influence of the light from the light emitting unit by at least one light blocking element. An operation of setting the light output power value of the light emitting unit to the relatively high fixed value, compared to when the electronic device 201 is designed not to have the light blocking element, may not be effective for power consumption. The processor 210 flexibly adjusts the light output power value of the light emitting unit based on a proximity distance of an object so that power consumption of the electronic device 201 may by improved.

The input device 250 includes a touch panel 252, a (digital) pen sensor 254, a key 256, or an ultrasonic input device 258. The touch panel 252 may use at least one of capacitive, resistive, infrared, and ultrasonic types. Furthermore, the touch panel 252 may include a control circuit and a tactile layer to provide a tactile reaction to a user.

The (digital) pen sensor 254 may include a recognition sheet that is a part of, or separate from, the touch panel.

The key 256 may include a physical button, an optical key, or a keypad.

The ultrasonic input device 258 may sense ultrasonic waves generated by an input tool through a microphone 288 to identify data corresponding to the sensed ultrasonic waves.

The display 260 includes a panel 262, a hologram device 264, a projector 266, and/or a control circuit for controlling them.

The panel 262 may be implemented to be flexible, transparent, or wearable. The panel 262, together with the touch panel 252, may be configured as one or more modules. The panel 262 may include a pressure sensor (or a force sensor) for measuring a pressure of a user's touch. The pressure sensor may be integrated with the touch panel 252 or may be implemented as one or more sensors separate from the touch panel 252.

The hologram device 264 may display a three-dimensional image in the air by using light interference.

The projector 266 may display an image by projecting light onto a screen. The screen may be located in the interior of, or on the exterior of, the electronic device 201.

The interface 270 includes at least one of an HDMI 272, a USB 274, an optical interface 276, or a D-subminiature (D-sub) 278. Additionally or alternatively, the interface 270 may include a mobile high-definition link (MHL) interface, an SD card/MMC interface, or an Infrared Data Association (IrDA) standard interface.

The audio module 280 may convert sound into an electrical signal, and vice versa. The audio module 280 may process sound information that is input or output through a speaker 282, a receiver 284, earphones 286, and the microphone 288.

The camera module 291 is a device that can photograph a still image and a moving image. The camera module 291 may include one or more image sensors (e.g., a front sensor or a rear sensor), a lens, an image signal processor (ISP), or a flash (e.g., an LED or xenon lamp).

The power management module 295 may manage the power of the electronic device 201. The power management module 295 may include a power management integrated circuit (PMIC), a charger IC, or a battery gauge. The PMIC may use a wired and/or wireless charging method. The wireless charging method may include a magnetic resonance method, a magnetic induction method, and an electromagnetic wave method. Additional circuits (e.g., a coil loop, a resonance circuit, and a rectifier) for wireless charging may be further included. The battery gauge may measure a residual amount, a voltage, current, or temperature of the battery 296. The battery 296 may include a rechargeable battery and/or a solar battery.

The indicator 297 may display a booting state, a message state, or a charging state, of the electronic device 201 or a part thereof (e.g., the processor 210).

The motor 298 may convert an electrical signal into a mechanical vibration, and generate a vibration or haptic effect.

The electronic device 201 may include a mobile TV support device (e.g., GPU) that may process media data according to a standard, such as digital multimedia broadcasting (DMB), digital video broadcasting (DVB), and mediaFlo™.

Each of the above-described elements of hardware may be configured with one or more components, and the names of the corresponding elements may vary based on the type of electronic device.

The electronic device 201 may be configured such that some elements are omitted, additional elements are included, or some of the elements are combined into a single entity, in which functions of the compound entity may be performed in the same manner to the functions of the individual components.

Figure 3:
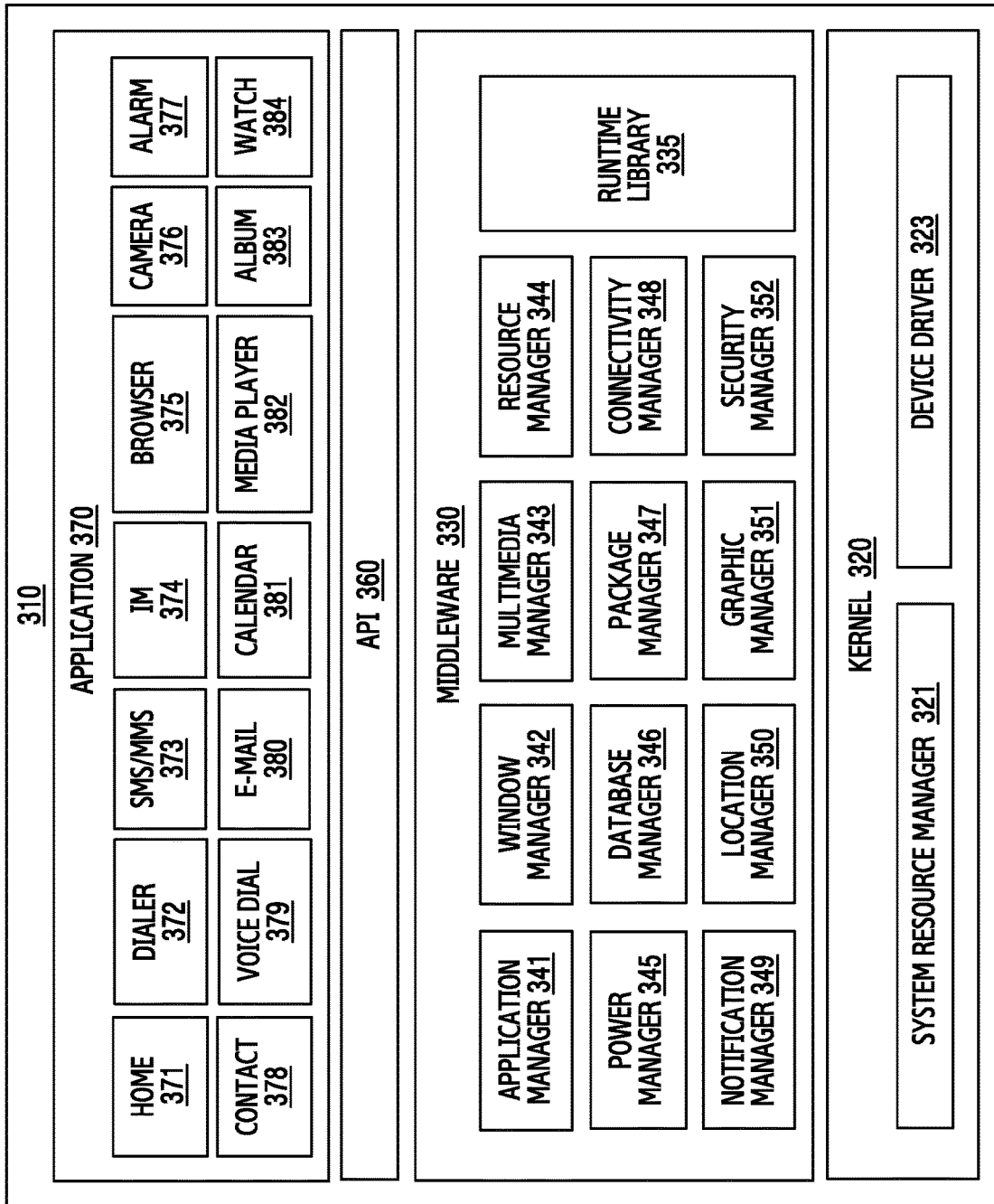
FIG. 3 is a block diagram of a configuration of a program module, according to an embodiment of the present disclosure.

FIG. 3 is a block diagram of a configuration of a program module, according to an embodiment of the present disclosure. The program module 310 may include an operating system (OS) that controls resources relating to the electronic device 101 and/or the application programs 147 that are driven on the OS. The operating system may include, for example, Android™, iOS™, Windows™, Symbian™, Tizen™, or Bada™.

Referring to FIG. 3, the program module 310 includes a kernel 320, middleware 330, an API 360, and/or applications 370. At least a part of the program module 310 may be preloaded on the electronic device 101, or may be downloaded from an external electronic device (e.g., the external electronic device 102 or 104, or the server 106).

The kernel 320 includes a system resource manager 321 and/or a device driver 323. The system resource manager 321 may control, allocate, or retrieve system resources. The system resource manager 321 may include a process manager, a memory manager, or a file system manager. The device driver 323 may include a display driver, a camera driver, a bluetooth driver, a shared memory driver, a USB driver, a keypad driver, a Wi-Fi driver, an audio driver, or an inter-process communication (IPC) driver.

The middleware 330 may provide a function required by the applications 370 in common, or may provide various functions to the applications 370 through the API 360 such that the applications 370 can efficiently use limited system resources within the electronic device 101. According to an embodiment, the middleware 330 includes a runtime library 335, an application manager 341, a window manager 342, a multi-media manager 343, a resource manager 344, a power manager 345, a database manager 346, a package manager 347, a connectivity manager 348, a notification manager 349, a location manager 350, a graphic manager 351, and a security manager 352.

The runtime library 335 may include a library module that a compiler uses to add a new function through a programming language while the applications 370 are being executed. The runtime library 335 may manage an input/ output, manage a memory, or process an arithmetic function. The application manager 341 may manage the life cycles of the applications 370.

The window manager 342 may manage GUI resources used for a screen.

The multimedia manager 343 may identify formats required for reproducing various media files and may encode or decode a media file using a codec suitable for a corresponding format.

The resource manager 344 may manage source code of the applications 370 or space in memory.

The power manager 345 may manage the capacity, temperature, or power of a battery, and may determine or provide power information necessary for an operation of the electronic device 101 using the information of the battery.

The power manager 345 may operate in conjunction with a basic input/output system (BIOS).

The database manager 346 may generate, search, or change databases to be used by the applications 370.

The package manager 347 may manage the installation or update of an application that is distributed in the form of a package file.

The connectivity manager 348 may manage a wireless connection.

The notification manager 349 may provide an event to a user, such as an arrival message notification, an appointment notification, and a proximity notification.

The location manager 350 may manage the location information of the electronic device 101.

The graphic manager 351 may manage a graphic effect to be provided to a user and a user interface relating to the graphic effect.

The security manager 352 may provide system security or user authentication.

The middleware 330 may include a telephony manager for managing a voice or video call function of the electronic device 101 or a middleware module capable of forming a combination of functions of the above-described elements.

The middleware 330 may provide specialized modules according to a type of operation system. The middleware 330 may dynamically delete some existing elements or add new ones.

The API 360 is a set of API programming functions, and may be provided with different configurations depending on the operating system. For example, Android™ or iOS™ may provide one API set for each platform, and Tizen™ may provide two or more API sets for each platform.

The application 370 includes a home 371 application, a dialer 372 application, an SMS/MMS 373 application, an instant message (IM) 374 application, a browser 375 application, a camera 376 application, an alarm 377 application, a contact 378 application, a voice dial 379 application, an e-mail 380 application, a calendar 381 application, a media player 382 application, an album 383 application, and a watch 384 application. The application 370 may additionally include a healthcare application (e.g., for measuring an amount of exercise or a blood glucose level) or an environmental information application (e.g., for providing atmospheric pressure, humidity, or temperature information). The applications 370 may include an information exchange application that can support the exchange of information between the electronic device and an external electronic device 101. The information exchange application may include a notification relay application for relaying particular information to an external electronic device or a device management application for managing an external electronic device. For example, the notification relay application may relay notification information generated in the other applications of the electronic device 101 to an external electronic device, or the notification relay application may receive notification information from an external electronic device to provide to a user. The device management application may install, delete, or update a function (e.g., adjusting brightness (or resolution) of the display or turning on/off an external electronic device itself) of an external electronic device communicating with the electronic device or an application operating in the external electronic device. The application 370 may include at least an application (e.g., a health care application of a mobile medical appliance) designated according to attributes of an external electronic device. The application 370 may include applications received from an external electronic device. At least apart of the program module 310 may be implemented (e.g., executed) by software, firmware, hardware, or a combination thereof, and may include a module, a program, a routine, an instruction set, or a process for performing one or more functions.

The term "module" as used herein may include a unit consisting of hardware, software, or firmware, and may be used interchangeably with the terms "logic", "logical block", "component", or "circuit". The "module" may be an integrated component, or a minimum unit for performing one or more functions or a part thereof. The "module" may be mechanically or electronically implemented and may include an application-specific integrated circuit (ASIC) chip, an FPGA, or a programmable-logic device, which is now known or is to be developed in the future, for performing certain operations.

At least some devices (e.g., modules or functions thereof) or methods (e.g., operations) may be implemented by an instruction which is stored a computer-readable storage medium in the form of a program module. The instruction, when executed by a processor, may cause one or more processors to execute the function corresponding to the instruction. A computer-readable recording medium may include a hard disk, a floppy disk, a magnetic medium (e.g., a magnetic tape), an optical recording medium (e.g., a CD-ROM, a DVD, a magnetic-optical medium (e.g., a floptical disk), or an embedded memory). The instruction may include a code created by a complier or a code executable by an interpreter.

Modules or program modules may include at least one or more of the elements described above, may have some of the elements omitted, or may further include additional elements. Operations performed by a module, a programming module, or other elements may be executed sequentially, in parallel, repeatedly, or in a heuristic manner. At least some operations may be executed according to another sequence, may be omitted, or may further include additional operations.

Figure 4A:
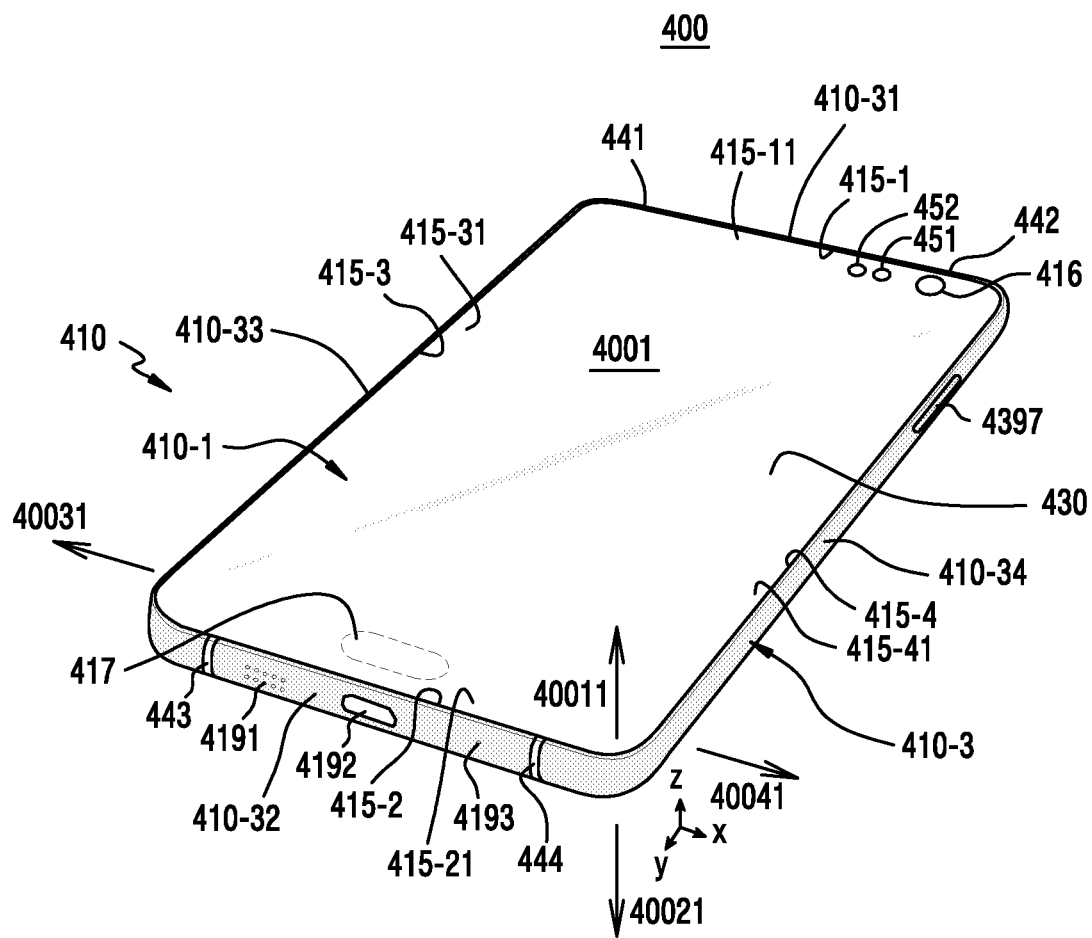
FIGS. 4A, 4B, and 4C are an electronic device including a display and at least one light sensor, according to embodiments of the present disclosure.
Figure 4B:
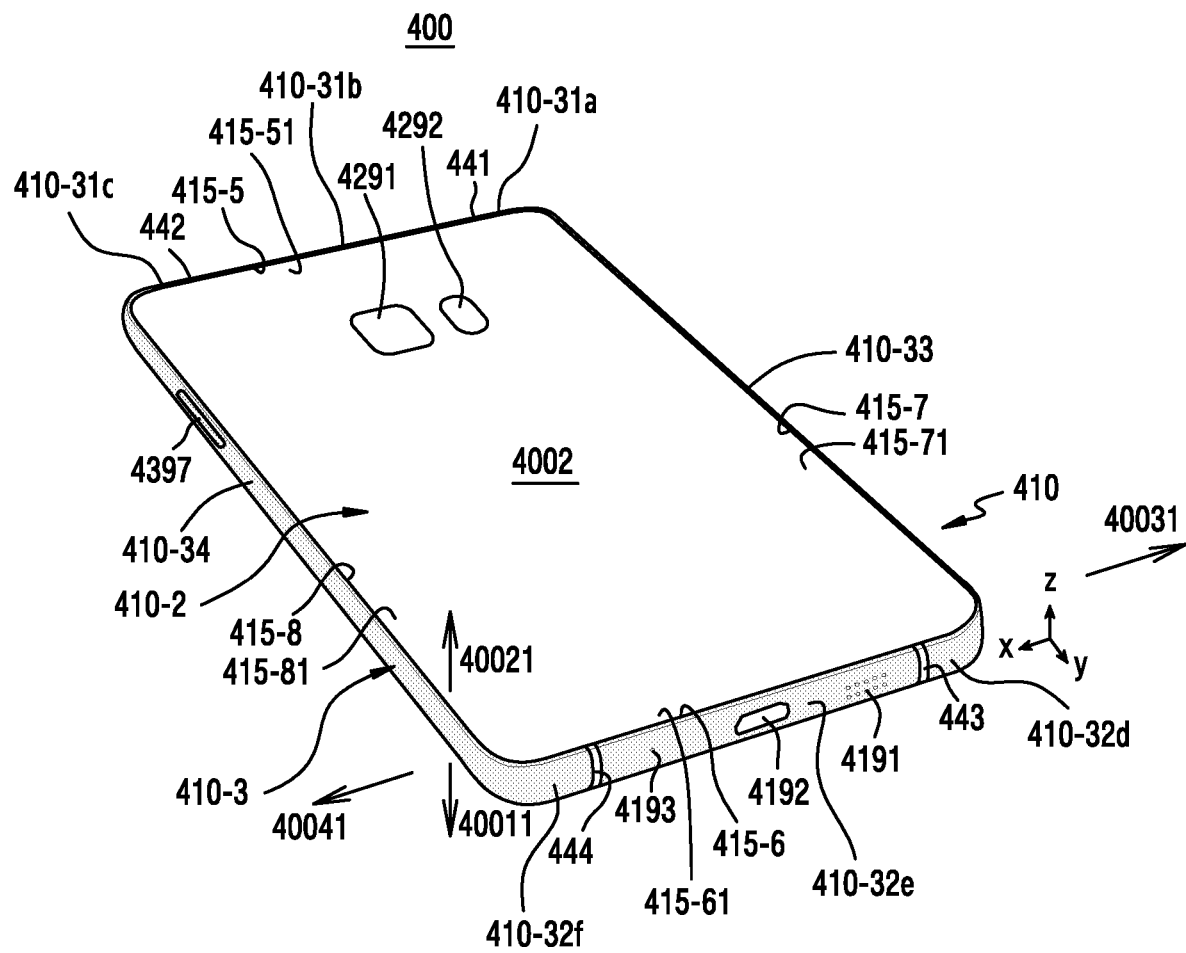
Figure 4C:
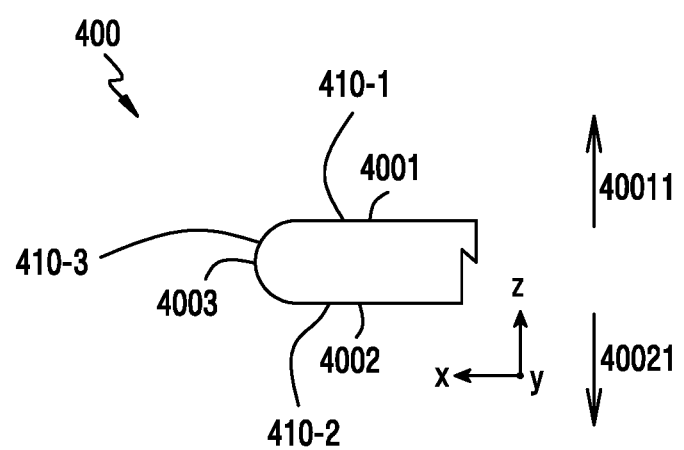
Figure 5:
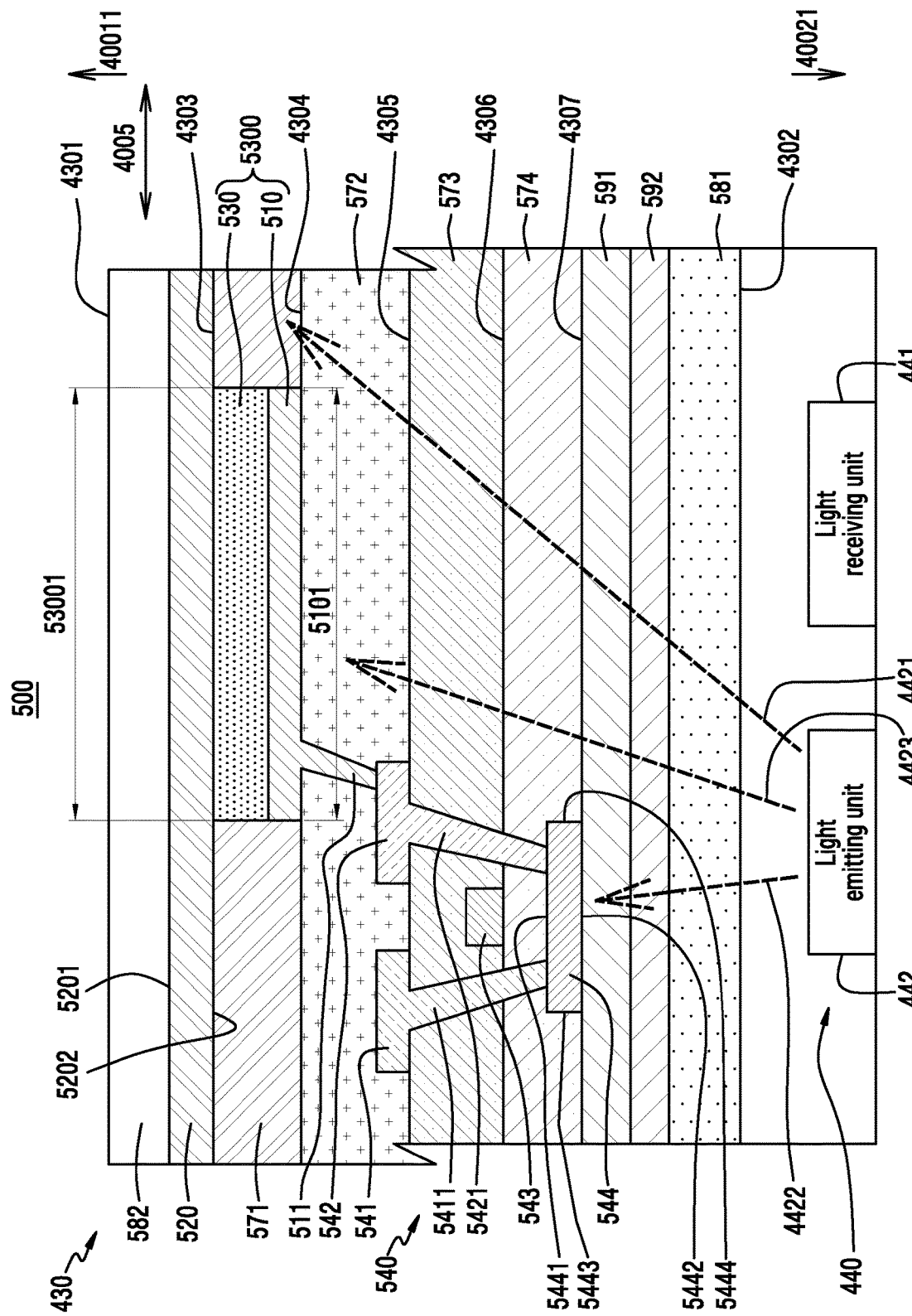
FIG. 5 is a cross-sectional diagram of a structure including the display and the at least one light sensor, according to an embodiment of the present disclosure.

FIGS. 4A, 4B, and 4C are an electronic device including a display and at least one light sensor, according to embodiments of the present disclosure. FIG. 5 is a cross-sectional diagram of a structure including the display and the at least one light sensor, according to an embodiment of the present disclosure. FIGS. 6A, 6B, 6C, and 6D are diagrams for describing a light blocking element, according to embodiments of the present disclosure. FIG. 7 is a display including the light blocking element, according to an embodiment of the present disclosure. An electronic device 400 may include at least some elements of the electronic device 101 of FIG. 1 or at least some elements of the electronic device 201 of FIG. 2.

Referring to FIGS. 4A, 4B, and 4C, the electronic device 400 includes a housing 410 that forms all or at least a part of the appearance of the electronic device 400. The housing 410 may include a non-metallic material and/or a metallic material. For example, the housing 410 may be formed of plastic, metal, carbon fiber, other fiber composites, ceramics, glass, wood, or a combination thereof. The housing 410 may be formed entirely of one material, a combination of a plurality of materials, and/or of materials having partially different properties.

The housing 410 may include a first surface 4001, a second surface 4002, and a third surface 4003. The first surface 4001 faces in a first direction 40011 and the second surface 4002 faces in a second direction 40021 opposite the first direction 40011. The third surface 4003 surrounds the space between the first surface 4001 and the second surface 4002.

The first surface 4001 and/or the second surface 4002 of the housing 410 may be substantially planar. The third surface 4003 of the first housing 410 may include a flat surface or a curved surface.

The housing 410 includes a first cover 410-1 forming the first surface 4001, and a second cover 410-2 forming the second surface 4002. The housing 410 includes a bezel 410-3 surrounding the space between the first cover 410-1 and the second cover 410-2. The bezel 410-3 forms the third surface 4003.

The first cover 410-1 may be rectangular and includes a first edge 415-1, a second edge 415-2, a third edge 415-3, and a fourth edge 415-4. The first edge 415-1 and the second edge 415-2 may face each other and may be in parallel, and the third edge 415-3 and the fourth edge 415-4 may face each other and may also be in parallel. One end of the first edge 415-1 may be connected to the third edge 415-3, and the other end of the first edge 415-1 may be connected to the fourth edge 415-4. One end of the second edge 415-2 may be connected to the third edge 415-3 and the other end of the second edge 415-2 may be connected to the fourth edge 415-4.

The distance between the first edge 415-1 and the second edge 415-2 may be greater than the distance between the third edge 415-3 and the fourth edge 415-4.

A connection part of the first edge 415-1 and the third edge 415-3, a connection part of the first edge 415-1 and the fourth edge 415-4, a connection part of the second edge 415-2 and the third edge 415-3, or a connection part of second edge 415-2 and the fourth edge 415-4 may be rounded.

The second cover 410-2 may have the same size and shape as those of the first cover 410-1. The second cover 410-2 may be rectangular and includes a fifth edge 415-5 corresponding to the first edge 415-1, a sixth edge 415-6 corresponding to the second edge 415-2, a seventh edge 415-7 corresponding to the third edge 415-3, and an eighth edge 415-8 corresponding to the fourth edge 415-4.

At least a part of the first cover 410-1 and/or the second cover 410-2 may include a light-transmissive material (e.g., plastic or glass). The electronic device 400 may include at least one light sensor (e.g., the light sensor 440 in FIG. 5) disposed between the first cover 410-1 and the second cover 410-2. The at least one light sensor may be disposed on at least a part of the rear surface of a display 430. Light that is output from the at least one light sensor may be emitted to the outside passing through the first cover 410-1. External light may pass through the first cover 410-1 and enter the at least one light sensor.

The bezel 410-3 includes a first metal frame 410-31 that connects the first edge 415-1 of the first cover 410-1 and the fifth edge 415-5 of the second cover 410-2. The bezel 410-3 includes a second metal frame 410-32 that connects the second edge 415-2 of the first cover 410-1 and the sixth edge 415-6 of the second cover 410-2. The bezel 410-3 includes a third metal frame 410-33 that connects the third edge 415-3 of the first cover 410-1 and the seventh edge 415-7 of the second cover 410-2. The bezel 410-3 includes a fourth metal frame 410-34 that connects the fourth edge 415-4 of the first cover 410-1 and the eighth edge 415-8 of the second cover 410-2.

A connection part of the first metal frame 410-31 and the third metal frame 410-33, a connection part of the first metal frame 410-31 and the fourth metal frame 410-34, a connection part of the second metal frame 410-32 and the third metal frame 410-33, or a connection part of the second metal frame 410-32 and the fourth metal frame 410-34 may be rounded.

The bezel 410-3 may include an extension unit extending from at least one of the first metal frame 410-31, the second metal frame 410-32, the third metal frame 410-33, and the fourth metal frame 410-34 to between the first cover 410-1 and the second cover 410-2. The extension unit may be combined with a printed circuit board (PCB) or a support member (e.g., a bracket).

At least one among the first metal frame 410-31, the second metal frame 410-32, the third metal frame 410-33, and the fourth metal frame 410-34 of the bezel 410-3 may include a plurality of metal parts physically separated from each other. A non-conductive member may be disposed between the plurality of metal parts.

The first metal frame 410-31 of the bezel 410-3 includes metal frame a 410-31a, metal frame b 410-31b, and metal frame c 410-31c, which are physically separated from each other. Metal frame b 410-31b may be disposed between metal frame a 410-31a and metal frame c 410-31c.

Metal frame a 410-31a of the first metal frame 410-31 may be connected to the third metal frame 410-33. Metal frame c 410-31c of the first metal frame 410-31 may be connected to the fourth metal frame 410-34. Metal frame a 410-31a and the third metal frame 410-33 may be formed of an integrated metal. Metal frame c 410-31c and the fourth metal frame 410-34 may be formed of an integrated metal.

The housing 410 includes a first non-conductive member 441 disposed between metal frame a 410-31a and metal frame b 410-31b of the bezel 410-3. The housing 410 includes a second non-conductive member 442 disposed between metal frame b 410-31b and metal frame c 410-31c. The first non-conductive member 441 and the second non-conductive member 442 may be smoothly connected to the first metal frame 410-31 and may form a part of the third surface 4003 of the first housing 410. The first non-conductive member 441 and/or the second non-conductive member 442 may extend from a non-conductive member disposed inside the housing 410.

A first gap between metal frame a 410-31a and metal frame b 410-31b may be where the first non-conductive member 441 is filled. A second gap between metal frame b 410-31b and metal frame c 410-31c may be where the second non-conductive member 442 is filled. The width of the first gap and the width of the second gap may be the same or different from each other.

The second metal frame 410-32 of the bezel 410-3 includes metal frame d 410-32d, metal frame e 410-32e, and metal frame f 410-32f, which are physically separated from each other. Metal frame e 410-32e may be disposed between metal frame d 410-32d and metal frame f 410-32f.

Metal frame d 410-32d, of the second metal frame 410-32, may be connected to the third metal frame 410-33. Metal frame f 410-32f of the second metal frame 410-32 may be connected to the fourth metal frame 410-34. Metal frame d 410-32d, the third metal frame 410-33, metal frame f 410-32f and the fourth metal frame 410-34 may be formed of an integrated metal.

The housing 410 includes a third non-conductive member 443 disposed between metal frame d 410-32d and metal frame e 410-32e of the bezel 410-3. The housing 410 includes a fourth non-conductive member 444 disposed between metal frame e 410-32e and metal frame f 410-32f. The third non-conductive member 443 and the fourth non-conductive member 444 may be smoothly connected to the second metal frame 410-32 and may form a part of the third surface 4003 of the housing 410. The third non-conductive member 443 and/or the fourth non-conductive member 444 may extend from the non-conductive member disposed inside the housing 410.

A third gap between metal frame d 410-32d and metal frame e 410-32e may be a part where the third non-conductive member 443 is filled. A fourth gap between metal frame e 410-32e and metal frame f 410-32f may be a part where the fourth non-conductive member 444 is filled. The width of the third gap and the width of the fourth gap may be the same or different from each other.

The first surface 4001 includes a first edge area 415-11 adjacent to the first edge 415-1, a second edge area 415-21 adjacent to the second edge 415-2, a third edge area 415-31 adjacent to the third edge 415-3, and a fourth edge area 415-41 adjacent to the fourth edge 415-4. At least one among the first edge area 415-11, the second edge area 415-21, the third edge area 415-31, and the fourth edge area 415-41 may be an inclined surface. For example, the third edge area 415-31 may be a curved surface having a shape descending in the second direction 40021 with respect to coordinates increasing in a direction 40031 from the fourth metal frame 410-34 to the third metal frame 410-33. The fourth edge area 415-41 may be a curved surface having a shape descending in the second direction 40021 with respect to coordinates increasing in a direction 40041 from the third metal frame 410-33 to the fourth metal frame 410-34.

The second surface 4002 includes a fifth edge area 415-51 adjacent to the fifth edge 415-5, a sixth edge area 415-61 adjacent to the sixth edge 415-6, a seventh edge area 415-71 adjacent to the seventh edge 415-7, and an eighth edge area 415-81 adjacent to the eighth edge 415-8. At least one among the fifth edge area 415-51, the sixth edge area 415-61, the seventh edge area 415-71, and the eighth edge area 415-81 may be an inclined surface.

When an edge part of the first cover 410-1 is formed in a curved shape, an edge area (e.g., the first edge area 415-11, the second edge area 415-21, the third edge area 415-31, or the fourth edge area 415-41) of the first surface 4001 may have an inclined surface. When an edge part of the second cover 410-2 is formed in a curved shape, an edge area (e.g., the fifth edge area 415-51, the sixth edge area 415-61, the seventh edge area 415-71, or the eighth edge area 415-81) of the second surface 4002 may have an inclined surface.

The electronic device 400 includes the display 430 disposed in a space between the first cover 410-1 and the second cover 410-2 of the housing 410. The display 430 may be exposed to the outside through the first cover 410-1.

The display 430 may have a size overlapping at least a part of an area of the first surface 4001. The display 430 may have a size overlapping the entire area of the first surface 4001, and the entire area of the first surface 4001 may be a screen of the electronic device 400.

The display 430 may include a display edge area overlapping an edge area (e.g., the first edge area 415-11, the second edge area 415-21, the third edge area 415-31, or the fourth edge area 415-41) of the first surface 4001. When the edge area of the first surface 4001 is designed to be an inclined surface, the edge area of the display 430 may also be curved along the inclined surface of the first surface 4001.

The display 430 may include a touch sensing device for a touch input and/or a hovering input. When a finger or a stylus is proximate (e.g., 10 mm or less) to the first surface 4001, the electronic device 400 may sense a touch input or a hovering input through the display 430.

The electronic device 400 may include at least one light sensor disposed between the display 430 and the second surface 4002. The display 430 is in the form of a plate and may include a top surface adjacent to the first cover 410-1 and a bottom surface (or a rear surface) adjacent to the at least one light sensor.

FIG. 5 is a cross-sectional diagram of a structure including the display 430 and the at least one light sensor 440, according to an embodiment of the present disclosure.

Referring to FIG. 5, the display 430 includes a display top surface 4301 facing a first direction 40011 (e.g., 40011 of FIGS. 4A, 4B, and 4C). The display 430 includes a display bottom surface 4302 facing a second direction 40021.

The display top surface 4301 is substantially parallel to the first surface 4001 of the first cover 410-1 of FIG. 4A. The display bottom surface 4302 is substantially parallel to the display top surface 4301. Hereinafter, when element A, element B, and element C are arranged in order in the second direction 40021, it may be understood that element A is disposed above element B, and element C is disposed below element B.

The at least one light sensor 440 may measure an intensity for various wavelength bands of light, and the electronic device 400 may quantitatively or qualitatively analyze a material by using data measured by the at least one light sensor 440.

The at least one light sensor 440 is disposed below the display 430, as illustrated in FIG. 5. The at least one light sensor 440 is disposed on at least a part of the rear surface of the display 430. At least one light sensor 440 is disposed adjacent (e.g., within 10 mm or less) to the display bottom surface 4302. At least a part of the display 430 may be designed to be transmissive to light.

The at least one light sensor 440 includes a light receiving unit 441 and a light emitting unit 442. The light receiving unit 441 may receive light (or a light signal) scattered or reflected from an object, and may generate an electrical signal (or a digital value) based on the received light. The at least one light sensor 440 may include an analog-to-digital converter (ADC). The ADC may generate a detection value (i.e., a digital value or an ADC value) corresponding to the amount of light received by the light receiving unit 441 (e.g., quantization). The light output from the light emitting unit 442 may be emitted to the outside through the display 430.

The light receiving unit 441 may include one or more light detectors (e.g., sensors or photodiodes), capable of detecting light in one or more wavelength bands.

The light receiving unit 441 may include a plurality of light detectors that may detect light in one or more wavelength bands different from each other. For example, one light detector may detect light in a first wavelength band, and the other light detector may detect light in a second wavelength band that is different from the first wavelength band.

According to various embodiments, the light receiving unit 441 may include a plurality of light detectors, and the plurality of light detectors may detect light in one or more wavelength bands that are the same or similar to each other. For example, one light detector may detect light in a first wavelength band, and another light detector may detect light in the first wavelength band as well as light in a second wavelength band different from the first wavelength band. Still another light detector may detect light in the first wavelength band as well as light in a third wavelength band different from the first wavelength band and second wavelength band. Still another light detector may detect light in the first wavelength band as well as light in a fourth wavelength band different from the first wavelength band, second wavelength band, and third wavelength band.

The light receiving unit 441 may detect light in a wavelength band for proximity detection (e.g., a maximum sensitivity wavelength 940 nm or 950 nm). In a proximity detection mode, when an object (e.g., a user face) moves toward a first surface (e.g., 4001 in FIG. 4A) of the electronic device 400 to the vicinity (e.g., 10 cm or less) of the at least one light sensor 440, the light output from the light emitting unit 442 in the wavelength band for proximity detection, may be scattered or reflected from the object. The scattered or reflected light in the wavelength band for proximity detection may enter the light receiving unit 441, which may generate an electrical signal relating to the proximity of the object or a proximity distance of the object based on the entered scattered or reflected light. For example, as the distance between the at least one light sensor 440 and the object decreases, the amount of light that is scattered or reflected from the object and then enters the light receiving unit 441 may increase and the ADC value may also increase. As the distance between the at least one light sensor 440 and the object increases, the amount of reflected light entering the light receiving unit 441 and the ADC value may decrease.

The light receiving unit 441 may detect light in a wavelength band (e.g., a maximum sensitivity wavelength of 940 nm) for gesture detection. In a gesture detection mode, when a user's hand moves near (e.g., within 10 cm) of the first surface (e.g., 4001 in FIG. 4A) of the electronic device 400, light in the wavelength band for gesture detection, which is emitted from the light emitting unit 442, may be scattered or reflected from the user's hand. The scattered or reflected light in the wavelength band for gesture detection may enter the light receiving unit 441, and the light receiving unit 441 may generate an electrical signal relating to a gesture of the user's hand based on the entered scattered or reflected light.

The light receiving unit 441 may detect light in a wavelength band for object analysis. For example, in a biometric detection mode, when the user's body moves toward the first surface of the electronic device 400 (e.g., 4001 in FIG. 4A) to the vicinity (e.g., 10 cm or less) of at least one light sensor 440, light in a wavelength band for biometric detection, which is output from the light emitting unit 442, may be reflected by the user's body. The scattered or reflected light in the wavelength band for biometric detection may enter the light receiving unit 441, and the light receiving unit 441 may generate an electronic signal relating to biometric information (e.g., skin moisture information, skin melanin information, skin temperature information, heart rate information, blood flow velocity information, or iris information) of the body of the user based on the entered scarred or reflected light. The light receiving unit 441 may be designed to detect, in a skin moisture detection mode, light in a wavelength band having a maximum sensitivity wavelength of 880 nm and/or a wavelength band having a maximum sensitivity wavelength of 970 nm. The light receiving unit 441 may be designed to detect, in a skin melanin detection mode, light in a wavelength band having a maximum sensitivity wavelength of 660 nm and/or a maximum sensitivity wavelength of 880 nm. The light receiving unit 441 may be designed to detect, in an erythema detection mode, light in a wavelength band having a maximum sensitivity wavelength of 568 nm and/or a wavelength band having a maximum sensitivity wavelength of 880 nm. The light receiving unit 441 may be designed to detect, in an iris recognition mode, light in a corresponding wavelength band. The light receiving unit 441 may be designed to detect, in a fingerprint recognition mode, light in a corresponding wavelength band.

The light receiving unit 441 may detect light in a wavelength band for external environment measurement. For example, the light receiving unit 441 may receive external light and may generate an electrical signal relating to the illuminance from the received external light in an illuminance detection mode.

The electronic device 400 may provide various detection modes, such as a proximity detection mode, a gesture detection mode, a biometric detection mode, or an illumination detection mode. The detection modes may include various dependent detection modes. The biometric detection mode may be a skin moisture detection mode, a skin melanin detection mode, or a skin temperature detection mode.

The electronic device 400 may provide multiple detection modes that may be defined as a selection of a plurality of detection modes. For example, the multiple detection mode may include selection of the proximity detection mode and the biometric detection mode. The multiple detection mode may include selection of the illumination detection mode and the biometric detection mode. The multiple detection mode may include a plurality of selections among dependent detection modes.

The electronic device 400 may selectively activate at least a part of the light receiving unit 441 in accordance with the selected detection mode. In the proximity detection mode, a control circuit (e.g., the processor 120 in FIG. 1 or the processor 210 in FIG. 2) may select and activate at least one light detector for proximity detection among the plurality of light detectors of the light receiving unit 441. In the biometric detection mode, the control circuit may select and activate at least one light detector for biometric detection among the plurality of light detectors of the light receiving unit 441.

The light emitting unit 442 may include at least one light emitter (or light source) capable of generating light in at least one wavelength bands.

The light emitting unit 442 may include a light emitter capable of generating light in all wavelength bands in which the light receiving unit 441 may detect light. The light emitting unit 442 may be designed to be a single light emitter capable of generating light in a broad wavelength band.

The light emitting unit 442 may be designed to selectively generate light of a corresponding wavelength band in accordance with control of the control circuit (e.g., the processor 120 in FIG. 1 or the processor 210 in FIG. 2). For example, in the proximity detection mode, the control circuit may control the light emitting unit 442 to generate light in a wavelength band for proximity detection. In the biometric detection mode, the control unit may control the light emitting unit 442 to generate light in a wavelength band for biometric detection.

The light emitting unit 442 may include a plurality of light emitters, and the plurality of light emitters may generate light in one or more wavelength bands different from each other. For example, one light emitter may generate light in a first wavelength band, and another light emitter may generate light in a second wavelength band different from the first wavelength band. In the proximity detection mode, the control circuit (e.g., the processor 120 in FIG. 1 or the processor 210 in FIG. 2) may select and activate at least one light emitter that generates light in a wavelength band for proximity detection among the plurality of light emitters of the light emitting unit 442. In the biometric detection mode, the control circuit may select and activate one or more light emitters that generate light in a wavelength band for biometric detection among the plurality of light emitters of the light emitting unit 442.

The light emitting unit 442 may include various forms of light emitting elements, such as a light emitting diode (LED).

The light sensor 440 may be provided as a single module (e.g., a system in package (SIP)) of a package form.

The light receiving unit 441 and/or the light emitting unit 442 may be mounted on a PCB of the electronic device 400. One end of the light receiving unit 441 may be electrically connected to a ground of the PCB of the electronic device 400 and the other end of the light receiving unit 441 may be electrically connected to the control circuit. The light receiving unit 441 may detect light, generate (i.e., convert) an electrical signal based on the detected light, and transmit the generated electrical signal to the control circuit.

Referring to FIG. 5, in an embodiment of the present disclosure, the display 430 may be an organic light emitting diode (OLED) display. The display 430 includes a first electrode 510, a second electrode 520, an organic layer 530, and a switch 540. The first electrode 510 is disposed below the second electrode 520, and the organic layer 530 is disposed between the first electrode 510 and the second electrode 520. The first electrode 510 and the second electrode 520 may be in the form of a layer extending in a direction 4005 orthogonal to the first direction 40011 or the second direction 40021 (hereinafter, referred to as a third direction). For example, referring to FIG. 4A, the third direction 4005 may include a direction between the first metal frame 410-31 and the second metal frame 410-32, and a direction between the third metal frame 410-33 and the fourth metal frame 410-34. The organic layer 530 is deposited between the first electrode 510 and the second electrode 520. The organic layer 530 may have a thickness corresponding to a distance (100 to 200 nm) between the first electrode 510 and the second electrode 520.

The first electrode 510 may be a cathode electrode, corresponding to a cathode, and may emit an electron. For example, the first electrode 510 may include Al, Si, Li, Ca, or Mg. The second electrode 520 may be an anode electrode, corresponding to an anode, and may emit a hole. The second electrode 520 may have light transmittance. For example, the second electrode 520 may be an indium tin oxide (ITO) or an antimony tin oxide (ATO). As illustrated, the switch 540 is disposed below the first electrode 510, but is not disposed at a position in alignment with the first electrode 510.

When the switch 540 is turned on by the control circuit, a voltage is applied to the first electrode 510 and the second electrode 520, and electrons emitted from the first electrode 510 and holes emitted from the second electrode 520 are combined in the organic layer 530. Exciton energy is generated due to a combination of the electrons and holes, and the exciton energy is emitted in the form of light in the organic layer 530.

The switch 540 may be a transistor, which may be a TFT. The TFT-type switch 540 includes a source electrode 541, a drain electrode 542, a gate electrode 543, and a semiconductor layer 544. The source electrode 541 may be an electrode for supplying an electron. The drain electrode 542 may be an electrode to which an electron is supplied. The gate electrode 543 may be an electrode for switching electron movement from the source electrode 541 to the drain electrode 542. The semiconductor layer 544 may be a path through which the electron moves when the gate electrode 543 applies a predetermined voltage or higher. The semiconductor layer 544, as an element that turns the switch 540 on, may be defined as an "active layer" or "active area" of the switch 540.

When a signal (e.g., a voltage) having a value equal to a threshold value or greater is applied to the gate electrode 543, the semiconductor layer 544 (e.g., a silicon layer) may become capable of moving an electron like a conductor, and an electron may be moved from the source electrode 541 to the drain electrode 542 through the semiconductor layer 544. Voltage may be applied to the first electrode 510 and the second electrode 520 (ON state) due to the movement of the electron. When voltage is applied to the first electrode 510 and the second electrode 520, the electron emitted from the first electrode 510 and the hole emitted from the second electrode 520 are combined, whereby light may be generated in the organic layer 530. When a forward voltage is applied to the switch 540, current flows to the organic layer 530, and an organic light emitting material of the organic layer 530 may emit light. As the current flowing to the organic layer 530 increases, the organic layer 530 may emit brighter light. When a reverse voltage is applied to the switch 540, the current does not substantially flow to the organic layer 530, and the organic layer 530 may not be able to emit light.

The display 430 may provide a plurality of pixels (or picture elements) according to resolution. A pixel may be defined as a dot that is a minimum unit for representing an image. The second electrode 520 may be designed as a common electrode for a plurality of pixels. The first electrode 510 and the organic layer 530 may be elements 5300 (hereinafter, referred to as a pixel layer) for one pixel. The pixel size 53001 may be defined by the size of the pixel layer 5300 extending in the third direction 4005. The display 430 may include a plurality of pixel layers disposed below the second electrode 520. The plurality of pixel layers may be uniform in shape and arranged in the third direction 4005. The display 430 may generate light using the single second electrode 520 and the plurality of pixel layers.

The second electrode 520 is disposed on a first virtual surface 4303 disposed between the display top surface 4301 and the first electrode 510. The second electrode 520 may be in a shape that conforms to at least a part of the first virtual surface 4303. For example, the at least part of the first virtual surface 4303 may be a plane extending generally in the third direction 4005, and the second electrode 520 may be a flat plate extending along the at least part of the first virtual surface 4303. In another example, the at least a part of the first virtual surface 4303 may be an inclined surface or a curved surface, and the second electrode 520 may be an inclined plate or a curved plate extending along the at least part of the first virtual surface 4303.

The second electrode 520 may be a layer extending in the third direction 4005 so as to cover a plurality of pixel layers. For example, the second electrode 520 may include a second electrode top surface 5201 facing the first direction 40011, and a second electrode bottom surface 5202 facing the second direction 40021. A plurality of pixel layers may be coupled to the second electrode bottom surface 5202, or the first virtual surface 4303.

The display 430 may be a type in which one switch 540 is provided to each pixel. The display 430 may be an active matrix organic light emitting diode (AMOLED) display. The electronic device 400 may individually control whether each pixel emits light, by using each switch 540. The display 430 may be a passive matrix organic light emitting diodes (PMOLED). Accordingly, the structures of the first electrode 510, the second electrode 520, the organic layer 530, and the switch 540 may vary.

The first electrode 510 may be disposed on a second virtual surface 4304 between the second electrode bottom surface 5202 and the display bottom surface 4302. The first electrode 510 may be in a shape in accordance with at least a part of the second virtual surface 4304. For example, the at least part of the second virtual surface 4304 may be a plane extending in the third direction 4005, and the first electrode 510 may be a flat plate extending along the at least part of the second virtual surface 4304. The at least part of the second virtual surface 4304 may be an inclined surface or a curved surface, and the first electrode 510 may be a curved plate or an inclined plate extending along at least a part of the second virtual surface 4304. The first electrode 510 may have various shapes, such as a quadrangle and a circle, when viewed in the second direction 40021.

The size 5101 of the first electrode 510 extending in the third direction 4005 may be equal to the size of the organic layer 530. When viewed in the second direction 40021, the organic layer 530 may have a size capable of covering the first electrode 510. The size 5101 of the first electrode 510 extending in the third direction 4005 may be designed to be smaller or larger than the organic layer 530.

The source electrode 541 and/or the drain electrode 542 are disposed on a third virtual surface 4305 between the second virtual surface 4304 and the display bottom surface 4302. The source electrode 520 and/or the second electrode 542 may be in a shape in accordance with at least a part of the third virtual surface 4305. For example, the at least part of the third virtual surface 4305 may be a plane extending generally in the third direction 4005, and the source electrode 541 and/or the drain electrode 542 may be a flat plate extending along the at least part of the third virtual surface 4305. The at least part of the third virtual surface 4305 may be an inclined surface or a curved surface, and the source electrode 541 and/or the drain electrode 542 may be a curved plate or an inclined plate extending along the at least part of the third virtual surface 4305.

The gate electrode 543 is disposed on a fourth virtual surface 4306 between the second virtual surface 4304 and the display bottom surface 4302. The fourth virtual surface 4306 is located between the third virtual surface 4305 and the display bottom surface 4302. The gate electrode 543 may be in a shape that conforms to at least a part of the fourth virtual surface 4306. For example, the at least part of the fourth virtual surface 4306 may be a plane extending generally in the third direction 4005, and the gate electrode 543 may be a flat plate extending along the at least part of the fourth virtual surface 4306. The at least a part of the fourth virtual surface 4306 may be an inclined or curved surface, and the gate electrode 543 may be an inclined or curved plate extending along the at least part of the fourth virtual surface 4306.

The semiconductor layer 544 is disposed between the second virtual surface 4304 and the display bottom surface 4302. For example, the semiconductor layer 544 is disposed between on a fifth virtual surface 4307 between the fourth virtual surface 4306 and the display lower surface 4302.

The semiconductor layer 544 may be in a shape in accordance with at least a part of the fifth virtual surface 4307. For example, the at least part of the fifth virtual surface 4307 may be a plane extending generally in the third direction 4005, and the semiconductor layer 544 may be a flat plate extending along the at least part of the fifth virtual surface 4307. The at least part of the fifth virtual surface 4307 may be an inclined surface or a curved surface, and the semiconductor layer 544 may be an inclined layer or a curved layer extending along the at least part of the fifth virtual surface 4307.

The semiconductor layer 544 is disposed between the fourth virtual surface 4306 and the fifth virtual surface 4307.

The display 430 may include at least one insulating layer disposed between the first virtual surface 4303 and the fifth virtual surface 4307. The at least one insulating layer may include a variety of insulating materials and may prevent leakage of current between elements.

The display 430 includes a first insulating layer 571 disposed between the first virtual surface 4303 and the second virtual surface 4304. The first insulating layer 571 may be formed between a plurality of pixel layers. For example, the insulating layer 571 may be in a form in which spaces between the plurality of pixel layers are filled with an insulating material. The plurality of pixel layers may be insulated from each other by the insulating layer 571. At least a part of the first insulating layer 571 may include a light-transmissive material.

The display 430 includes a second insulating layer 572 disposed between the second virtual surface 4304 and the third virtual surface 4305. The second insulating layer 572 may be in a form in which spaces between the second virtual surface 4304 and the third virtual surface 4305 are filled with an insulating material.

The display 430 includes a third insulating layer 573 disposed between the third virtual surface 4305 and the fourth virtual surface 4306. The third insulating layer 573 may be in a form in which space between the third virtual surface 4305 and the fourth virtual surface 4306 is filled with an insulating material.

The display 430 includes a fourth insulating layer 574 disposed between the fourth virtual surface 4306 and the fifth virtual surface 4307. The fourth insulating layer 574 may be in a form in which the fourth virtual surface 4306 and the fifth virtual surface 4307 is filled with an insulating material.

At least one of the second insulating layer 572, the third insulating layer 573, and the fourth insulating layer 574 may prevent current leakage from the gate electrode 543 to the source electrode 541 and/or the drain electrode 542.

As illustrated, the first electrode 510 is electrically connected to the drain electrode 542. The first electrode 510 includes an extension unit 511 extending to the drain electrode 542, and the first electrode 510 is electrically connected with the drain electrode 542 through the extension unit 511. The extension unit 511 may be designed in various forms of passing through the second insulation layer 572. The first electrode 510 may be electrically connected to the source electrode 541, instead of the drain electrode 542. At least a part of the third insulating layer 573 may include a light-transmissive material.

The source electrode 541 is electrically connected to the semiconductor layer 544. The source electrode 541 includes an extension unit 5411 extending to the semiconductor layer 544, and the source electrode 541 is electrically connected with the semiconductor layer 544 through the extension unit 5411. The extension unit 5411 may be designed in various forms of passing through the third insulation layer 573 and the fourth insulation layer 574.

The drain electrode 542 is electrically connected to the semiconductor layer 544. The drain electrode 542 includes an extension unit 5421 extending to the semiconductor layer 544, and the drain electrode 542 is electrically connected with the semiconductor layer 544 through the extension unit 5421. The extension unit 5421 may be designed in various forms of passing through the third insulation layer 573 and the fourth insulation layer 574.

When viewed in the cross section, the gate electrode 543 is disposed between the extension unit 5411 of the source electrode 541 and the extension unit 5421 of the drain electrode 542.

The display 430 includes a first substrate 581 that forms the display bottom surface 4302. The first substrate 581 may be formed of plastic, metal, carbon fiber, other fiber composites, ceramics, glass, or a combination thereof. At least a part of the first substrate 581 may include a light-transmissive material.

The display 430 includes a buffer layer 591 disposed between the first substrate 581 and the semiconductor layer 544. The fifth virtual surface 4307 and a semiconductor layer 544 are formed by the buffer layer 591. The buffer layer 591 may be formed of plastic, metal, carbon fiber, other fiber composites, ceramics, glass, or a combination thereof. The buffer layer 591 may be formed of silicon oxide or silicon nitride. At least a part of the buffer layer 591 may include a light-transmissive material.

The display 430 includes a protection layer 592 disposed between the buffer layer 591 and the first substrate 581. The protection layer 592 may be formed of plastic, metal, carbon fiber, other fiber composites, ceramics, glass, or a combination thereof. At least a part of the protection layer 592 may include a light-transmissive material.

The display 430 includes a second substrate 582 disposed on the second electrode 520. The second substrate 582 may form the display top surface 4301. The second substrate 582 may be plastic, metal, carbon fiber, other fiber composites, ceramics, glass, or a combination thereof. At least a part of the second substrate 582 may include a light-transmissive material.

At least a part of the display 430 may be curved. In FIG. 4A, when the edge part of the first cover 410-1 is curved shape, at least one pixel layer 5300 included in an edge area of the display 430 and at least a part of the second electrode 520 may also be in a curved form.

A part 4421 of light output from the light emitting unit 442 of the at least one light sensor 440 may be emitted to the outside through the display 430. The part 4422 of light output from the light emitting unit 442 of the at least one light sensor 440 may travel toward at least a part of the switch 540. A part 4423 of the light output from the light emitting unit 442 of the at least one light sensor 440 may travel toward at least a part of the pixel layer 5300.

The display 430 may include at least one element (hereinafter, a light blocking element) for blocking light, output from the light emitting unit 442 of the at least one light sensor 440, from entering at least a part of the switch 540. The light blocking element may reduce the electrical influence of light (or light energy) output from the light emitting unit 442 on the display 430. For example, at least a part of the switch 540 is blocked from being excited (or electron-excited) by the light output from the light-emitting unit 442, so that current is not leaked to the at least part of the switch 540 (e.g., the semiconductor layer 544). When no light blocking element is provided, current may be leaked to the at least part of the switch 540 by the light output from the light emitting unit 442, whereby light may be generated in the pixel layer 5300.

The at least one light blocking element may be designed to prevent light output from the light emitting unit 442 from being transferred to the semiconductor layer 544 of the switch 540. When viewed in the cross section, the semiconductor layer includes a semiconductor top surface 5441 facing the first direction 40011, a semiconductor bottom surface 5442 facing the second direction 40021, and semiconductor side surfaces 5443 and 5444 that face the third direction 4005. At least one light blocking element may cover the semiconductor bottom surface 5442, the semiconductor side surfaces 5443, and/or the semiconductor top surface 5441.

FIGS. 6A, 6B, 6C and 6D are diagrams for describing a structure of the light blocking element, according to embodiments of the present disclosure.

Figure 6A:
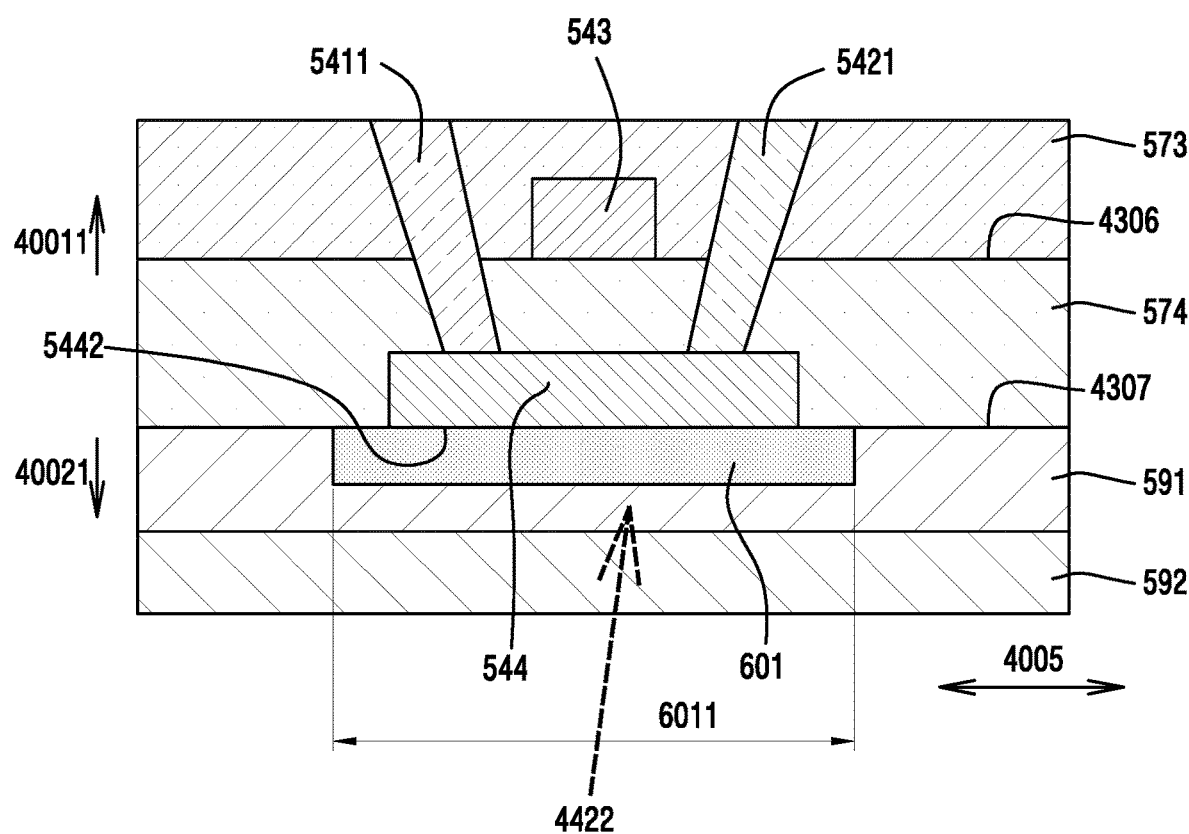
FIGS. 6A, 6B, 6C, and 6D are diagrams for describing a light blocking element, according to embodiments of the present disclosure.
Figure 6B:
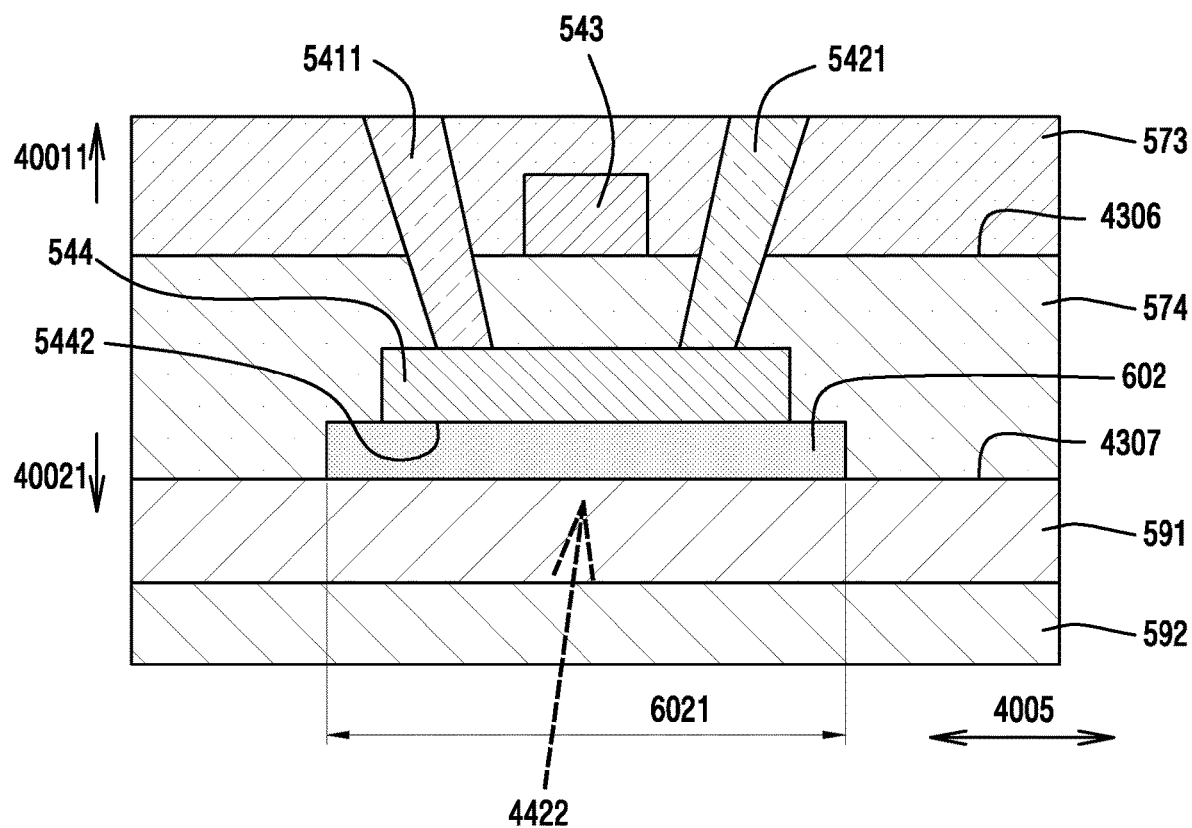
Figure 6C:
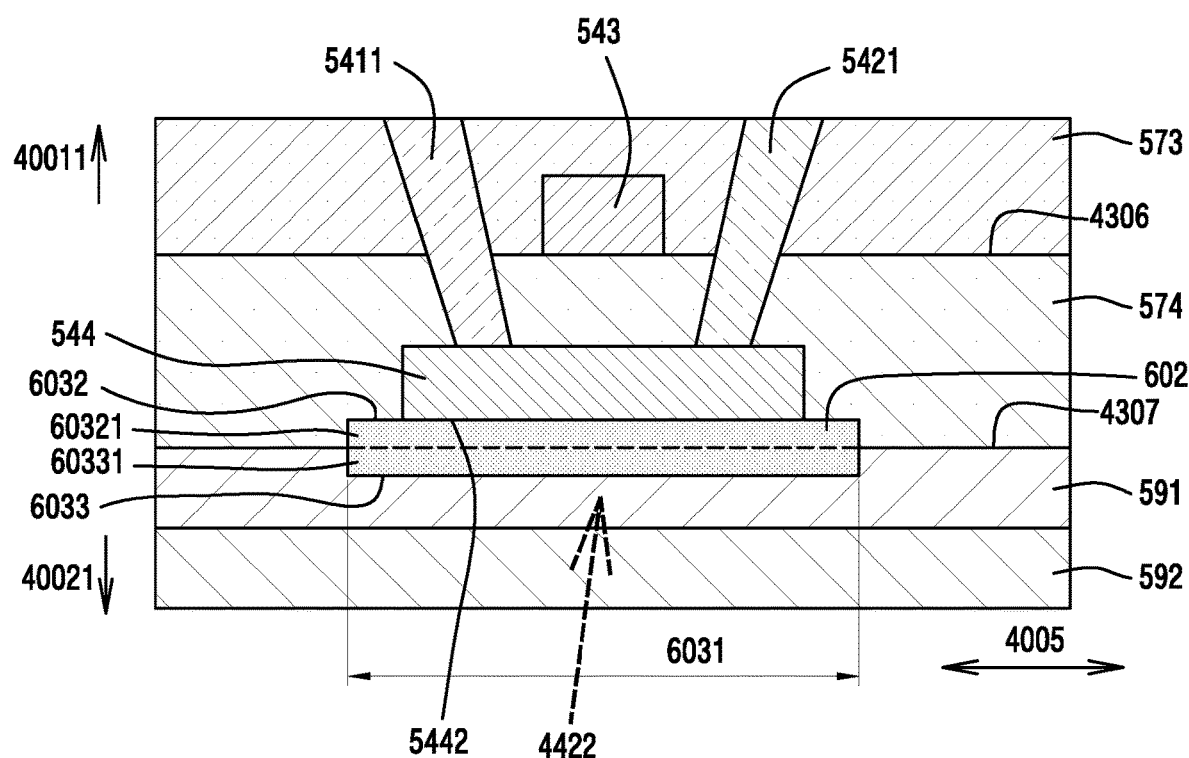
Figure 7:
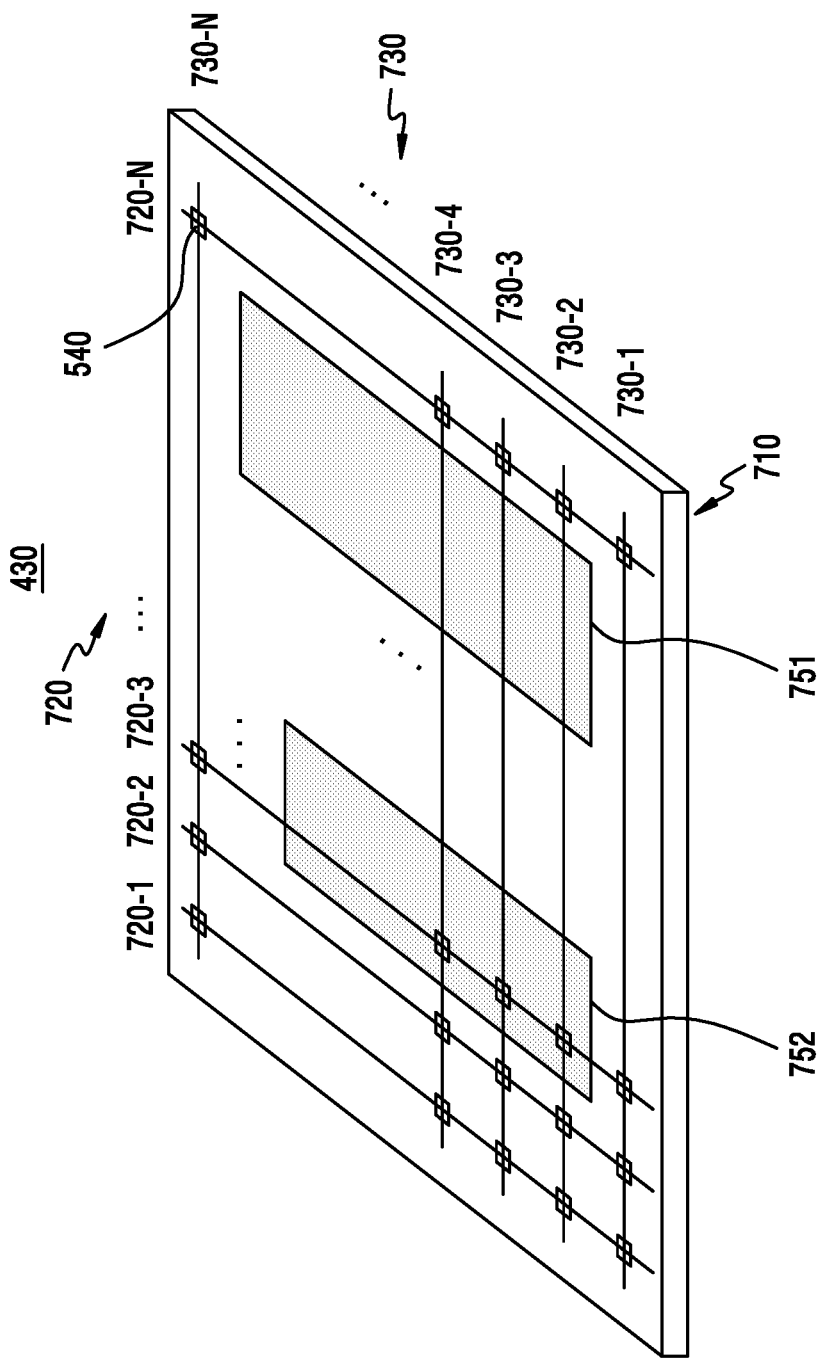
FIG. 7 is a display including the light blocking element, according to an embodiment of the present disclosure.

Referring to FIGS. 6A, 6B and 6C, when viewed in the cross section, at least one light blocking element is a layer extending in the third direction 4005 to cover the semiconductor bottom surface 5442 of the semiconductor layer 544.

In FIG. 6A, a light blocking layer 601 is disposed between the fifth virtual surface 4307 and the protection layer 592. The fifth virtual surface 4307 may be a plane extending in the third direction 4005, and the light blocking layer 601 may form a part of the fifth virtual surface 4307. The semiconductor layer 544 is disposed on the light blocking layer 601. When viewed in the first direction 40011, the light blocking layer 601 is formed to have a size 6011 corresponding to the third direction 4005 such that the semiconductor layer 544 is covered. The light blocking layer 601 may block light 4422, that is output from the light emitting unit 442 of the at least one light sensor 440, from entering the semiconductor bottom surface 5442 of the semiconductor layer 544.

The fourth insulating layer 574 is formed between the fourth virtual surface 4306 and the fifth virtual surface 4307 in such a manner that a space except for the extension unit 5411 of the source electrode 541, the extension unit 5421 of the drain electrode 542, and the semiconductor layer 544 is filled with a material. The buffer layer 591 may be formed between the fifth virtual surface 4307 and the protection layer 592 in such a manner that a space except for the light blocking layer 601 is filled with a material. The buffer layer 591 may be designed to be an element that includes the light blocking layer 601.

In FIG. 6B, a light blocking layer 602 is disposed between the semiconductor layer 544 and the fifth virtual surface 4307. The light blocking layer 602 may be disposed on the fifth virtual surface 4307, and the semiconductor layer 544 may be disposed on the light blocking layer 602. The fifth virtual surface 4307 may be a plane extending in the third direction 4005. When viewed in the first direction 40011, the light blocking layer 602 is formed to have a size 6021 corresponding to the third direction 4005 such that the semiconductor layer 544 is covered. The light blocking layer 602 may block light 4422, that is output from the light emitting unit 442 of the at least one light sensor 440, from entering the semiconductor bottom surface 5442 of the semiconductor layer 544.

The fourth insulating layer 574 is formed between the fourth virtual surface 4306 and the fifth virtual surface 4307 in such a manner that a space except for the extension unit 5411 of the source electrode 541, the extension unit 5421 of the drain electrode 542, the semiconductor layer 544, and the light blocking layer 602, is filled with a material. The fourth insulating layer 574 may be an element that includes the light blocking layer 601.

In FIG. 6C, a light blocking layer 603 includes a layer top surface 6032 facing the first direction 40011 and a layer bottom surface 6033 facing the second direction 40021. When viewed in the first direction 40011, the light blocking layer 603 is formed to have a size 6031 corresponding to the third direction 4005 such that the semiconductor layer 544 is covered. When viewed in the cross section, the fifth virtual surface 4307 is disposed between the layer top surface 6032 and the layer bottom surface 6033. The light blocking layer 603 may include a layer top area 60321 formed between the layer top surface 6032 and the fifth virtual surface 4307, and a layer bottom area 60331 formed between the fifth virtual surface 4307 and the layer bottom surface 6033. The light blocking layer 603 may block the light 4422, that is output from the light emitting unit 442 of the at least one light sensor 440, from entering the semiconductor bottom surface 5442 of the semiconductor layer 544.

The fourth insulating layer 574 is formed between the fourth virtual surface 4306 and the fifth virtual surface 4307 in such a manner that a space except for the extension unit 5411 of the source electrode 541, the extension unit 5421 of the drain electrode 542, the semiconductor layer 544, and the layer top area 60321 of the light blocking layer 603, is filled with a material. The buffer layer 591 is formed between the fifth virtual surface 4307 and the protection layer 592 in such a manner that a space except for a layer bottom area 60422 of the light blocking layer 603 is filled with a material.

Figure 6D:
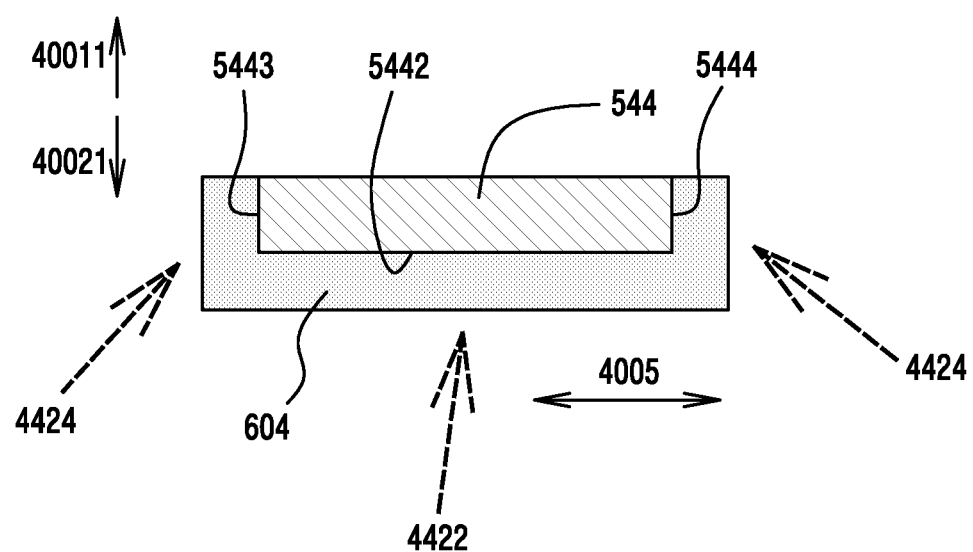

Referring to FIG. 6D, when viewed in the cross-section, at least one light blocking element is a layer 604 extended to cover not only the semiconductor bottom surface 5442 of the semiconductor layer 544 but also the semiconductor side surfaces 5443 and 5444. A light blocking layer 604 may block the light 4422, that is output from the light emitting unit 442 of the at least one light sensor 440, from entering the semiconductor bottom surface 5442 of the semiconductor layer 544. The light blocking layer 604 may block the light 4424, that is output from the light emitting portion 442 of at least one light sensor 440, from entering the semiconductor side surfaces 5443 and 5444 of the semiconductor layer 544.

In order to block light, output from the light emitting unit 442, from entering at least a part (e.g., the semiconductor layer 544) of the switch 540, at least one light blocking element may be installed at various other positions. For example, at least one light blocking element may be disposed between the buffer layer 591 and the protection layer 592. In another example, at least one light blocking element may be disposed between the protection layer 592 and the first substrate 581. In yet another example, at least one light blocking element may be disposed below the first substrate 581 and between the first substrate 581 and the light emitting unit 442.

At least one light blocking element may be included in at least one among the fourth insulating layer 574, the buffer layer 591, the protection layer 592, or the first substrate 581. The buffer layer 591 may include the light blocking layer that covers the semiconductor bottom surface 5442 of the semiconductor layer 544.

The display 430 may include at least one light blocking element for blocking the light 4423, that is output from the light emitting unit 442 of at least one light sensor 440, from entering at least a part of the pixel layer 5300. The light blocking element may reduce the electrical influence of light (or light energy) output from the light emitting unit 442 on the display 430. The at least one light blocking element may be one or more layers disposed between the pixel layer 5300 and the light emitting unit 442.

FIG. 7 is a display including a light blocking element, according to an embodiment of the present disclosure.

Referring to FIG. 7, the display 430 includes a substrate 710, a plurality of gate lines 720 and a plurality of data lines 730, which are installed on the substrate 710. The plurality of gate lines 720 may be arranged in the x-axis direction, and the plurality of data lines may be arranged in the y-axis direction.

Referring to FIG. 5, the substrate 710 includes layers between the third virtual surface 4305 and the display bottom surface 4302 in the display 430. The plurality of gate lines 720 may transfer a scan signal or a gate signal. The display 430 includes the switch 540 installed at a position 723 where the plurality of gate lines 720 and the plurality of data lines 730 intersect. The display 430 includes elements between the third virtual surface 4305 and the display top surface 4301.

Agate electrode 543 of the switch 540 is electrically connected with agate line 720-N. A source electrode 541 of the switch 540 is electrically connected with a data line 730-N, and the drain electrode 542 of the switch 540 may be electrically connected with a first electrode 510. The source electrode 541 or the drain electrode 542 of switch 540 is electrically connected with the data line of the first electrode 510.

The display 430 includes a light emission transmissive area 752 through which light emitted from the light emitting unit of the at least one light sensor 440 (e.g., 442 in FIG. 5) is emitted to the outside. The display 430 includes a light reception transmissive area 751 through which external light passes when entering a light receiving unit 441 of the at least one light sensor 440. The display 430 may include a light blocking element (e.g., 601 in FIG. 6A, 602 in FIG. 6B, 603 in FIG. 6C, or 604 in FIG. 6D) which blocks light, output from the light emitting unit 442, from entering the semiconductor layer 544 of the switch 540 installed in the light emission transmissive area 752. The light emission transmissive area 752 or the light reception transmissive area 751 are not limited to a rectangular area, as illustrated in drawings, but may have, various shapes or ranges based on at least one light sensor 440.

The size or shape of the light reception transmissive area 751 may be the same as or different from that of the light emission transmissive area 752.

The light reception transmissive area 751 may be separated from the light emission transmissive area 752. Referring to FIG. 4A, the first edge area 415-11 adjacent to the first edge 415-1 includes a first light transmissive area 451 at a position arranged vertically to the light reception transmissive area 751. The first edge area 415-11 adjacent to the first edge 415-1 includes a second light transmissive area 452 at a position arranged vertically to the light emission transmissive area 752 of the display 430. Light output from the light emitting unit 442 may be emitted to the outside through the light emission transmissive area 752 of the display 430 and the second light transmissive area 452 of the first surface 4001. Light from the outside may enter the light receiving unit 441 through the first light transmissive area 451 of the first surface 4001 and the light reception transmissive area 751 of the display 430.

The light reception transmissive area 751 may be designed to overlap at least a part of the light emission transmissive area 752. The first surface 4001 may include a first transmissive area arranged vertically with respect to the light reception transmissive area 751 of the display 430 and a second transmissive area arranged vertically with respect to the light emission transmissive area 752 of the display 430. The first transmissive area of the first surface 4001 may overlap at least a part of the second transmissive area. The light from the light emitting unit 442 may be emitted to the outside, and the external light may enter the light receiving unit 441 through the overlapping area of the light reception transmissive area 751 and the light emission transmissive area 752 of the display 430. The light from the light emitting unit 442 may be emitted to the outside, and the external light may enter the light receiving unit 441 through the overlapping area of the first transmissive area and the second transmissive area of the first surface 4001.

The electronic device 400 may include various types of components using the bezel 410-3. Referring to FIGS. 4A and 4B, the bezel 410-3 (e.g., the second metal frame 410-32) may include a plurality of through-holes 4191 for supporting a speaker. Sound from the speaker, mounted inside the housing 410, may be emitted to the outside through the plurality of through-holes 4191. The bezel 410-3 may include a through-hole 4193 for supporting a microphone. Sound from the outside may be transferred to the microphone, mounted inside the housing 410, through the through-hole 4193. The bezel 410-3 may include a through-hole 4192 for supporting a connector of an external device. The connector of the external device may be connected to a connector, mounted inside the housing 410, through the through-hole 4192. The bezel 410-3 (e.g., the third metal frame 410-33 or the fourth metal frame 410-34) may include a through-hole to support the button 4397.

The electronic device 400 may include various buttons installed in the through-holes formed on the first surface 4001. When a button is pressed in the second direction 40021, an electrical signal may be generated from a component (e.g., a switch) functionally connected to the button.

When viewed in the second direction 40021, the electronic device 400 includes a hardware home button disposed near the second edge 415-2. When viewed in the second direction 40021, there is a space between the second edge 415-2 and the display 430, and a hardware home button may be installed in this space. The display 430 may not extend to the second edge area 415-21 of the first surface 4001. The first cover 410-1 may include a through-hole formed in the second edge area 415-21. The through-hole may be formed at a position in alignment with the hardware home button. The hardware home button may be coupled to the through-hole, and the top of the hardware home button may be exposed to the outside.

When the display 430 extends to the second edge area 415-21, the electronic device 400 may display a software home button 417 that replaces the hardware home button on the screen. The electronic device 400 may display the software home button 417 in the second edge area 415-21. When the software home button 417 is selected by a touch input or a hovering input, the electronic device 400 may display a main home screen. The main home screen may be a first screen displayed on the display 430 when the electronic device 400 is turned on. When a plurality of home screens are provided in a switchable page form, the main home screen may be a first home screen among the plurality of home screens. The home screen may display icons, time or date, for executing applications. The home screen may display a state of the electronic device 400, such as a battery charge state, a received signal strength, or current time. When the software home button 417 is selected by a touch input or a hovering input, the electronic device 400 may enter asleep mode or a low power mode. In the sleep mode or the low power mode, the electronic device 400 may only perform set basic operations, such as periodically listening to an external radio signal. In the sleep mode or low power mode, the electronic device 400 may include an operation of deactivating at least one element (e.g., the display 430). The sleep mode or low power mode may include an operation of deactivating at least a part of a processor (e.g., processor 120 in FIG. 1 or processor 210 in FIG. 2). When the software home button 417 is selected by a touch input or a hovering input, the electronic device 400 may be switched from the sleep or lower power mode to a wake-up mode. In the wake-up mode, the electronic device 400 may activate the display 430.

The electronic device 400 may display an indicator that indicates various states of the electronic device 400 on the screen. The display position of the indicator may differ. When the screen is designed to extend to the first edge area 415-11, the electronic device 400 may display the indicator in the first edge area 415-11. When the remaining battery power is insufficient, the electronic device 400 may display the indicator. The electronic device 400 may display the indicator only when the screen is turned off. When the electronic device 400 is connected to a wired or wireless charger, the electronic device 400 may display the indicator. The electronic device 400 may display the indicator in various forms or colors, depending on various states of the electronic device 400.

The electronic device 400 may include a receiver for outputting a sound that is a voice signal received from a counterpart device during a call. When viewed in the second direction 40021, there is a space between the first edge 415-1 and the display 430, and the receiver may be installed in this space. The display 430 may be designed not to extend to the first edge area 415-11 of the first surface 4001. The first cover 410-1 may include a through-hole formed in the first edge area 415-11 of the first surface 4001. The through-hole may be formed at a position in alignment with the receiver. Sound from the receiver may be emitted through the through-hole formed in the first edge area 415-11.

When the display 430 is designed to extend to the first edge area 415-11, an installation structure of the receiver may be altered. A hole for emitting sound from the receiver may be formed in the first metal frame 410-31 and may be in alignment with the hole in the first metal frame 410-31. The first metal frame 410-31 may include a groove formed in a part adjacent to the first edge 415-1 of the first cover 410-1. When the first cover 410-1 and the first metal frame 410-31 are coupled, the groove may be a hole for the receiver. The display 430 may be disposed between the first cover 410-1 and the receiver.

When the display 430 is designed to extend to the first edge area 415-11, a bone conduction-type receiver may be mounted on the electronic device 400. When a bone conduction-type receiver is installed, the hole for emitting sound from the receiver may be omitted.

The electronic device 400 may include a front camera. For example, when viewed in the second direction 40021, there is a space between the first edge 415-1 and the display 430, and the front camera may be installed in this space. The display 430 may be designed not to extend to the first edge area 415-11 of the first surface 4001. The first cover 410-1 may include a light transmissive area formed in the first edge area 415-11 of the first surface 4001. The light transmissive area may be formed at a position in alignment with the front camera. The external light may enter the front camera through the light transmissive area of the first edge area 415-11 and the front camera may capture an image.

When the display 430 (or screen) is designed to extend to the first edge area 415-11, the position of the front camera may be changed. The display 430 may be designed not to extend to the second edge area 415-21, and the front camera may be installed in alignment with the light emission transmissive area formed in the second edge area 415-21.

The electronic device 400 may include a rear camera 4291. The second cover 410-2 may include a through-hole. The through hole may be formed at position in alignment with the rear camera 4291. The rear camera 4291 may be coupled to the through-hole of the second cover 410-2. The electronic device 400 may include a flash 4292 disposed near the rear camera 4291 and coupled to another through-hole of the second cover 410-2.

The electronic device 400 may be designed to include various other components that are not shown.

FIGS. 8A, 8B, 8C, 8D, 8E, and 8F are diagrams for describing a production flow for molding the light blocking element, according to embodiments of the present disclosure.

Figure 8A:
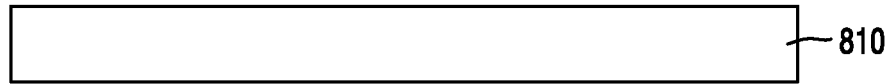
FIGS. 8A, 8B, 8C, 8D, 8E, and 8F are diagrams for describing a production flow for molding the light blocking element, according to embodiments of the present disclosure.
Figure 8B:
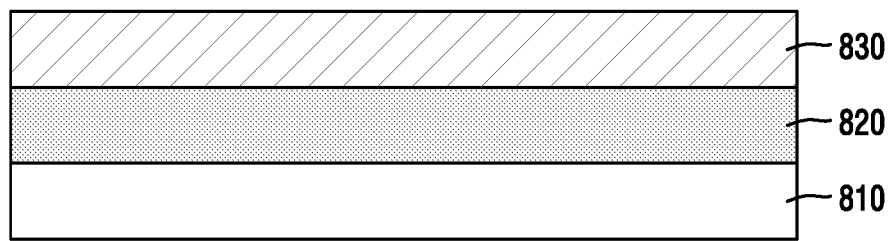

Referring to FIGS. 8A and 8B, a process is performed in which a light blocking layer 820 is deposited on a substrate 810. A buffer layer 830 is deposited on the light blocking layer 820. The light blocking layer 820 is disposed between the substrate 810 and the buffer layer 830. The light blocking layer 820 may include a light shielding material, such as metal.

Figure 8C:
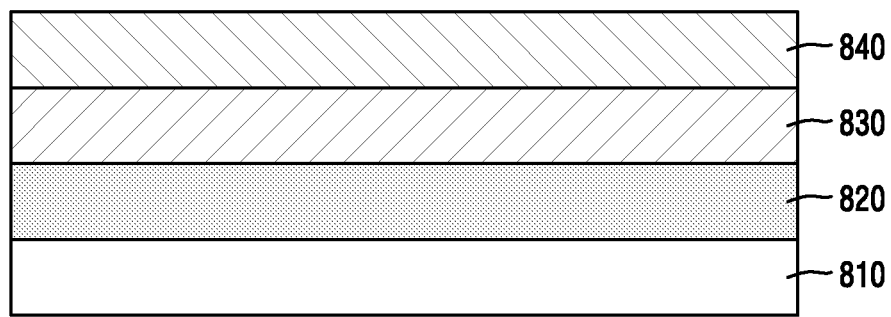

Referring to FIG. 8C, a process of depositing an a-Si layer 840 on the buffer layer 830 is performed. The a-Si layer 840 is coupled to the buffer layer 830 using plasma enhanced chemical vapor deposition (PECVD). The buffer layer 830 is disposed between the a-Si layer 840 and the light blocking layer 820.

Figure 8D:
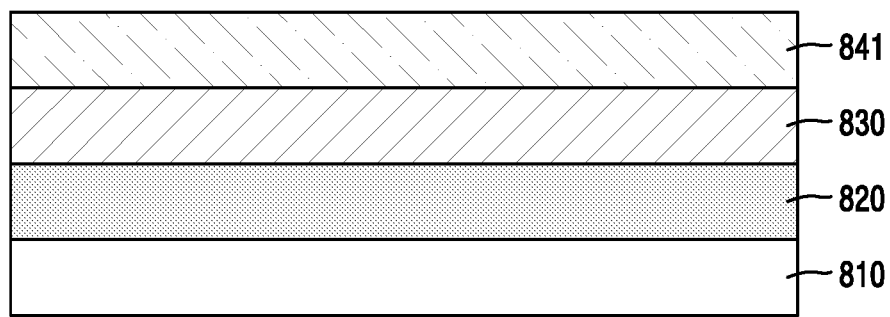

Referring to FIG. 8D, a process of dehydrogenating the a-Si layer 840 is performed. When the a-Si layer 840 is annealed to about 450 degrees, hydrogen included in the a-Si layer 840 is released into the air, and the dehydrogenated a-Si layer 841 is formed.

Figure 8E:
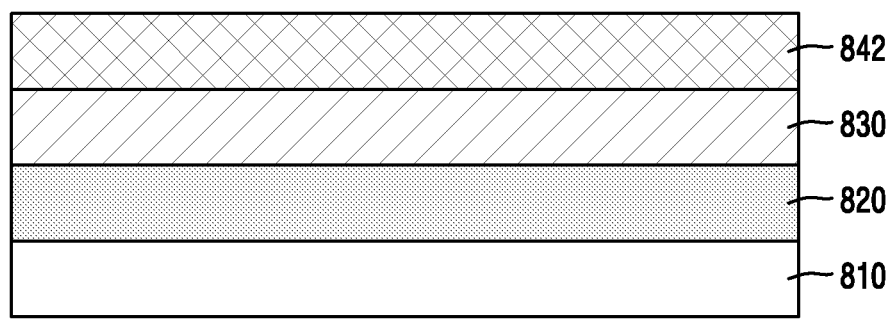

Referring to FIG. 8E, a process of crystallizing the dehydrogenated a-Si layer 841 is performed. A poly-Si layer 842 is formed through excimer laser annealing (ELA). The ELA may be a process of crystallizing the dehydrogenated a-Si layer 841 using a linear laser.

Figure 8F:
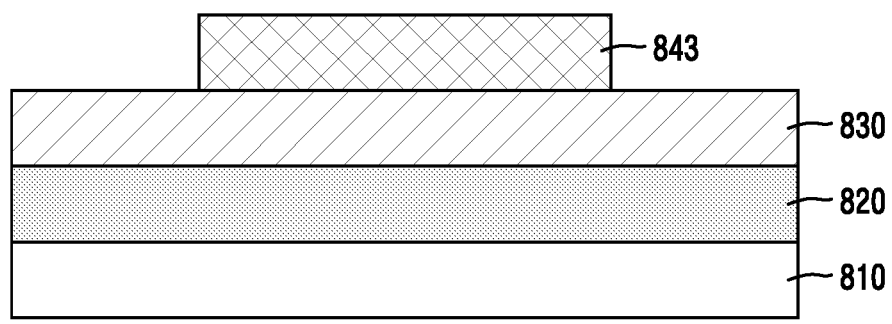

Referring to FIG. 8F, a process of patterning (or photolithography) the poly-Si layer 842 to form an active layer 843 (e.g., the semiconductor layer 544 in FIG. 5) is performed. The light blocking layer 820 may block light, output from the light emitting unit 442 of the light sensor, from entering the activation layer 843.

FIGS. 9A, 9B, 9C, 9D, 9E, 9F, 9G, and 9H are diagrams for describing a production flow for molding the light blocking element, according to embodiments of the present disclosure.

Figure 9A:
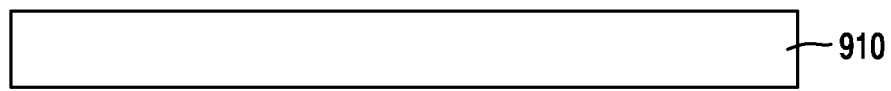
FIGS. 9A, 9B, 9C, 9D, 9E, 9F, 9G, and 9H are diagrams for describing a production flow for molding the light blocking element, according to embodiments of the present disclosure.
Figure 9B:
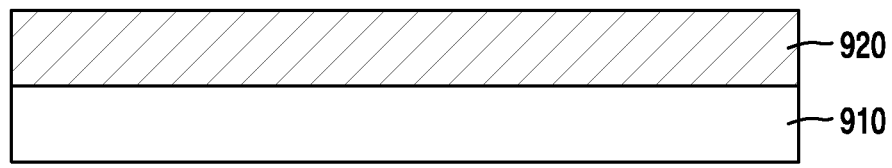

Referring to FIGS. 9A and 9B, a process in which a buffer layer 920 is deposited on a substrate 910 is performed.

Figure 9C:
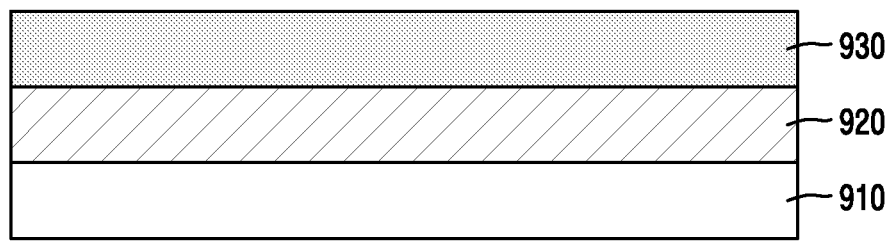

Referring to FIG. 9C, a process in which a light blocking layer 930 is deposited on the buffer layer 920 is performed. The buffer layer 920 is disposed between the substrate 910 and the first light blocking layer 930.

Figure 9D:
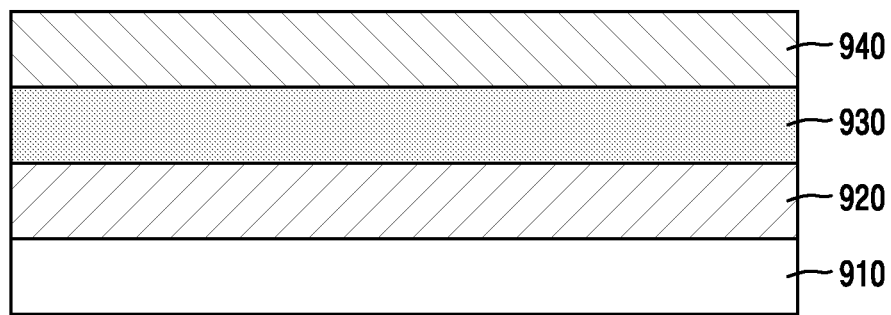

Referring to FIG. 9D, a process of depositing an a-Si layer 940 on the first light blocking layer 930 is performed. The a-Si layer 940 is coupled to the first light blocking layer 930 using PECVD. The first light blocking layer 930 is disposed between the buffer layer 920 and the a-Si layer 940.

Figure 9E:
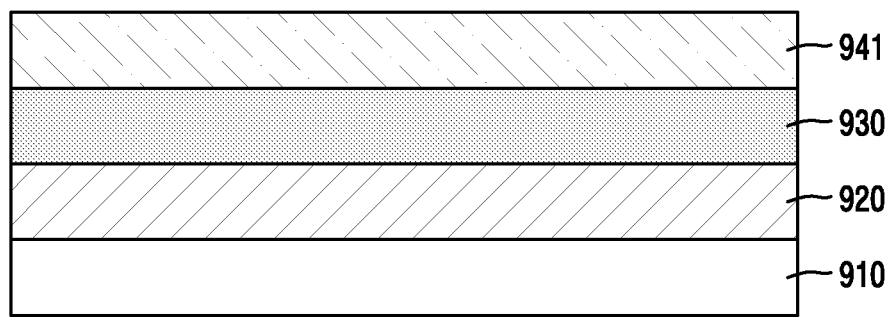

Referring to FIG. 9E, a process of dehydrogenating the a-Si layer 940 is performed. When the a-Si layer 940 is annealed to about 450 degrees, hydrogen included in the a-Si layer 940 may be released into the air, and a dehydrated a-Si layer 941 is formed.

Figure 9F:
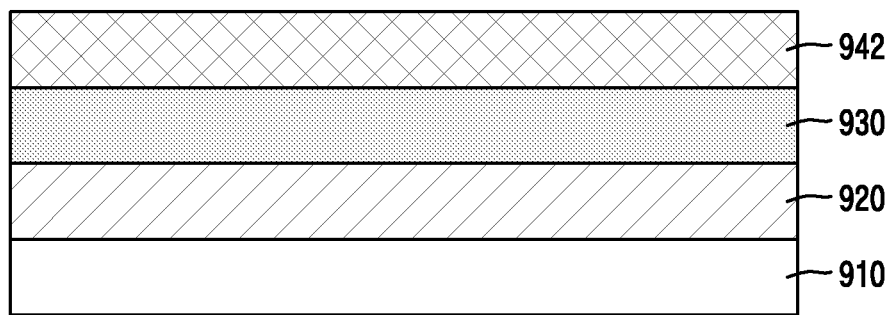

Referring to FIG. 9F, a process of crystallizing the dehydrogenated a-Si layer 941 is performed. The poly-Si layer 942 is formed through ELA. The ELA may be a process of crystallizing the dehydrogenated a-Si layer 941 using a linear laser.

Figure 9G:
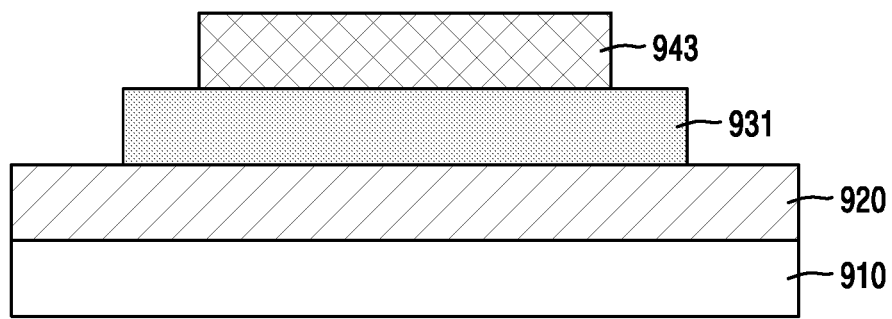

Referring to FIG. 9G, a process of patterning (or photolithography) the poly-Si layer 942 to form an activation layer 943 (e.g., the semiconductor layer 544 in FIG. 5) is performed. A process of patterning the first light blocking layer 930 is performed. The activation layer 943 includes a top surface 9431 in a first direction 9001 facing from the substrate 910 to the buffer layer 920. The activation layer 943 includes a bottom surface 9432 facing a second direction 9002 that is opposite the first direction 9001. When viewed in the first direction 9001, the patterned first light blocking layer 931 may cover the activation layer 943.

Figure 9H:
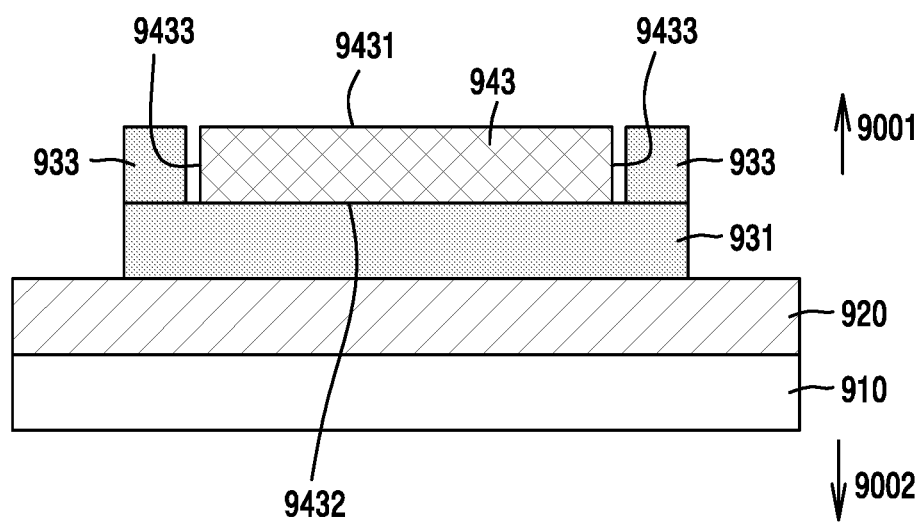

Referring to FIG. 9H, a process of forming a second light blocking layer 933 that surrounds a side surface 9433 of the activation layer 940 is performed. The second light blocking layer 933 is coupled to the patterned first light blocking layer 931. The second light blocking layer 933 may be formed through deposition and patterning.

The first light blocking layer 931 may block light, output from the light emitting unit 442 of the light sensor, from being transferred to the bottom surface 9432 of the activation layer 943. The second light blocking layer 933 may block the light, output from the light emitting unit of the light sensor 442, from being transferred to the side surface 9433 of the activation layer 943.

Figure 10:
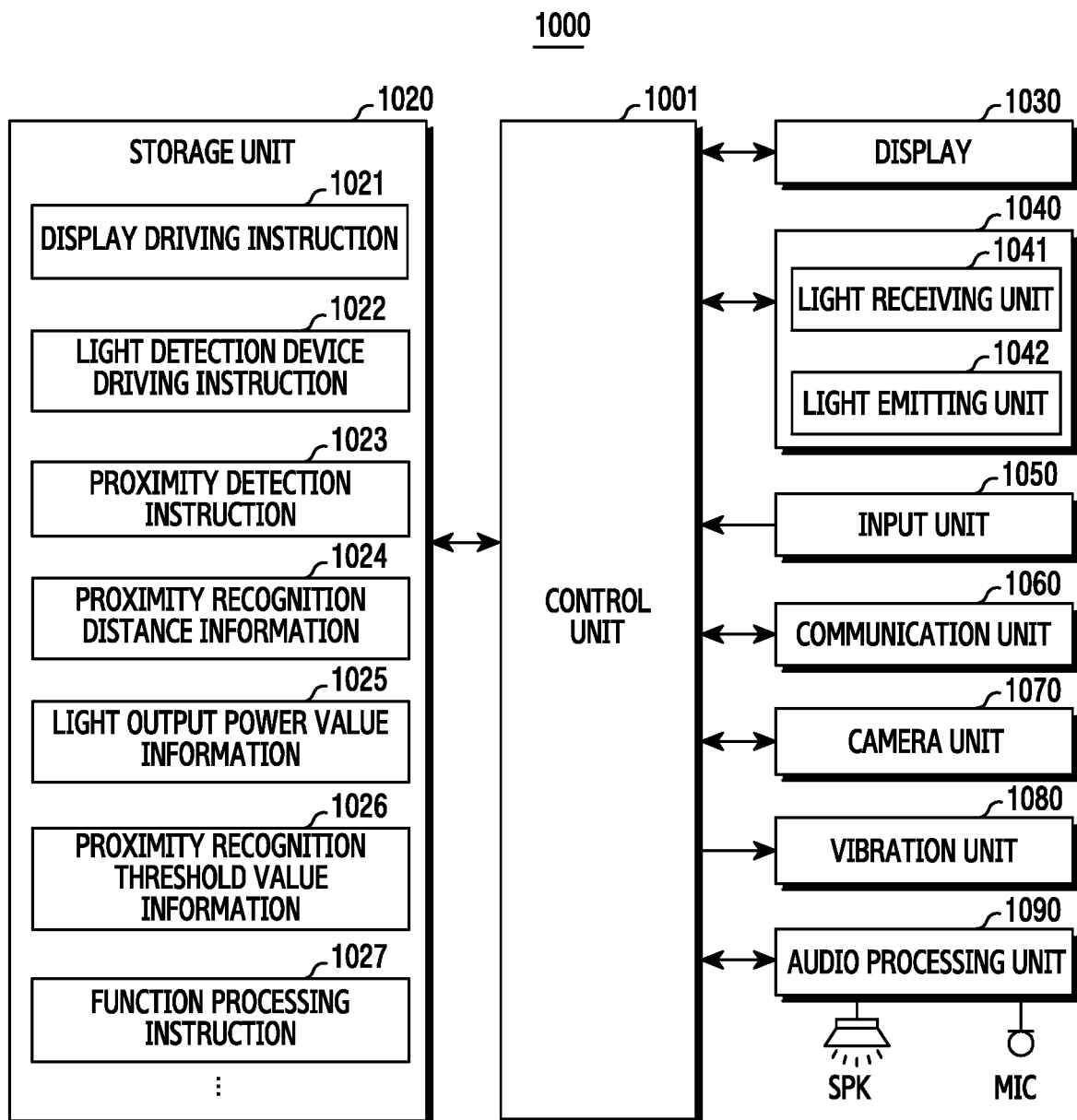
FIG. 10 is a block diagram of the electronic device that provides a light detection function, according to an embodiment of the present disclosure.

FIG. 10 is a block diagram of the electronic device that provides a light detection function, according to an embodiment of the present disclosure. An electronic device 1000 may include all or a part of the electronic device 101 of FIG. 1, the electronic device 201 of FIG. 2, or the electronic device 400 of FIG. 4A.

The electronic device 1000 includes a light detection device 1040 and a display 1030. The light detection device 1040 and the display 1030 include at least a part of the structure 500 of FIG. 5. For example, the light detection device 1040 may be positioned below or beneath the display 1030, as shown in FIG. 5. The light detection device 1040 may be disposed on at least a part of a rear side of the display 1030. At least a part of the display 1030 may be designed to be transmissive to light. The light detection device 1040 may include a light receiving unit 1041 and a light emitting unit 1042. The light receiving unit 1041 may receive light (or a light signal) scattered or reflected from an object, and generate an electrical signal (or a digital value) based on the received light. The light output from the light emitting unit 1042 may be emitted to the outside through the display 1030. The external light may pass through the display 1030 and enter the light receiving unit 1041.

The electronic device 1000 may include a light blocking element for reducing the electrical influence of light output from the light emitting unit 1042 on the display 1030. The light blocking element may be disposed inside the display 1030. As described with reference to FIGS. 5, 6A, 6B, 6C, and 6D, the light blocking element may block light, output from at least one light source of the light emitting unit 1042, from entering at least one switch for turning on/off at least one pixel of the display 1030. Since the light blocking element blocks light (or light energy), output from the light emitting unit 1042 of the light detection device 1040, from entering the display 1030, a malfunction (e.g., a spot) of the display 1030, due to the light output from the light emitting unit 1042 of the light detection device 1040, may be prevented.

In order to lower the visibility of a spot generated on the display 1030 by the light output from the light emitting unit 1042 of the light detection device 1040, the electronic device 1000 may control the light emitting unit 1042 of the light detection device 1040 and/or the display 1030. The electronic device 1000 may adjust the display 1030 to express an area of the display 1030, corresponding to the light emitting unit 1042 of the light detection device 1040, in a dark color (e.g., a black color). When an image is displayed on the display 1030, the electronic device 1000 may adjust the light emitting unit to output light of at least one wavelength band in an interval in which the pixel is turned off for a time in a frame. The electronic device 1000 may adjust the display 1030 to deactivate an area of the display 1030, corresponding to a position in alignment with at least one light source of the light emitting unit 1042 of the light detection device 1040. The electronic device 1000 may adjust the display 1030 to display a black color in an area of the display 1030, corresponding to a position in alignment with at least one light source of the light emitting unit 1042 of the light detection device 1040.

Electronic device 1000 may adjust a light output power level of at least one light source of light emitting unit 1042 to improve power consumption of the electronic device 1000. Electronic device 1000 may adjust the light output power level of the at least one light source of light emitting unit 1042 based on a selected, executed or activated, detection mode (e.g. proximity detection mode).

Referring to FIG. 10, the electronic device 1000 includes a storage unit 1020, a light detection device 1040, and a control unit 1001.

The storage unit 1020 may store data or application programs, and algorithms, that correspond to basic operating systems required for operating the electronic device 1000 and user functions. According to an embodiment, the control unit 1001 may be electrically connected to the storage 1020, and perform operations of the electronic device 1000 by using instructions and/or information included in the storage unit 1020.

The storage unit 1020 includes a display driving instruction 1021 and a light detection device driving instruction 1022.

The display driving instruction 1021 may include instructions for adjustment of the display 1030 when a screen is displayed.

The display driving instruction 1021 may include an activation routine of selectively activating at least one of a plurality of pixels of the display 1030. For example, the display 1030 may include an AMOLED display 430 that installs one switch 540 per pixel. According to the display driving instruction 1021, the control unit 1001 may control a switch 540 to adjust whether to activate a pixel. When the switch 540 is turned on, the pixel may emit light, which may be defined as "pixel-on". When the switch 540 is turned off, the pixel may not emit light, which may be defined as a "pixel-off".

The display 1030 may include a light emission transmissive area 752 through which light is emitted from the light emitting unit 1042 (e.g., 442 in FIG. 5) of the light detection device 1040 to the outside. The display driving instruction 1021 may include a pixel-off routine to cause one or more pixels included in the light emission transmissive area of the display 1030 to be in an off state. When the one or more pixels included in the light emission transmissive area are turned off, the light emission transmissive area may be expressed in a dark color (e.g., black color).

Light (or light energy) output from the light emitting unit 1042 may be applied to at least one pixel of the display 1030. The light output from light emitting unit 1042 may be applied to at least a part (e.g., the semiconductor layer 544 in FIG. 5) of the switch 540 included in at least one pixel of display 1030. When the light output from the light emitting unit 1042 is applied to the semiconductor layer 544 of at least one pixel, a malfunction may occur in which at least one pixel generates light. According to the display driving instruction 1021, since the light emission transmissive area is generally expressed in a black color due to turning-off of one or more pixels included in the light emission transmissive area, although at least one pixel included in the light emission transmissive area emits light from the light emitting unit 1042, the visibility thereof may be deteriorated.

Referring to the embodiments of FIGS. 6A, 6B, 6C and 6D, at least one light blocking element may block light, output from the light emitting unit 442 (e.g., 1042 in FIG. 8), from entering at least a part (e.g., the semiconductor layer 544) of the switch 540. Since the light output from the light emitting unit 1042 is blocked from entering the semiconductor layer 544 of the pixel, a malfunction (e.g., a spot) in which one or more pixels emit light due to the light output from the light emitting unit 1042 may be prevented. Although at least one light blocking element exists, the light emitted from the light emitting unit 1042 may be induced by a material in the display 1030 to enter the semiconductor layer 544 of at least one pixel, whereby a malfunction in which at least one pixel emits light may occur. According to the display driving instruction 1021, since the light emission transmissive area is generally expressed in a black color due to turning-off of one or more pixels included in the light emission transmissive area, although at least one pixel included in the light emission transmissive area emits light by the light output from the light emitting unit 842, the visibility thereof may be deteriorated.

The display driving instruction 1021 may include an expression routine in which one or more pixels included in the light emission transmissive area of the display 1030 are turned on to cause the light emission transmissive area to be expressed in a dark color (e.g., black color). Since the light emission transmissive area is generally displayed in black color due to activation of one or more pixels, although at least one pixel included in the light emission transmissive area emits light by the light output from the light emitting unit 1042, the visibility thereof may be deteriorated.

The display driving instruction 1021 may include a pixel activation/deactivation routine that causes a pixel to be turned off (or deactivated) for a part of time in a frame (or an image frame). The display driving instruction 1021 may include a pixel driving routine that turns off a pixel at a defined time ratio within a frame. The display 1030 may include an AMOLED display 430 that installs one switch 540 per pixel. The display driving instruction 1021 may include a pixel driving routine in which a pixel is turned on (activated) only for a predetermined time in the frame, and a pixel is turned off (deactivated) for the remaining time. When one or more pixels included in the light emission transmissive area 752 of the display 1030 are turned off for a time in a frame, the light emission transmissive area may be expressed in a generally black color as if a black image is inserted in a frame. The pixel drive routine may be an AMOLED impulsive drive (AID). The rate at which pixels are turned on within a frame may be defined as an "AID ratio". The higher the AID ratio, the brighter the brightness of the screen. The display driving instruction 1021 may further include a pixel output adjustment routine of adjusting a light emission intensity of a pixel to maintain the brightness of the screen when the AID ratio is changed.

The display driving instruction 1021 may include a frame per second (FPS) setting routine of setting a rate (e.g., FPS) to display data of one screen. The display drive instruction 821 may include the FPS setting routine that causes the FPS to be adjusted according to various factors, such as hardware performance, complexity of displayed graphics, user preferences (e.g., a reaction time felt by a user).

The light detection device driving instruction 1022 may include instructions that cause the control unit 1001 to adjust at least one element of the light detection device 1040.

The light detection device driving instruction 1022 may include the activation routine of selecting and activating at least a part of the light receiving unit 1041 of the light detection device 1040 based on the selected (or executed) detection mode. The light receiving unit 1041 may include a plurality of light detectors capable of detecting light in one or more wavelength bands. According to the light detection device driving instruction 1022, the control unit 1001 may select and activate at least one light detector corresponding to the detection mode among the plurality of light detectors. The control unit 1001 may select at least one of a plurality of detection modes at least partially based on execution of an application and/or a user input.

The light detection device driving instruction 1022 may include the activation routine of selecting and activating at least a part of the light emitting unit 1042 of the light detection device 1040 based on the selected or executed detection mode. The light emitting unit 1042 may include a plurality of light emitters capable of outputting light in one or more wavelength bands. According to the light detection device driving instruction 1022, the control unit 1001 may select and activate at least one light emitter corresponding to the detection mode among the plurality of light emitters.

According to the display driving instruction 1021, the control unit 1001 may set an interval in which light is emitted through a pixel within a frame, and an interval in which light is not emitted through a pixel. The light detection device driving instruction 1022 may include an activation adjustment routine to activate the light emitting unit 1042 of the light detection device 1040 in an interval in which pixels are turned off in the frame. For example, when one or more pixels included in the light emission transmissive area 752 of display 1030 are turned off for a time in the frame, the light emission transmissive area may be expressed in a generally black color as if a black image is inserted in the frame. Since the light emission transmissive area is expressed in a generally black color due to turning off of the pixel for the part of time in the frame, although at least one pixel included in the light emission transmissive area emits light due to the light output from the light emitting unit 1042 for the part of time in the frame, the visibility thereof may be deteriorated.

The storage unit 1020 may include instructions relating to various detection modes using the light detection device 1040. The storage unit 1020 may include an instruction that causes the control unit 1001 to select a detection mode based on application execution and/or a user input. The storage unit 1020 may include an instruction that causes the control unit 1001 to determine an output wavelength band of the light emitting unit 1042 based on the selected detection mode. The storage unit 1020 may include an instruction that causes the control unit 1001 to output light in the determined output wavelength band through the light emitting unit 1042. The storage unit 1020 may include instructions that cause the control unit 1001 to perform a series of operations of detecting at least a part of light scattered or reflected from the object through the light receiving unit 1041 and acquiring information relating to the detection mode based on a detection value.

The electronic device 1000 may display a plurality of icons on a screen. The plurality of icons may represent applications stored in the electronic device 1000. When an icon representing an object analysis application is detected by a user input (e.g., a touch input) among the plurality of icons, the control unit 1001 may perform the object analysis application. According to the executed object analysis application, the control unit 1001 may display a screen that provides a list (hereinafter, a detection function list) relating to various detection functions (a detection application or a detection application program). The detection function list may be displayed as various forms of GUI elements. When it is detected that at least one list entry in the detection function list is selected by a user input, the control unit 1001 may perform a detection function (or a detection mode) corresponding to the selected at least one list entry.

While an application is being executed, the control unit 1001 may select at least one detection mode corresponding to the executed application. The control unit 1001 may select the proximity detection mode or the like while a call application is executed. While the call application is being executed, the electronic device 1000 may be positioned and used near a user's head for a call. When an outgoing call is requested to a telephone number of an external device (e.g., 102 or 104 in FIG. 1) by a user input, the control unit 1001 may execute an application relating to an outgoing call (hereinafter, an outgaining call application). The electronic device 1000 may receive a call from the external device, and the control unit 1001 may execute an application relating to an incoming call (hereinafter, an incoming call application).

The control unit 1001 may determine an output wavelength band of the light emitting unit 1042 (or a light source) based on the selected detection mode. When the proximity detection mode is selected, the control unit 1001 may determine a wavelength band including a maximum sensitivity wavelength of 950 nm, as the output wavelength band of the light emitting unit 1042, according to the proximity detection mode.

The control unit 1001 may control the light emitting unit 1042 to output the light in the determined output wavelength band. The light emitting unit 1042 may be designed to selectively generate light of a corresponding wavelength band under the control of the control unit 1001.

The control unit 1001 may detect at least a part of the light scattered or reflected from the object through the light receiving unit 1041. In an object analysis mode (e.g., the iris recognition mode or the fingerprint recognition mode), light in a corresponding wavelength band, which is emitted from the light emitting unit 1042, may be transferred to a user's body in the vicinity (e.g., within 10 cm) of the electronic device 1000, and the light may be absorbed, scattered, or reflected by the user's body. The light (or light energy) scattered or reflected from the user's body may enter the light receiving unit 1041, and the light receiving unit 1041 may generate an electrical signal (or a detection value) relating to biometric information (e.g., skin moisture information, skin melanin information, or skin erythema information) based on the entered scattered or reflected light, and may transfer the generated electrical signal relating to biometric information to the control unit 1001.

The control unit 1001 may acquire information relating to the detection mode based on the detected value, through the light receiving unit 1041. In the proximity detection mode, the control unit 1001 may receive an electrical signal (or a detection value) from the light receiving unit 1041 and may analyze the received electrical signal so as to obtain information on whether the object is close. In the object analysis mode, the control unit 1001 may receive the detected value from the light receiving unit 1041, and analyze the received detected value so as to obtain information on the object.

The control unit 1001 may acquire information relating to the detection mode and may output the information to the display 1030, or the control unit 1001 may transmit the obtained information to another electronic device (e.g., external electronic devices 102, 104 or 106 in FIG. 1).

The storage unit 1020 includes a proximity detection instruction 1023, proximity recognition distance information 1024, light output power value information 1025, proximity recognition threshold value information 1026, and function a processing instruction 1027.

The proximity detection instruction 1023 may include instructions that cause the control unit 1001 to use and adjust at least a part of the light detection device 1040 so as to determine whether the object is proximate.

The proximity detection instruction 1023 may include an activation routine of selecting and activating at least a part of the light detection device 1040 used to obtain a value for proximity of an object.

The proximity detection instruction 1023 may include a selection routine of selecting a proximity recognition distance from the proximity recognition distance information 1024. The proximity recognition distance may be set based on application execution and/or a user input.

The proximity detection instruction 1023 may include a selection routine of selecting a light output power value (or an output intensity) for the selected proximity recognition distance from the light output power value information 1025. The light detection device driving instruction 1022 may include a light output routine of causing light to be output through the light emitting unit 1042 based on the selected light output power value.

The proximity detection instruction 1023 may include a selection routine of selecting, from the proximity recognition threshold value information 1026, a proximity recognition threshold value based on the selected proximity recognition distance and light output power value.

FIG. 22 is a table including the proximity recognition distance information 1024, the light output power value information 1025 (or output intensity information), and the proximity recognition threshold value information 1026.

Referring to FIG. 22, the light output power value (or output intensity) and the proximity recognition threshold value may be set according to the proximity recognition distance. When a proximity recognition distance of 60 mm is selected and a light output power value of 200 mA is selected, the control unit 1001 may select a digital value of 4304 as the proximity recognition threshold value. When a proximity recognition distance of 60 mm is selected and a light output power value of 100 mmA is selected, the control unit 1001 may select a digital value of 3200 as the proximity recognition threshold value.

The proximity detection instruction 1023 may include an acquisition routine of acquiring a detection value generated by the activated light detection device 1040, according to the light detection device driving instruction 1022. The control unit 1001 may detect, by the light receiving unit 1041, at least a part of the light scattered or reflected from the object.

The proximity detection instruction 1023 may include a proximity determination routine of comparing a detection value detected by the light receiving unit 1041 with a selected proximity recognition detection threshold value, and determining whether the object is inside or outside the proximity recognition distance, according to a result of the comparison.

The proximity detection instruction 1023 may include an output intensity adjustment routine of, when a proximity of an object is recognized using the light detection device 1040 based on a first light output power value of the selected proximity recognition distance, selecting a second light output power value, instead of the first light output power value, for the selected proximity recognition distance. The second light output power value may be smaller than the first light output power value. For example, referring to FIG. 22, when proximity of the object is recognized using the light detection device 1040 based on a light output power value of 200 mA for a proximity recognition distance of 60 mm, the control unit 1001 may again select a light output power value of 100 mA for the proximity recognition distance of 60 mm. When proximity of the object is recognized using the light detection device 1040 based on a light output power value of 100 mA for the proximity recognition distance of 60 mm, the control unit 1001 may again select a light output power value of 50 mA for the proximity recognition distance of 60 mm. Since the light output power value is moved to a lower level according to proximity recognition of the object, power consumption of the electronic device 1000 may be improved.

In FIGS. 6A, 6B, 6C, and 6D, at least one light blocking element may block light, output from light emitting unit 442, from entering at least a part (e.g., the semiconductor layer 544) of a switch 540. When the electronic device 1000 is designed to include at least one light blocking element, a light output power value of the light emitting unit may be set to a relatively high fixed value compared to when the electronic device 1000 does not include at least one light blocking element. An operation of setting the light output power value of the light emitting unit to a relatively high fixed value, compared to when the electronic device 1000 does not include at least one light blocking element, may be aimed at compensating for an influence of the light from the light emitting unit by at least one light blocking element. The operation for setting the light output power value of the light emitting unit to the relatively high fixed value, compared to when the electronic device 1000 is designed not to have the light blocking element, may be ineffective for power consumption. Power consumption of the electronic device 1000 may be improved if a light output power value is moved to a lower level according to a proximity recognition of an object in a state where an identical proximity recognition distance is selected.

A function processing instruction 1027 may include a proximity recognition processing routine of processing functions of the electronic device 1000 based on a proximity recognition of an object. The function processing instruction 1027 may include a proximity cancellation processing routine of processing functions of the electronic device 1000 based on a proximity cancellation for the object. The control unit 1001 may deactivate the display 1030 based on a proximity recognition.

The light detection device 1040 includes the light receiving unit 1041 and the light emitting unit 1042. The light receiving unit 1041 may include all or a part of the light receiving unit 441 in FIG. 5, and a detailed description thereof will be omitted. The light emitting unit 1042 may include all or a part of the light emitting unit 442 in FIG. 5, and a detailed description thereof will also be omitted.

The electronic device 1000 includes an input unit 1050. The input unit 1050 may be configured to generate input signals required for operating the electronic device 1000. The input unit 1050 may include various input means, such as a keyboard, a keypad, a key button, and a touch button. The input unit 1050 may generate user input for executing instructions in the storage unit 1020.

The electronic device 1000 includes a communication unit or module 1060) configured to support a communication function of the electronic device 1000. Meanwhile, the communication unit 1060 may be provided as a mobile communication module in order to support a mobile communication function of the electronic device 1000. The communication unit 1060 may establish a communication channel with a mobile communication system to support transmission and reception of signals for the mobile communication function of the electronic device 1000. The communication unit 1060 may establish at least one of a voice service channel, an image service channel, and a data service channel with the mobile communication system and may support transmission or reception of a specific signal according to the corresponding service channel. The communication unit 1060 may operate in association with a detection function under the control of the control unit 1001 based on the function processing instruction 1027. Information acquired through the light detection unit 1040 may be transmitted to an external device (e.g., a server) through the communication unit 1060.

The electronic device 1000 further includes a camera unit 1070. The camera unit 1070 may be used in various detection modes. For example, in the iris recognition mode, the first surface 411 of the electronic device 1000 may be directed toward a user's face, and the camera unit 1070 (e.g., a front camera) may capture a face image of the user. In the iris recognition mode, the face image captured by the camera unit 1070 may be displayed on the screen. The camera unit 1070 may be selectively used in various detection modes.

The electronic device 1000 may include an audio processing unit 1090. The audio processing unit or module 1090 may output audio data relating to an operation of the electronic device 1000 or audio data received from the outside through a speaker SPK. The audio processing unit 1090 may output sound effects or guidance sounds related to the light detection function under the control of the control unit 1001. The audio processing unit 1090 may receive voice signals through a microphone MIC. The audio processing unit 1090 may convert an analog voice signal transmitted through the microphone MIC into a digital voice signal. The audio processing unit 1090 may receive voice inputs related to the light detection function under the control of the control unit 1001. The audio processing unit 1090 may sense, through the microphone MIC, a voice input relating to selection and control of detection modes, and may transfer the sensed voice input to the control unit 1001.

The electronic device 1000 includes a vibration unit 1080. The vibrating unit 1080 may include at least one vibrator disposed on electronic device 1000. The vibration unit 1080 may activate a vibrator in various vibration patterns based on triggers generated by the electronic device 1000 under the control of the control unit 1001. The vibration unit 1080 may activate the vibrator based on triggers received from outside of the electronic device 1000. The vibration unit 1080 may generate a vibration associated with the light detection function under control of the control unit 1001 based on the function processing instruction 1027.

The electronic device 1000 may further include various elements (or modules) depending on a form in which the electronic device 100 is provided. For example, the electronic device 1000 may include other elements, such as a short-range communication module for short-range communication, an interface for data transmission and reception through a wired or wireless communication scheme, an Internet communication module that performs an Internet function by communicating with an Internet network, and a digital broadcast module that receives and reproduces a digital broadcast. As apparent to those skilled in the art, specific elements among the above-described elements may be excluded, or may be replaced with other elements according to the form of the electronic device 1000.

An electronic device may include a housing; a display that is exposed through a surface of the housing; a light emitting unit that is disposed on at least a part of a rear surface of the display and includes at least one light source for outputting light of at least one wavelength band; and a light receiving unit that includes at least one area for receiving light of the at least one wavelength band. The electronic device may include a light blocking element for blocking light, output from the at least one light source, from entering a switch for turning on/off at least one pixel of the display. The electronic device may include a processor electrically connected with the display, the light emitting unit, and the light receiving unit, and a memory electrically connected with the processor. The memory may include instructions that cause, when executed, the processor to output light through the at least one light source in a state where one or more pixels included in a specific area of the display, which includes an area covering the at least one light source, are turned off or displayed in a specific color.

The electronic device may include a first power supply unit electrically connected to one or more pixels included in a specific area of the display, and a second power supply unit electrically connected to pixels included in the remaining area of the display. The electronic device may include instructions that cause the processor to selectively block a power supply from a first power supply unit among the first power supply unit and a second power supply unit when outputting light through the at least one light source.

The instructions cause the processor, when an image is displayed on the display, to set an interval in which a pixel is turned off for a time in a frame and to output light through the at least one light source in a set interval.

The display may be an AMOLED display.

The instructions may cause the processor to adjust the display in order to display one or more pixels included in a specific area of the display in a black color.

The switch may include a TFT. The light blocking element may block light, output from the at least one light source, from entering a semiconductor layer within the TFT.

The light blocking element may be included inside the display and may be disposed between the semiconductor layer of the switch and the rear surface of the display.

The light blocking element may include a light shielding material that covers the semiconductor layer of the switch.

The semiconductor layer may include a first surface facing the surface of the housing, a second surface facing the rear surface of the display, and a third surface that connects the first surface and the second surface. The light blocking element may cover at least one of the second surface and the third surface.

The display may include a buffer layer disposed between the semiconductor layer and the rear surface of the display. The light blocking element may be disposed between the semiconductor layer and the buffer layer.

The housing may include a first surface which faces a first direction, a second surface facing a second direction that is opposite the first direction, and a bezel that surrounds a space between the first surface and the second surface. The display may expose through the first surface and include an edge area overlapping at least a part of an area adjacent to an edge of the first surface, and a specific area of the display may include the edge area.

An electronic device may include a housing; a display that is exposed through one surface of the housing; a light emitting unit that is disposed on at least a part of a rear surface of the display and includes at least one light source for outputting light of at least one wavelength band; and a light receiving unit that includes at least one area for receiving light of the at least one wavelength band. The electronic device may include a light blocking element for blocking light, output from the at least one light source, from entering a switch for turning on/off at least one pixel of the display. The electronic device may include a processor electrically connected with the display, the light emitting unit, and the light receiving unit, and a memory electrically connected with the processor. The memory may include instructions that cause, when executed, the processor to compare a value, corresponding to light received by the light receiving unit, with a threshold value related to a proximity recognition of an object, determine whether the object is proximate, and decrease an output intensity of the light emitting unit when it is determined that the object is proximate.

The instructions may cause the processor to change a threshold value as the output intensity of the light emitting unit decreases.

Figure 11:
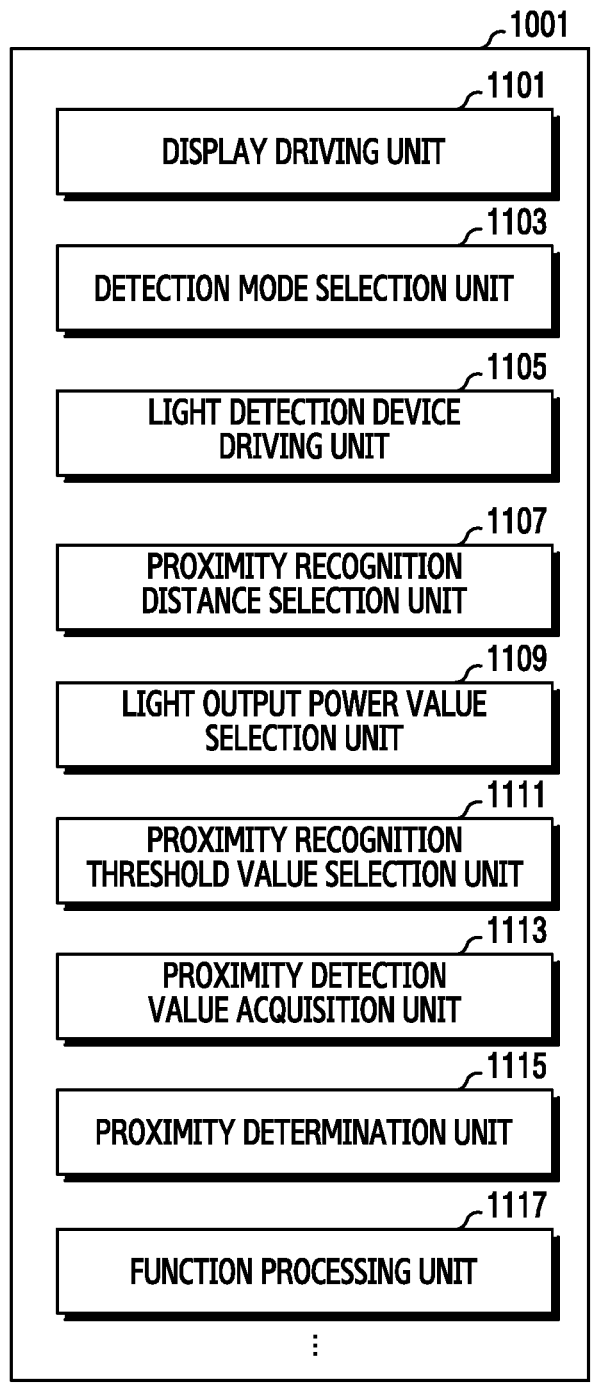
FIG. 11 is a block diagram of a control unit in more detail, according to an embodiment of the present disclosure.

FIG. 11 is a block diagram of the control unit 1001 in more detail, according to an embodiment of the present disclosure.

Referring to FIG. 11, the control unit 1001 includes a display driving unit 1101, a detection mode selection unit 1103, and a light detection device driving unit 1105.

The display driving unit 1101 may selectively activate at least one of a plurality of pixels of the display 1030 according to the display driving instruction 1021 of the storage unit 1020. The display 1030 may include an AMO-LED display 430 that installs one switch 540 per pixel. According to the display driving instruction 1021, the control unit 1001 may control a switch 540 to adjust whether to activate a pixel.

The display driving unit 1101 may turn off one or more pixels included in a light emission transmissive area 752 of the display 1030 according to the display driving instruction 1021. The electronic device may include a first power supply unit electrically connected to one or more pixels included in the light emission transmissive area 752 of the display 1030, and a second power supply unit electrically connected to the pixels included in the remaining area of the display. When light is output through at least one light source of the light emitting unit 1042, the display driving unit 1101 may selectively block power from the first power supply among the first power supply and the second power supply. When one or more pixels included in the light emission transmissive area 752 are turned off, the light emission transmissive area 752 may be expressed in a dark color (e.g., a black color). Since the light emission transmissive area 752 is expressed in a generally dark color due to deactivation of one or more pixels, although at least one pixel included in the light emission transmissive area 752 emits light by the light output from the light emitting unit 1042, the visibility thereof may be deteriorated.

The display driving unit 1101 may turn on one or more pixels included in the light emission transmissive area 752 of the display 1030, according to the display driving instruction 1021, so as to display the light emission transmissive area 752 in a dark color (e.g., a black color). Since the light emission transmissive area 752 is displayed in a dark color due to activation of one or more pixels, although at least one pixel included in the light emission transmissive area 752 emits light by light output from the light emitting unit 1042, the visibility thereof may be deteriorated.

The display driving unit 1101 may turn on (activate) a pixel only for a predetermined time in a frame (or an image frame) according to the display driving instruction 1021, and may turn off (deactivate) the pixel for the time remaining except for the predetermined time. When one or more pixels included in the light emission transmissive area 752 of display 1030 are turned off for a time in the frame, the light emission transmissive area 752 may be expressed in a generally black color as if a black image is inserted in the frame. Since the light emission transmissive area 752 is expressed in a black color for the predetermined time in the frame, although at least one pixel included in the light emission transmissive area 752 emits light by the light output from the light emitting unit 1042, the visibility thereof may be deteriorated.

The display driving unit 1101 may be a display drive integrated (DDI) circuit.

The detection mode selection unit 1103 may select at least one of the plurality of detection modes at least partially based on execution of an application and/or a user input. For example, when a call application is executed, the detection mode selection unit 1103 may select the proximity detection mode. When an iris recognition application is executed, the detection mode selection unit 1103 may select the iris recognition mode.

The light detection device driving unit 1105 may confirm the detection mode selected by the detection mode selection unit 1103 according to the light detection device driving instruction 1022, and may select and activate at least a part of the light receiving unit 1041 of the light detection device 1040 based on the selected detection mode. The light detection device driving unit 1105 may confirm the detection mode selected by the detection mode selection unit 1103 according to the light detection device driving instruction 1022, and may select and activate at least a part of the light emitting unit 1042 of the light detection device 1040 according to the light detection device driving instruction 1022.

The light detection device driving unit 1105 may confirm the detection mode selected by the detection mode selection unit 1103 according to the light detection device driving instruction 1022, and may activate the light emitting unit 1042 of the light detection device 1040 in an interval in which a pixel is turned off in a frame. When one or more pixels included in the light emission transmissive area 752 of the display 1030 are turned off for a time in the frame, the light emission transmissive area 752 may be expressed in a generally black color as if a black image is inserted in the frame. Since the light emission transmissive area 752 is expressed in a black color due to turning off of the pixel for the time in the frame, although at least one pixel included in the light emission transmissive area 752 emits light due to the light output from the light emitting unit 1042 for the time in the frame, the visibility thereof may be deteriorated.

The control unit 1001 may include elements associated with various detection modes that use a light detection device 1040. The control unit 1001 may include, in relation to the proximity detection mode, a proximity recognition distance selection unit 1107, a light output power value selection unit 1109, a proximity recognition threshold value selection unit 1111, a proximity determination value acquisition unit 1113, a proximity determination unit 1115, and a function processing unit 1117.

The proximity recognition distance selection unit 1107 may select a proximity recognition distance with respect to a proximity detection mode selected by the detection mode selection unit 1103 according to the proximity detection instruction 1023. The proximity recognition distance may be set based on an application execution and/or a user input.

The light output power value selection unit 1109 may select a light output power value for a proximity recognition distance selected by the proximity recognition distance selection unit 1107 according to the proximity detection instruction 1023. The light detection device driving unit 1105 may output light through the light emitting unit 1042 based on the light output power value selected by the light output power value selection unit 1109 according to the light detection device driving instruction 1022.

The proximity recognition threshold value selection unit 1111 may select a proximity recognition threshold value based on a proximity recognition distance selected by the proximity recognition distance selection unit 1107 and the light output power value selected by the light output power value selection unit 1109, according to the proximity detection instruction 1023.

The light output power value selection unit 1109 may select various levels of light output power values based on the selected proximity recognition distance. For example, when a proximity of an object is recognized using the light detection device 1040 based on a first light output power value, the light output power value selection unit 1109 may again select a second light output power value that is smaller than the first light output power value. When the light output power value selected by the light output power value selection unit 1109 is changed, the proximity detection threshold value selection unit 1111 may again select a proximity recognition threshold value corresponding to the changed light output power value.

The proximity detection value acquisition unit 1113 may acquire a proximity detection value through the light detection device 1040 adjusted by the light detection device driving unit 1105 according to the proximity detection instruction 1023.

The proximity determination unit 1115 may compare the proximity detection value detected by the proximity detection value acquisition unit 1113 with the proximity recognition threshold value selected by the proximity recognition threshold value selection unit 1111, and may determine whether the object is proximate based on a result of the comparison, according to the function processing instruction 1027. For example, when the proximity detection value is greater than or equal to the proximity recognition threshold value, the proximity determination unit 1115 may determine that the object is within a proximity recognition distance.

The function processing unit 1117 may perform functions of the electronic device 1000 when a signal relating to proximity recognition of the object is received from the proximity determination unit 1115, according to the function processing instruction 1027. For example, when the proximity of the object is recognized, the function processing unit 1117 may transfer a signal for deactivating the display 1030 to the display driving unit 1101.

Figure 12:
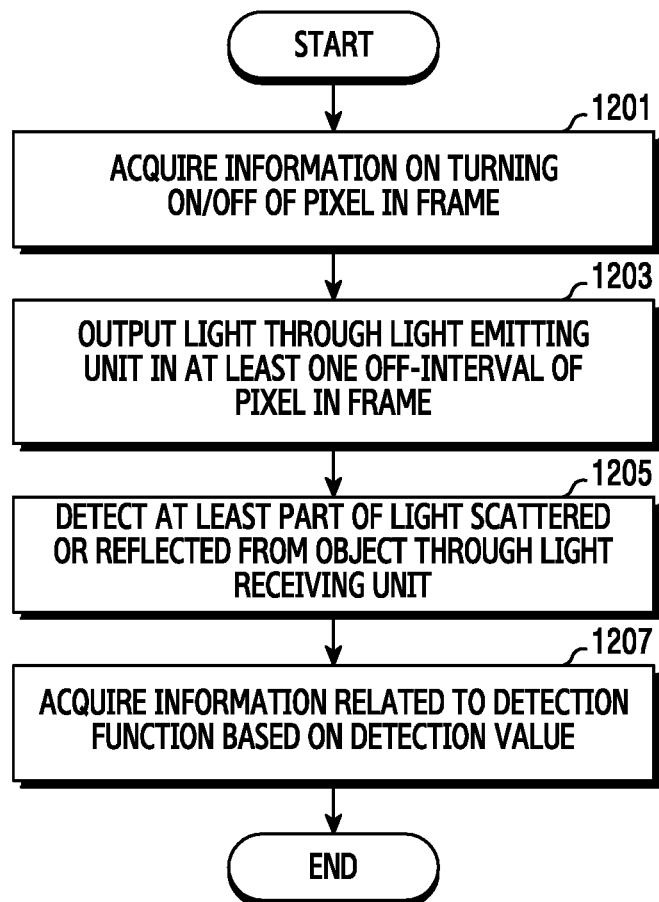
FIG. 12 is a flowchart of the electronic device that provides the light detection function, according to an embodiment of the present disclosure.
Figure 13:
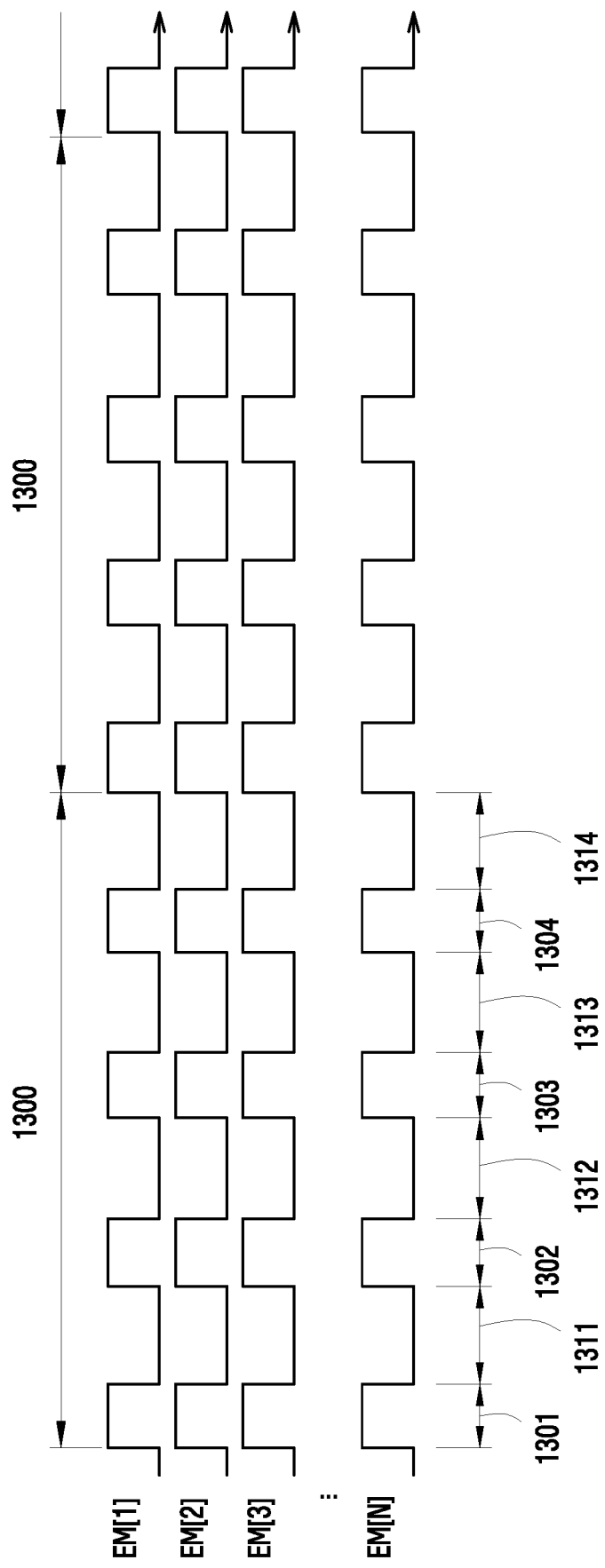
FIGS. 13, 14, and 15 are diagrams for describing the flowchart of FIG. 12.
Figure 14:
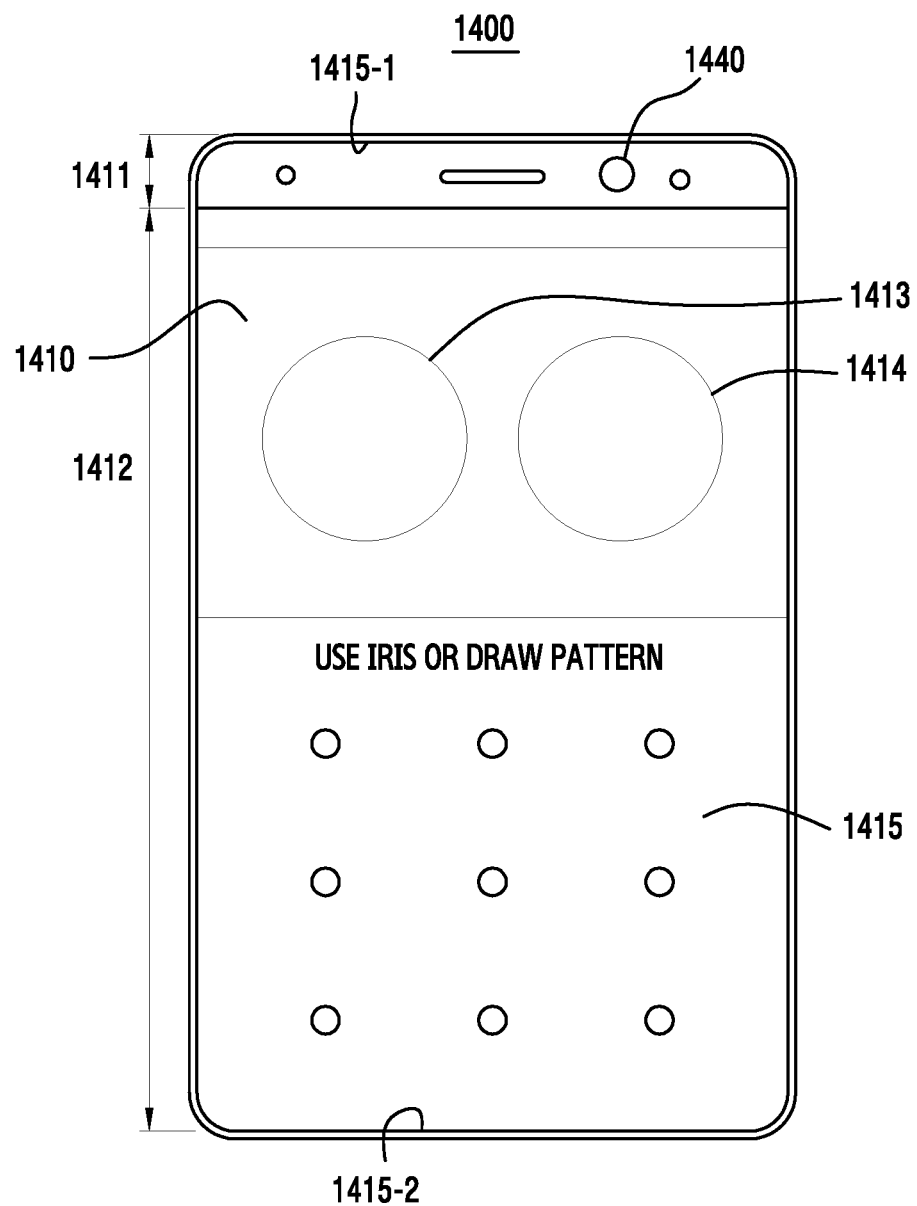
Figure 15:
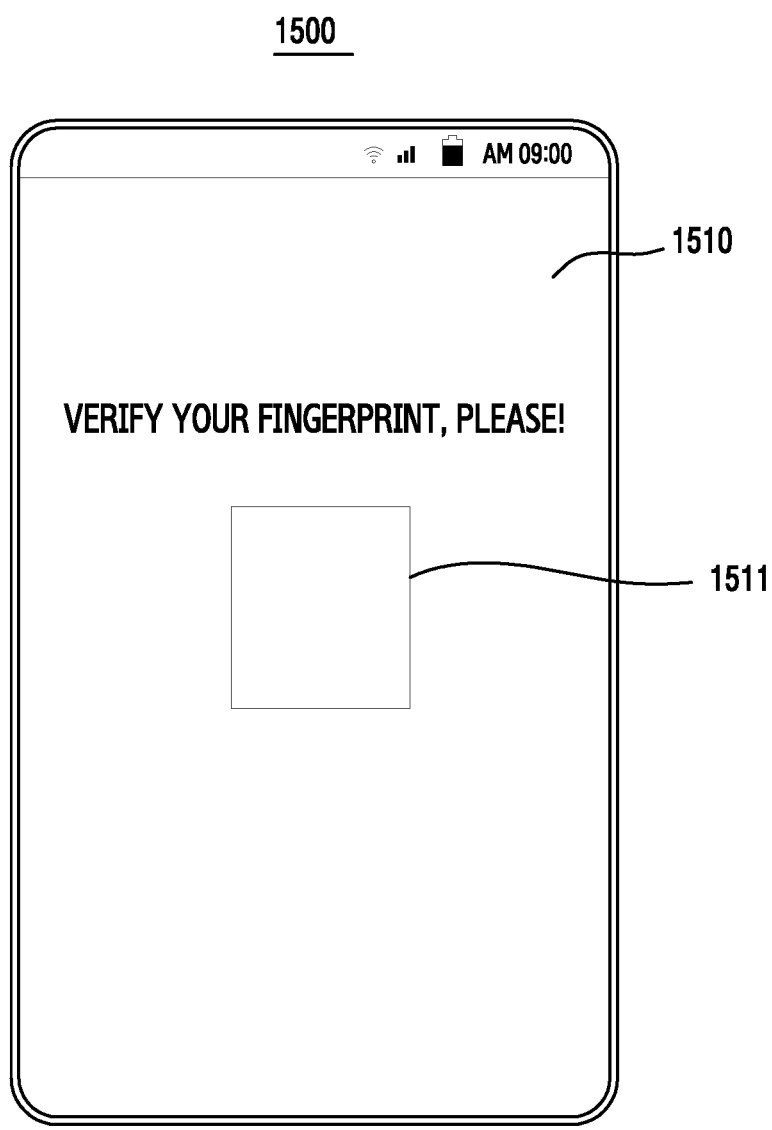

FIG. 12 is a flowchart of the electronic device that provides the light detection function, according to an embodiment of the present disclosure. FIGS. 13, 14, and 15 are diagrams for describing the flowchart of FIG. 12.

Referring to FIG. 12, in step 1201, the control unit 1001 (e.g., the processor 120 in FIG. 1 or the processor 210 in FIG. 2) may acquire information relating to on/off of a pixel within a frame. The display 1030 may be an AMOLED display 430 that installs one switch 540 per pixel. FIG. 13 illustrates driving pulses for a plurality of signal lines (e.g., the plurality of gate lines 720 and the plurality of data lines 730 in FIG. 7) installed in an AMOLED display.

In FIG. 13, EM [N] indicates a driving pulse of each line according to a frame flow. A frame 1300 may include at least one of intervals 1301, 1302, 1303, and 1304, to which a current is applied. In the intervals 1301, 1302, 1303, and 1304 in which a current is applied within the frame 1300, the pixels of the display may be in an on state and may emit light. The frame 1300 may include at least one interval 1311, 1312, 1313, and 1314 to which no current is applied. In the intervals 1311, 1312, 1313, and 1314, to which no current is applied, in the frame 1300, the pixels of the display may be in an off state.

In step 1203, the control unit 1001 outputs light through the light emitting unit 1042 in the off-interval (e.g., 1311, 1312, 1313, and 1314 in FIG. 13) of the pixel in the frame. The control unit 1001 may synchronize the pixel off-interval in the frame with a light emitting interval of the light emitting unit 1042. Since the light emission transmissive area is generally expressed in a black color due to turning-off of one or more pixels included in the light emission transmissive area 752, although at least one pixel included in the light emission transmissive area 752 emits light by the light output from the light emitting unit 1042, the visibility thereof may be deteriorated.

In step 1205, the control unit 1001 detects at least a part of light scattered or reflected from an object through the light receiving unit 1041. In the proximity detection mode, the light in a corresponding wavelength band, output from the light emitting unit 1042, may be transferred to a user near (e.g., within 10 cm) the electronic device 1000, and the light may be absorbed, scattered, or reflected by a user. For example, in a biometric detection mode (e.g., the iris recognition mode or the fingerprint recognition mode), light in a corresponding wavelength band, output from the light emitting unit 1042, may be transferred to the user's body near the electronic device 1000, and the light may be absorbed, scattered, or reflected by the user's body. The light (light energy or a light signal) that is scattered or reflected from the user may enter the light receiving unit 1041, and the light receiving unit 1041, may generate an electrical signal (or a detection value) relating to biometric information from the entered light, and may transfer the generated electrical signal to the control unit 1001.

In step 1207, the control unit 1001 acquires information related to a detection function based on a detected value, through the light receiving unit 1041. For example, in the proximity detection mode, the control unit 1001 may receive the electrical signal (or the detection value) from the light receiving unit 1041, and may acquire information relating to a proximity of the object after analyzing the electrical signal.

The control unit 1001 may acquire information related to the detection mode and may output the acquired information on the display 1030 or transfer the acquired information to another electronic device 102, 104 or 106.

The control unit 1001 may be designed to select the detection mode at least partially based on an execution of an application and/or a user input, and to further perform an operation of adjusting the light emitting unit 1042 and/or the light receiving unit 1041 based on the selected detection mode. The control unit 1001 may determine an output wavelength band of the light emitting unit 1042 (or the light source) based on the selected detection mode. When the proximity detection mode is selected, the control unit 1001 may determine a wavelength band including a maximum sensitivity wavelength of 950 nm, as the output wavelength band of the light emitting unit 1042 according to the proximity detection mode. The light emitting unit 1042 may be designed to selectively output light in a corresponding output wavelength band under adjustment of the control unit 1001. When determining the output wavelength band of the light emitting unit based on the selected detection mode, the control unit 1001 may output, in step 1205, light of the determined output wavelength band through the light emitting unit 1042 in at least one off-interval in the pixel in the frame.

FIG. 14 is a state in which an iris recognition application is executed in an electronic device 1400, according to the various embodiments of the present disclosure.

Referring to FIG. 14, the electronic device 1400 may include all or a part of the electronic device 400 of FIG. 4A. A first surface 1410 of the electronic device 1400 may include a first area 1411 and a second area 1412 which are arranged in a direction from a first edge 1415-1 to a second edge 1415-2. A display of the electronic device 1400 may have a size overlapping the second area 1412 and the second area 1412 may be a screen. When viewed in a direction, such as the second direction 40021 in FIG. 4A, opposite the direction which the first surface 1410 faces, a camera may be mounted at a position in alignment with the light emission transmissive area 1440 formed in the first area 1411. One or more light detection devices 1040 may be mounted as the structure in FIG. 5 along at least a part of the second area 1412. When the iris recognition application is executed, the control unit 1001 may select the iris recognition mode and may activate at least one light detection device 1040 corresponding to the selected iris recognition mode. Light for iris recognition, which is generated by the light detection device 1040, may be emitted through a third area 1413 and a fourth area 1414, that are separated from each other, in the second area 1412. When the light for iris recognition is emitted through the third area 1413 and the fourth area 1414, the control unit 1001 may output the light for iris recognition through the light emitting unit 1042 in an off-interval (e.g., 1311, 1312, 1313, or 1314 in FIG. 13) of a pixel in a frame. Since the light emission transmissive area 752 is expressed in a generally dark color due to turning off one or more pixels included in the light emission transmissive area 752 of the display, corresponding to the third area 1413 and the fourth area 1414, although at least one pixel included in the light emission transmissive area 752 emits light by the light output from the light emitting unit 1042, the visibility thereof may be deteriorated.

In the iris recognition mode, the control unit 1001 may activate the camera and may display an image acquired through the camera, in the second area 1412. Since the image acquired through the camera is displayed in the second area 1412, a user may move and control the electronic device 1400 so that the user's eyes both face the third area 1413 and the fourth area 1414, respectively, with reference to the displayed image. In the iris recognition mode, the control unit 1001 may display the third area 1413 and the fourth area 1414. The light for iris recognition, generated by the light detection device 1040, may pass through the third area 1413 and the fourth area 1414 to reach the user's eye, and may be absorbed, scattered, or reflected by the user's eye. The light (i.e., light energy or light signal) scattered or reflected from the user's eye may pass through the third area 1413 and/or the fourth area 1414 and enter the light detection device 1040. An electric signal (or a detection value) relating to an iris may be generated from the scattered or reflected light entered in the light detection device 1040, and may be transferred to the control unit 1001. When the iris recognition mode is selected, the control unit 1001 may further display an unlock pattern 1415 in the second area 1412. Instead of iris recognition, a touch input or a hovering input on the displayed unlock pattern 1415 may unlock the electronic device 1000.

FIG. 15 is a state in which a fingerprint recognition application is executed in an electronic device 1500, according to an embodiment of the present disclosure. The electronic device 1500 may include all or a part of the electronic device 400 of FIG. 4A. The display 430 of the electronic device 1500 is generally formed to have a size overlapping the entire area of a first surface 1510, and the entire area of the first surface 1510 may be a screen. One or more light detection devices 1040 may be mounted as a structure in FIG. 5 along at least a part of the first surface 1510. When the fingerprint recognition application is executed, the control unit 1001 may select the fingerprint recognition mode and activate at least one light detection device 1040 corresponding to the fingerprint recognition mode. Light for fingerprint recognition generated by the light detection device 1040 may be emitted through a partial area 1511 of the first surface 1510. A light emitting area on the first surface 1510 may vary depending on a position of the light detection device for fingerprint recognition. In the fingerprint recognition mode, the control unit 1001 may display a fingerprint recognition area 1511.

When light for fingerprint recognition is emitted through the partial area 1511 (hereinafter, a fingerprint recognition area) of the first surface 1510, the control unit 1001 may output the light for fingerprint recognition through the light emitting unit 1042 in off-intervals 1311, 1312, 1313, and 1314 of a pixel in a frame. Since the light emission transmissive area 752 is expressed in a generally dark color due to turning off one or more pixels included in the light emission transmissive area 752 of the display, corresponding to the fingerprint recognition area 1511, although at least one pixel included in the light emission transmissive area 752 emits light by the light output from the light emitting unit 1042, the visibility thereof may be deteriorated.

In the fingerprint recognition mode, when a user's finger is close (e.g., within 10 mm or less) to the fingerprint recognition area 1511, the light for fingerprint recognition generated by the light detection device 1040 may pass through the fingerprint recognition area 1511 to reach the user's finger, and may be absorbed, scattered, or reflected by the user's finger. The light (i.e., light energy or a light signal) scattered or reflected from the user's finger may pass through the fingerprint recognition area 1511 and enter the light detection device 1040. An electric signal (or a detection value) relating to a fingerprint may be generated from the scattered or reflected light entered into the light detection device 1040, and may be transferred to the control unit 1001.

Figure 16:
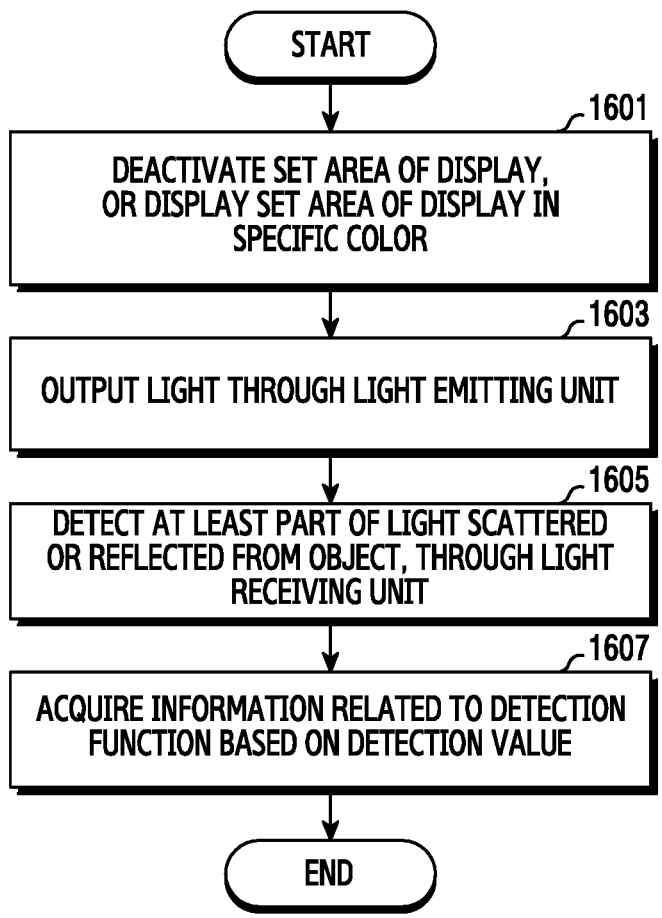
FIG. 16 is a flowchart of the electronic device that provides the light detection function, according to an embodiment of the present disclosure.
Figure 17:
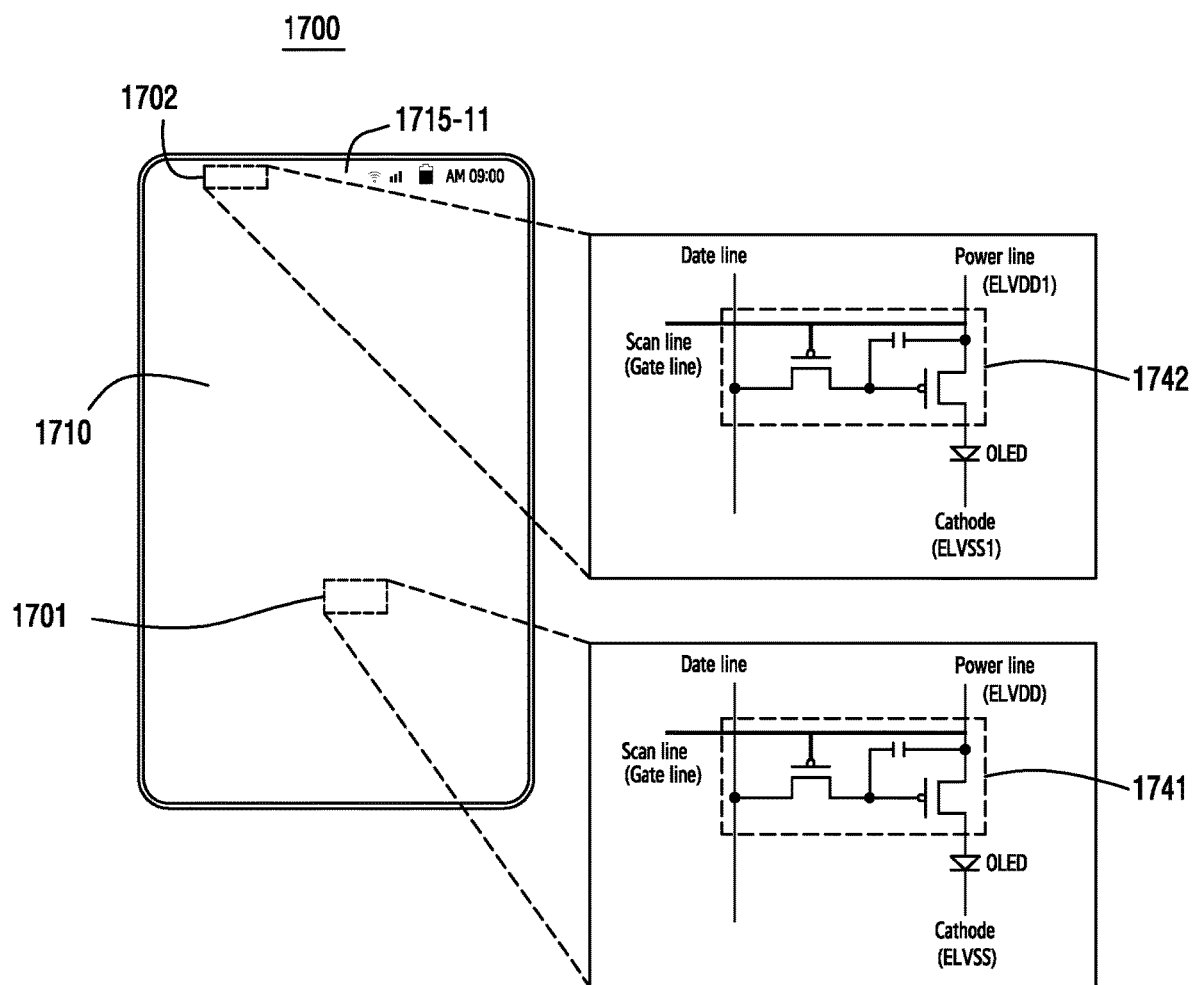
FIGS. 17 and 18 are diagrams for describing the flowchart of FIG. 16, according to an embodiment of the present disclosure.
Figure 18:
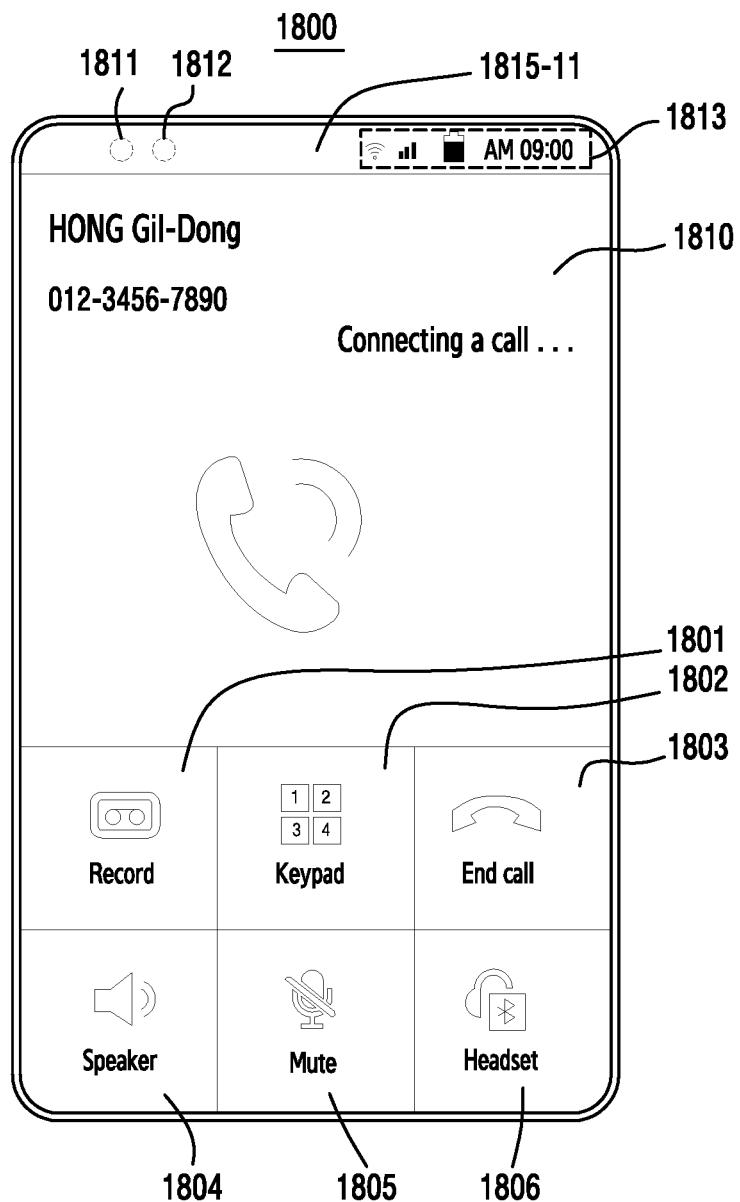

FIG. 16 is a flowchart of the electronic device that provides a light detection function, according to an embodiment of the present disclosure. FIGS. 17 and 18 are diagrams for describing the flowchart of FIG. 16, according to an embodiment of the present disclosure.

Referring to FIG. 16, in step 1601, when a light detection function is activated, the control unit 1001 deactivates a predetermined area of the display 1030, or may adjust the display 1030 to display the predetermined area of the display 1030 in a specific color. The predetermined area of the display 1030 may be a light emission transmissive area 752 through which the light source of the light emitting unit 1042 passes.

FIG. 17 is an electronic device 1700 according to an embodiment of the present disclosure. The electronic device 1700 may include all or a part of the electronic device 400 of FIG. 4A. The display 430 of the electronic device 1700 may be formed to have a size overlapping the entire area of the first surface 1510, and the entire area of the first surface 1510 may be a screen. A light detection device 1040 may be mounted below the display, as the structure in FIG. 5, in the first edge area 1715-11 of the first surface 1710. The display may include a first area 1701, in which the light detection device 1040 is not disposed, and a second area 1702 corresponding to a position in alignment with the light detection device. At least one power supply for one or more pixels included in the second area 1702 may be designed separately from at least one power supply for one or more pixels included in the first area 1701. The one or more pixels included in the first area 1701 may have a structure including one or more OLEDs connected between a first power supply ELVDD and a second power source ELVSS and switches 1741 that turn on or off the OLEDs. The one or more pixels included in the second area 1702 may have a structure including one or more OLEDs connected between a third power supply ELVDD1 and a fourth power supply ELVSS1 and switches 1742 that turn on or turn off the OLEDs. The control unit 1001 may selectively deactivate the second area 1702 among the first area 1701 and the second area 1702 by blocking the third power supply ELVDD1 or the fourth power supply ELVSS1. When the second area 1702 is deactivated, the second area 1702 may be expressed in a black color. Since the second area 1702 is expressed in a black color, although at least one pixel included in the second area 1702 emits light by the light output from the light emitting unit 442, the visibility thereof may be deteriorated.

The control unit 1001 may be designed to select the detection mode at least partially based on execution of an application and/or a user input, and to further perform an operation of selecting at least a part of area of the display 1030 based on the selected detection mode. When selecting at least a part of area of the display 1030 based on the selected detection mode, the control unit 1001 may adjust the display 1030 to deactivate the selected part of area of the display 1030 or to display a specific color, in step 1601.

FIG. 18 illustrates a state in which a call application is executed in an electronic device 1800, according to an embodiment of the present disclosure. The electronic device 1800 may include all or a part of the electronic device 400 of FIG. 4A. The display 430 of the electronic device 1800 may be generally formed to have a size overlapping the entire area of a first surface 1810 (e.g., 4001 in FIG. 4A), and the entire area of the first surface 1810 may be a screen. One or more light detection devices 1040 may be mounted as the structure in FIG. 5 along at least a part of the first surface 1810. The light detection devices 1040 may be mounted below the display, as the structure in FIG. 5, in a first edge area 1815-11 of the first surface 1810. The display may include a light reception transmissive area 1811 arranged in the light receiving unit 441 of the light detection device. The display may include a light emission transmissive area 1812 arranged in the light emitting unit 442 of the light detection device 1040.

The control unit 1001 may select the proximity detection mode based on the execution of the call application and may select the light emission transmissive area 1812 corresponding to the selected proximity detection mode. In the proximity detection mode, the control unit 1001 may deactivate the light emission transmissive area 1812. When the light emission transmissive area 1812 is deactivated, the light emission transmissive area 1812 may be expressed in a black color. In the proximity detection mode, the control unit 1001 may display the light emission transmissive area 1812 in a dark color (e.g., a black color). Since the light emission transmissive area 1812 is expressed in a black color, although at least one pixel included in the light emission transmissive area 1812 emits light by the light output from the light emitting unit 542, the visibility thereof may be deteriorated.

The control unit 1001 may select the proximity detection mode based on execution of the call application and may select the first edge area 1815-11 corresponding to the selected proximity detection mode. In the proximity detection mode, the control unit 1001 may deactivate the first edge area 1815-11. When the first edge area 1815-11 is deactivated, the first edge area 1815-11 may be expressed in a black color. In the proximity detection mode, the control unit 1001 may display the first edge area 1815-11 in a dark color (e.g., a black color). Since the first edge area 1815-11 is expressed in a black color, although at least one pixel included in the light emission transmissive area 1812 of the first edge area 1815-11 emits light by the light output from the light emitting unit 542, the visibility thereof may be deteriorated. During the proximity detection mode, the control unit 1001 may cause an object 1813 displayed in the first edge area 1815-11 to disappear. During the proximity detection mode, the control unit 1001 may move the object 1813 displayed in the first edge area 1815-11 out of the first edge area 1815-11. During the proximity detection mode, the control unit 1001 may maintain the display of the object 1813 as it is, or may change the display of the object 1813 to another form or color and then display the changed display of the object 1813.

When the call application is executed, the control unit 1001 may display information 1801 relating to an outgoing call or an incoming call on the screen. When an outgoing call application is executed, the control unit 1001 may provide, on the screen, a control 1801 for activating a function for recording during a call, a control 1802 for providing a keypad, a control 1803 for terminating a call, a control 1804 for switching to a speakerphone mode, a control 1805 for blocking an outgoing-call sound, or a control 1806 for switching to a headset mode.

In step 1603, the control unit 1001 outputs light through the light emitting unit 1042.

In step 1605, the control unit 1001 detects at least a part of the light scattered or reflected from the object through the light receiving unit 1041.

In step 1607, the control unit 1001 acquires information related to the detection function based on the detected value, through the light receiving unit 1041. For example, in the proximity detection mode, the control unit 1001 may receive a detected value from the light receiving unit 1041, and may acquire information relating to the proximity of the object after analysis.

The control unit 1001 may acquire information related to the detection mode and may output the acquired information on the display 1030. The control unit 1001 may acquire information related to the detection mode and transmit the acquired information to another electronic device 102, 104, or 106.

The control unit 1001 may be designed to select the detection mode at least partially based on execution of an application and/or a user input, and to further perform an operation of adjusting the light emitting unit 1042 and/or the light receiving unit 1041 based on the selected detection mode. The control unit 1001 may determine an output wavelength band of the light emitting unit 1042 (or a light source) based on the selected detection mode. When the proximity detection mode is selected, the control unit 1001 may determine the wavelength band including a maximum sensitivity wavelength of 950 nm as the output wavelength band of the light emitting unit 1042, according to the proximity detection mode. The light emitting unit 1042 may be designed to selectively output light in a corresponding output wavelength band by adjusting the control unit 1001. When determining the output wavelength band of the light emitting unit 1042 based on the selected detection mode, the control unit 1001 may output the light in the determined output wavelength band through the light emitting unit 1042, in step 1603.

Figure 19:
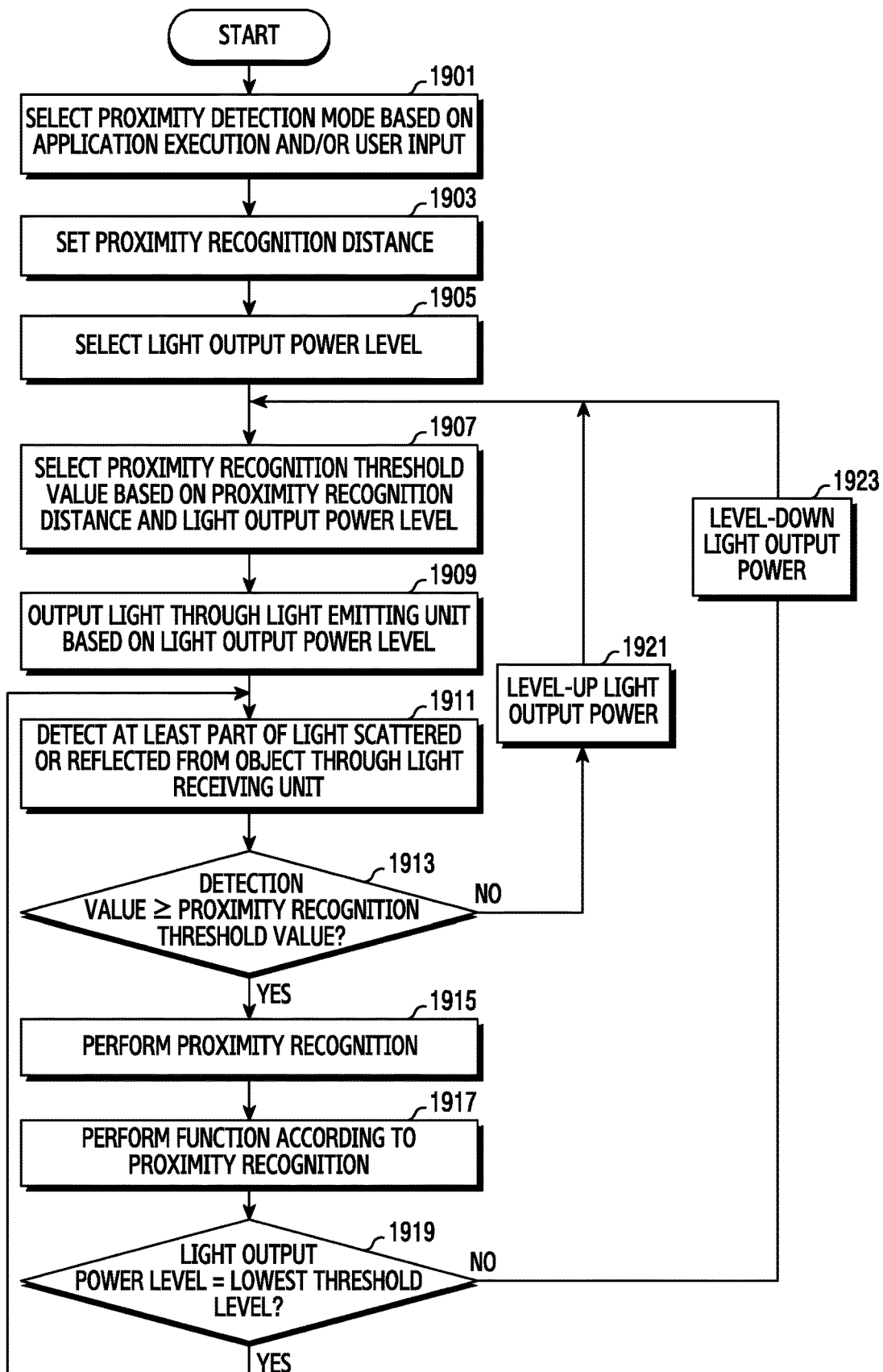
FIG. 19 is a flowchart of the electronic device that provides a proximity recognition function, according to an embodiment of the present disclosure.

FIG. 19 is a flowchart of the electronic device that provides the proximity recognition function, according to an embodiment of the present disclosure.

Referring to FIG. 19, in operation 1901, a control unit 1001 may select the proximity detection mode at least partially based on execution of an application and/or a user input.

In step 1903, the control unit 1001 sets a proximity recognition distance. The control unit 1001 may set the proximity recognition distance based on the proximity detection mode. Referring to FIG. 22, the control unit 1001 may set a distance of 60 mm as the proximity recognition distance.

In step 1905, the control unit 1001 selects a light output power level. The control unit 1001 may select the light output power level set to an initial default level based on the proximity detection mode. Referring to FIG. 22, the light output power level may include a third level having a light output power value of 200 mA, a second level having a light output power value of 100 mA, and a first level having a light output power value of 50 mA. Including four or more light output power levels may be also possible. The control unit 1001 may select the third level having a light output power value of 200 mA, defined as the initial default level in the proximity detection mode.

In step 1907, the control unit 1001 selects a proximity recognition threshold value based on the set proximity recognition distance and the selected light output power level. Referring to FIG. 22, when the third level having a light output power value of 200 mA for a proximity recognition distance of 60 mm is selected in step 1905, the control unit 1001 selects a digital value 4304 as the proximity recognition threshold value.

In step 1909, the control unit 1001 outputs light through the light emitting unit 1042 based on the selected light output power level.

In step 1911, the control unit 1001 detects at least a part of the light scattered or reflected from an object, through the light receiving unit 1041.

In step 1913, the control unit 1001 compares the value detected through the light receiving unit 1041 with the proximity recognition threshold value. When the detected value is greater than or equal to the proximity recognition threshold value, the control unit 1001 may recognize that the object is within the proximity recognition distance from the electronic device 1000 in step 1915. Referring to FIG. 22, when the third level having a light output power value of 200 mA for a proximity recognition distance of 60 mm is selected, the control unit 1001 may compare the value detected by the light receiving unit 1041 with the digital value 4304 (i.e., a proximity recognition threshold value).

In step 1917, the control unit 1001 performs functions of the electronic device 1000 according to proximity recognition. The control unit 1001 may deactivate the display 1030 according to proximity recognition.

When the detected value is smaller than the proximity recognition threshold value in step 1913, the control unit 1001 may perform step 1921. In step 1921, the control unit 1001 performs level-up of the light output power level selected in step 1905. After performing step 1921, the control unit 1001 may perform step 1907 and the steps thereafter using the updated light output power level.

When the light output power level selected in step 1905 is the highest level, the control unit 1001 may perform step 1911 and the steps thereafter again instead of step 1921. When the light output power level selected in step 1905 is a threshold level limited in the proximity detection mode, the control unit 1001 may perform step 1911 and the operations thereafter again instead of step 1921.

After step 1917, the control unit 1001 executes step 1919. In step 1919, the control unit 1001 determines whether the light output power level has reached the lowest threshold level. When the light output power level has reached the lowest threshold level, the control unit 1001 performs step 1911 and the steps thereafter. When the light output power level has not reached the lowest threshold level, the control unit 1001 performs step 1923.

In step 1923, the control unit 1001 performs level-down of the light output power level. After performing step 1923, the control unit 1001 performs step 1907 and the operations thereafter using the updated light output power level.

In FIGS. 6A, 6B, 6C and 6D, at least one light blocking element may block light, that is output from the light emitting unit 442, from entering at least a part (e.g., the semiconductor layer 544) of a switch 540. When the electronic device 1000 has at least one light blocking element, the light output power value of the light emitting unit may be set to a relatively high fixed value compared to when the electronic device 1000 does not have at least one light blocking element. An operation of setting the light output power value of the light emitting unit to the relatively high fixed value compared to when the electronic device 1000 does not have at least one light blocking element, may be aimed at compensating for influence of the light from the light emitting unit 1042 by at least one light blocking element. The operation of setting the light output power value of the light emitting unit 1042 to a relatively high fixed value compared to when the electronic device 1000 does not have at least one light blocking element, may not be efficient for power consumption. In the flowchart in FIG. 19, since the light output power value is adjusted to move to a lower level based on proximity recognition of the object in a state where the same proximity recognition distance is selected, power consumption of the electronic device 1000 may be improved.

Figure 20A:
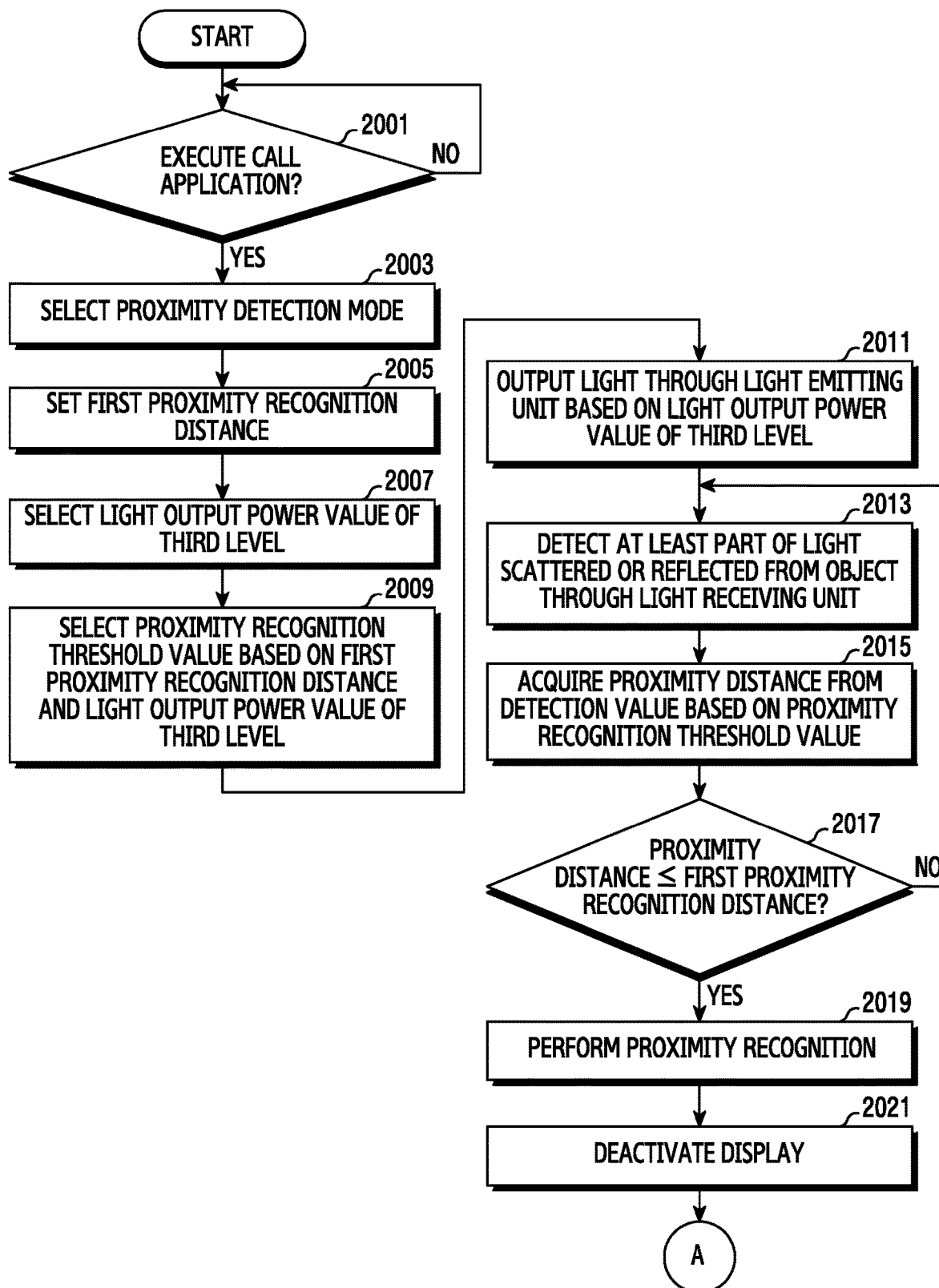
FIGS. 20A and 20B are flowcharts of the electronic device that provides the proximity recognition function, according to an embodiment of the present disclosure.
Figure 20B:
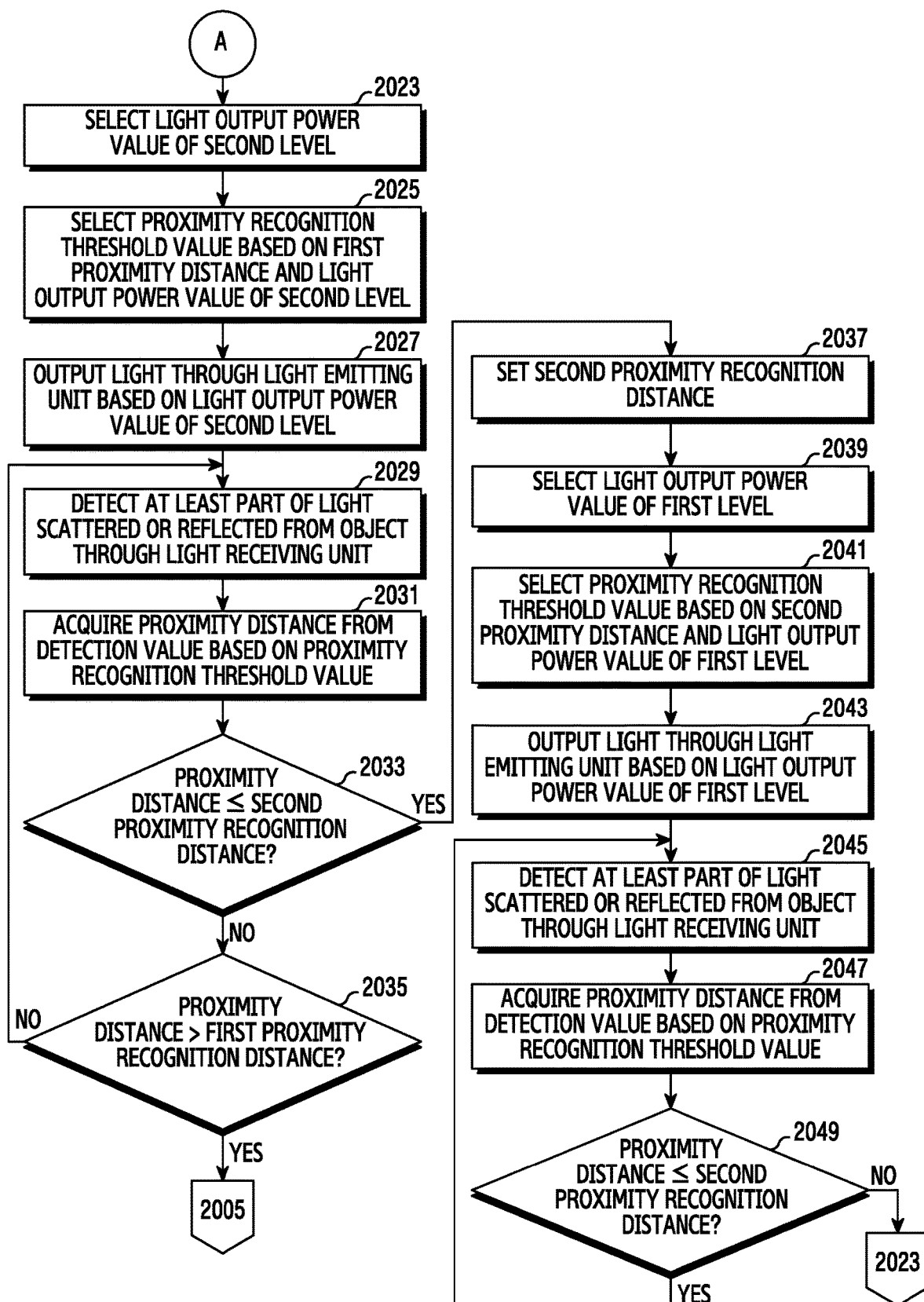
Figure 21:
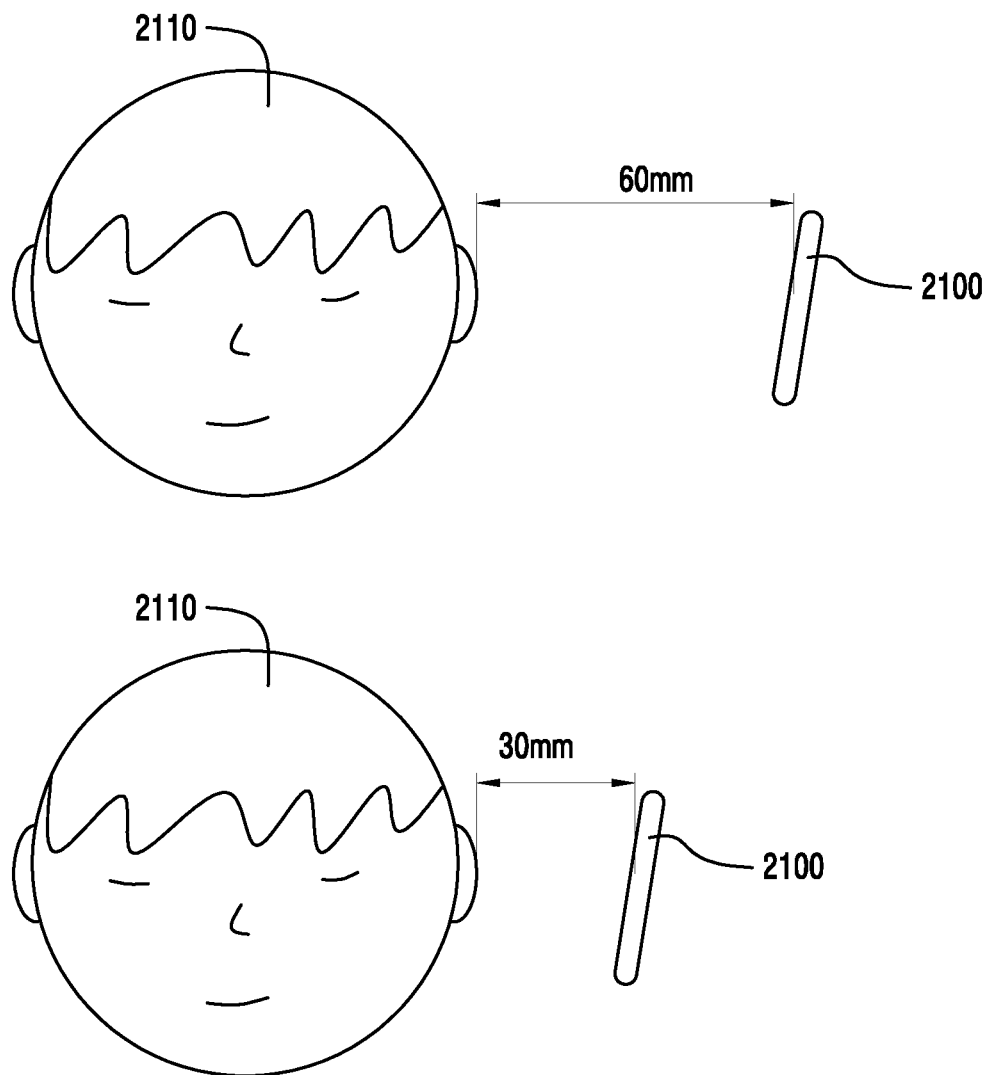
FIG. 21 is a diagram for describing the flowcharts of FIGS. 20A and 20B, according to an embodiment of the present disclosure.

FIGS. 20A and 20B are flowcharts of the electronic device that provides the proximity recognition function, according to an embodiment of the present disclosure. FIG. 21 is a diagram for describing the flowcharts of FIGS. 20A and 20B, according to an embodiment of the present disclosure.

Referring to FIGS. 20A and 20B, in step 2001, when the control unit 1001 senses execution of the call application, it performs step 2003. For example, the electronic device 1000 may receive an external call from an external device 102 or 104 and the control unit 1001 may execute an application relating to an incoming call. When requesting a call to a telephone number of the external device 102 or 104 by a user input, the control unit 1001 may execute an application related to an outgoing call.

In step 2003, the control unit 1001 selects the proximity detection mode based on execution of the call application.

In step 2005, the control unit 1001 sets a first proximity recognition distance. The control unit 1001 may set the first proximity recognition distance based on the proximity detection mode. Referring to FIG. 22, the control unit 1001 may set the first proximity recognition distance to be 60 mm.

In step 2007, the control unit 1001 selects a light output power value of the third level in a state where the first proximity recognition distance is set. The control unit 1001 may select a light output power level set to an initial default level based on the proximity detection mode. The light output power level may include a first level having a light output power value of 50 mA, a second level having a light output power value of 100 mA, and a third level having a light output power value of 200 mA. The control unit 1001 may select the third level having a light output power value of 200 mA, which is defined as the initial default level in the proximity detection mode.

In step 2009, the control unit 1001 selects a proximity recognition threshold value based on the set first proximity recognition distance and the selected light output power value of the third level. Referring to FIG. 22, when the third level having a light output power value of 200 mA for a proximity recognition distance of 60 mm is selected in step 2007, the control unit 1001 may select the digital value 4304 as the proximity recognition threshold value.

In step 2011, the control unit 1001 outputs light through the light emitting unit 1042 based on the selected light output power value of the third level.

In step 2013, the control unit 1001 detects at least a part of the light scattered or reflected from the object through the light receiving unit 1041.

In step 2015, the control unit 1001 acquires a proximity distance from a value detected through the light receiving unit 1041, based on the proximity recognition threshold value.

In step 2017, the control unit 1001 determines whether the proximity distance acquired in step 2015 is less than or equal to the first proximity recognition distance set in step 2005. When the acquired proximity distance is greater than the set first proximity recognition distance, the control unit 1001 performs step 2013 and the operations thereafter. When the acquired proximity distance is less than or equal to the set first proximity recognition distance, the control unit 1001 determines, in step 2019, that the object is in a proximity state (proximity recognition). For example, referring to FIG. 21, an electronic device 2010 may recognize the proximity of a user's head part 2110 at a distance of 60 mm based on a proximity recognition distance setting of 60 mm (the first proximity recognition distance), the light output power value of the third level of 200 mA, and the corresponding proximity recognition threshold value.

In step 2021, the control unit 1001 deactivates the display 1030 according to proximity recognition.

In step 2023, the control unit 1001 selects the light output power value of the second level in a state where the first proximity recognition distance is set. Referring to FIG. 22, the control unit 1001 may select the second level having a light output power value of 100 mA.

In step 2025, the control unit 1001 selects the proximity recognition threshold value based on the set first proximity recognition distance and the selected second level having a light output power value of 100 mA. For example, referring to FIG. 22, the second level having alight output power value of 100 mA for the proximity recognition distance of 60 mm is selected in step 2023, the control unit 1001 may select a digital value 3200 as the proximity recognition threshold value.

In step 2027, the control unit 1001 outputs light through the light emitting unit 1042 based on the selected light output power value of the second level.

In step 2029, the control unit 1001 detects at least a part of light scattered or reflected from the object through a light receiving unit 1041.

In step 2031, the control unit 1001 acquires a proximity distance from a value detected through the light receiving unit 1041, based on the proximity recognition threshold value.

In step 2033, the control unit 1001 determines whether the proximity distance acquired in step 2031 is less than or equal to a second proximity recognition distance. The second proximity recognition distance (30 mm) may be a value smaller than the first proximity recognition distance (60 mm). When the acquired proximity distance is less than or equal to the second proximity recognition distance, the control unit 1001 performs step 2037. When the acquired proximity distance is greater than the second proximity recognition distance, the control unit 1001 performs step 2035. In step 2035, the control unit 1001 determines whether the acquired proximity distance is greater than the first proximity recognition distance. When the acquired proximity distance is greater than the first proximity recognition distance, the control unit 1001 performs step 2005 and the steps thereafter again. When the acquired proximity distance is less than or equal to the first proximity recognition distance, the control unit 1001 performs step 2029 and the steps thereafter again.

In step 2037, the control unit 1001 sets the second proximity recognition distance instead of the first proximity recognition distance. For example, referring to FIG. 22, the control unit 1001 may set the second proximity recognition distance to be 30 mm.

In step 2039, the control unit 1001 selects the light output power value of the first level in a state where the second proximity recognition distance is set. For example, referring to FIG. 22, the control unit 1001 may select the first level having a light output power value of 50 mA.

In step 2041, the control unit 1001 selects the proximity recognition threshold value based on the set second proximity recognition distance and the light output power value of the selected first level. For example, referring to FIG. 22, when the first level having a light output power value of 50 mA for a proximity recognition distance of 30 mm is selected in step 2039, the control unit 1001 may select a digital value 8559 as the proximity recognition threshold value.

In step 2043, the control unit 1001 outputs light through the light emitting unit 1042 based on the selected light output power value of the first level.

In step 2045, the control unit 1001 detects at least a part of the light scattered or reflected from the object through the light receiving unit 1041.

In step 2047, the control unit 1001 acquires a proximity distance from a value detected through the light receiving unit 1041, based on the proximity recognition threshold value.

In step 2049, the control unit 1001 determines whether the proximity distance acquired in step 2047 is less than or equal to the second proximity recognition distance. When the acquired proximity distance is less than or equal to the second proximity recognition distance, the control unit 1001 performs step 2045 and the steps thereafter. When the acquired proximity distance is greater than the second proximity recognition distance, the control unit 1001 performs step 2023 again. For example, referring to FIG. 21, when the user's head part 2110 reaches 30 mm from the electronic device 2010, the electronic device 2010 may determine proximity recognition based on setting of the second proximity recognition distance of 30 mm, the light output power value of 100 mA of the first level, and the corresponding proximity recognition threshold value.

In FIGS. 6A, 6B, 6C and 6D, at least one light blocking element may block light, that is output from the light emitting unit (e.g., 442 in FIG. 5 or 1042 in FIG. 8), from entering at least a part (e.g., the semiconductor layer 544) of a switch 540. When the electronic device 1000 is designed to have at least one light blocking element, the light output power value of the light emitting unit 1042 may be set to a relatively high fixed value compared to when the electronic device 1000 is designed not to have at least one light blocking element. An operation of setting the light output power value of the light emitting unit 1042 to the relatively high fixed value, compared to when the electronic device 1000 does not have at least one light blocking element, may be aimed at compensating for influence of light from the light emitting unit 1042 by at least one light blocking element. The operation of setting the light output power value of the light emitting unit 1042 to a relatively high fixed value, compared to when the electronic device 1000 does not have at least one light blocking element, may not be efficient for power consumption. In the flowcharts of FIGS. 20A and 20B, since the light output power value is flexibly adjusted according to the proximity distance of the object, power consumption of the electronic device 1000 may be improved.

An operation method of an electronic device may include in a state where one or more pixels included in a specific area of a display including an area having at least one light source mounted on a rear surface thereof are turned off or displayed in a specific color, outputting light through the at least one light source disposed on at least a part of the rear surface of the display; and detecting at least a part of light scattered or reflected from an object, through a light receiving unit disposed on the at least part of the rear surface of the display.

The operation method of the electronic device may further include selectively blocking a power supply from a first power supply unit electrically connected to one or more pixels included in a specific area of the display, among the first power supply unit and a second power supply unit electrically connected to pixels included in the remaining area of the display.

Outputting light through at least one light source disposed at least a part of the rear surface of the display may include, when an image is displayed on the display, setting an interval in which a pixel is turned off for a time in a frame; and outputting light through at least one light source in the set interval.

The one or more pixels included in the specific area of the display may be displayed in a black color.

An operation method of an electronic device may include outputting light of at least one wavelength band through at least one light source disposed on at least a part of a rear surface of a display; receiving at least a part of light scattered or reflected from an object through a light receiving unit disposed on the at least part of the rear surface of the display; comparing a value corresponding to light received by the light receiving unit with a threshold value related to proximity recognition of an object; determining whether the object is proximate; and lowering an output intensity of the at least one light source when it is determined that the object is proximate.

The operation method of the electronic device may further include changing the threshold value as the output intensity of the at least one light source decreases.

The operation method of the electronic device may further include, when at least one application is executed based on an external signal and/or a user input, outputting through the at least one light source, determining whether the object is proximate, and lowering an output intensity of the at least one light source.

The described embodiments of the present disclosure may be made into a program executable in a computer, and may be implemented in a general-purpose digital computer, which operates the program by using a computer-readable recording medium. In addition, the data structure used in the embodiments of the present disclosure may be recorded on a computer-readable recording medium through various means. The computer-readable recording medium includes a storage medium, such as a magnetic storage medium (e.g., a ROM, a floppy disk, or a hard disk) and an optical reading medium (e.g., a CD-ROM or a DVD).

The present disclosure has been shown and described with reference to certain embodiments. It will be understood by those skilled in the art that various changes in form and details may be made therein without departing from the spirit and scope of the present disclosure, which is defined, not by the detailed description and embodiments, but by the appended claims and their equivalents.

What is claimed is:

1. An electronic device comprising:
 a display;
 a proximity sensor disposed behind the display, the proximity sensor comprising a light emitting unit configured to emit and a light receiving unit configured to receive a light of a specific wavelength band;
 a memory storing instructions; and
 a processor configured to execute the instructions to:
  establish a call comprising an incoming call or an outgoing call;
  during the call:
   deactivate a set area of the display or display the set area of the display in a specific color;
   output a light of the specific wavelength band through the light emitting unit of the proximity sensor only during one or more intervals in which the set area of the display is deactivated or the specific color is displayed in the set area of the display;

detect at least part of the light reflected or scattered from an object through the light receiving unit of the proximity sensor; and acquire information related to proximity or a proximity distance between the electronic device and the object based on the detecting, wherein the set area of the display is configured to allow light to pass therethrough.

2. The electronic device of claim 1, wherein the processor is configured to:

select a proximity detection mode, while executing a call application for the call; and deactivate the display according to the information relating to the proximity or the proximity distance.

3. The electronic device of claim 2, wherein the processor is configured to:

compare the detection value from the proximity sensor with a predetermined proximity recognition threshold value for proximity recognition; and deactivate the display according to the proximity recognition.

4. The electronic device of claim 3, wherein the predetermined proximity recognition threshold value is based on at least one of a predetermined proximity recognition distance and a predetermined light output power level of the proximity sensor.

5. The electronic device of claim 1, wherein the instructions further cause the processor to set an interval, in which a pixel is turned off for a part of time in a frame, and output light through the light emitting unit of the proximity sensor in the set interval.

6. The electronic device of claim 1, wherein the display is an active matrix organic light emitting diode (AMOLED) display.

7. The electronic device of claim 1, further comprising a light blocking element, which blocks light output from the at least one proximity sensor, from entering a switch for turning on/off at least one pixel of the display.

8. The electronic device of claim 7, wherein the switch includes a thin film transistor (TFT), and the light blocking element is configured to block light, that is output from the light emitting unit of the proximity sensor, from entering a semiconductor layer within the TFT.

9. The electronic device of claim 8, wherein the light blocking element is included inside the display and disposed between the semiconductor layer of the switch and the rear surface of the display.

10. The electronic device of claim 8, wherein the light blocking element includes a light shielding material that covers the semiconductor layer of the switch.

11. The electronic device of claim 1, wherein the instructions further cause the processor to determine whether the object is proximate by comparing a value corresponding to light received by the proximity sensor with a threshold value related to proximity recognition of the object, and to decrease an output intensity of the light emitting unit of the proximity sensor when it is determined that the object is proximate.

12. The electronic device of claim 11, wherein the instructions further cause the processor to change the threshold value as the output intensity of the light emitting unit of the proximity sensor light emitting unit decreases.

13. An operation method of an electronic device that is capable of a call comprising an incoming call or an outgoing call, and includes a display, wherein a set area of the display is transmissive to light, which set area comprises a plurality of pixels of the display disposed correspondingly to the position of a proximity sensor, which is disposed behind the display and is configured to emit and receive a light of a specific wavelength band, wherein the method comprises:

establishing the call;

during the call;

deactivating the set area of the display or displaying the set area of the display in a specific color;

outputting a light of the specific wavelength band through a light emitting unit of the proximity sensor only during one or more intervals in which the set area of the display is deactivated or the specific color is displayed in the set area of the display;

detecting at least part of the light reflected or scattered from an object through a light receiving unit of the proximity sensor; and acquiring information related to proximity or a proximity distance between the electronic device and the object based on the detecting, wherein the set area of the display is configured to allow light to pass therethrough.

14. The operation method of claim 13, wherein outputting the light through the at least one light emitting unit comprises setting an interval, in which a pixel is turned off for a part of time in a frame, and outputting light through the at least one light emitting unit in the set interval.

15. The operation method of claim 13, wherein the deactivating comprises:

selecting a proximity detection mode, while executing a call application for the call; and deactivating the display according to the information relating to the proximity or the proximity distance.

16. The operation method of claim 15, wherein deactivating the display comprises:

comparing the detection value from the proximity sensor with a predetermined proximity recognition threshold value for proximity recognition; and deactivating the display according to the proximity recognition.

17. The operation method of claim 16, wherein the predetermined proximity recognition threshold value is based on at least one of a predetermined proximity recognition distance and a predetermined light output power level of the proximity sensor.

18. The operation method of claim 17, further comprising:

determining whether the object is proximate by comparing a value corresponding to light received by the proximity sensor with a threshold value related to proximity recognition of the object; and decreasing an output intensity of the light emitting unit of the proximity sensor when it is determined that the object is proximate.

19. The operation method of claim 18, further comprising:

changing the threshold value as the output intensity of the light emitting unit of the proximity sensor light emitting unit decreases.

* * * * *